United States Patent
Nguyen et al.

(10) Patent No.: US 11,708,005 B2
(45) Date of Patent: Jul. 25, 2023

(54) SYSTEMS AND METHODS FOR INDIVIDUAL CONTROL OF A PLURALITY OF BATTERY CELLS

(71) Applicant: Exro Technologies Inc., Calgary (CA)

(72) Inventors: Tung Nguyen, Calgary (CA); Eric Hustedt, Calgary (CA)

(73) Assignee: Exro Technologies Inc., Calgary (CA)

( * ) Notice: Subject to any disclaimer, the term of this patent is extended or adjusted under 35 U.S.C. 154(b) by 0 days.

(21) Appl. No.: 17/842,217

(22) Filed: Jun. 16, 2022

(65) Prior Publication Data
US 2022/0368135 A1  Nov. 17, 2022

Related U.S. Application Data

(63) Continuation of application No. 17/727,143, filed on Apr. 22, 2022.
(Continued)

(51) Int. Cl.
| | |
|---|---|
| B60L 58/10 | (2019.01) |
| H02J 7/00 | (2006.01) |
| G01R 31/392 | (2019.01) |
| G01R 31/396 | (2019.01) |
| G01R 31/374 | (2019.01) |
| G01R 31/3842 | (2019.01) |

(Continued)

(52) U.S. Cl.
CPC .......... *B60L 58/10* (2019.02); *G01R 31/374* (2019.01); *G01R 31/3842* (2019.01); *G01R 31/392* (2019.01); *G01R 31/396* (2019.01); *H02J 7/005* (2020.01); *H02J 7/007* (2013.01); *H02J 7/0048* (2020.01); *B60L 58/12* (2019.02); *B60L 58/13* (2019.02); *B60L 58/14* (2019.02); *B60L 58/15* (2019.02)

(58) Field of Classification Search
CPC ...... H02J 7/0019; H02J 7/0016; H02J 7/0049; H02J 7/007182
USPC ........................................................ 320/132
See application file for complete search history.

(56) References Cited

U.S. PATENT DOCUMENTS

| | | |
|---|---|---|
| 757,394 A | 4/1904 | Eickemeyer et al. |
| 908,097 A | 12/1908 | Herz |

(Continued)

FOREIGN PATENT DOCUMENTS

| | | |
|---|---|---|
| AU | 2018101036 A4 | 10/2018 |
| CA | 1038918 A | 9/1978 |

(Continued)

OTHER PUBLICATIONS

Babaei, et a;, "New cascaded multilevel inverter topology with minimum number of switches", Energy Conversion and Management 50 (2009) 2761-2767, 7 pages.

(Continued)

*Primary Examiner* — John T Trischler
(74) *Attorney, Agent, or Firm* — Cozen O'Connor

(57) ABSTRACT

A battery control system includes a plurality of battery cells that are separately controllable as units of individual cells or groups of cells. Each controllable unit may be switchably activated or deactivated in the overall battery circuit, and one or more conditions of each controllable unit may be individually measured. Various techniques are disclosed for operating the battery control system to optimize or improve system performance and longevity.

17 Claims, 18 Drawing Sheets

Related U.S. Application Data

(60) Provisional application No. 63/262,017, filed on Oct. 1, 2021, provisional application No. 63/183,980, filed on May 4, 2021.

(51) Int. Cl.
*B60L 58/15* (2019.01)
*B60L 58/13* (2019.01)
*B60L 58/12* (2019.01)
*B60L 58/14* (2019.01)

(56) References Cited

U.S. PATENT DOCUMENTS

| | | |
|---|---|---|
| 1,980,808 A | 11/1934 | Leibing |
| 2,091,190 A | 8/1937 | Tullio |
| 2,189,524 A | 2/1940 | Randolph et al. |
| 2,333,575 A | 11/1943 | Kilgore et al. |
| 2,407,883 A | 9/1946 | Corwill |
| 2,430,886 A | 11/1947 | Glen |
| 2,432,117 A | 12/1947 | Morton |
| 2,488,729 A | 11/1949 | Kooyman |
| 2,504,681 A | 4/1950 | Hall |
| 2,516,114 A | 7/1950 | Green |
| 2,601,517 A | 6/1952 | Hammes |
| 2,680,822 A | 6/1954 | Brainard |
| 2,719,931 A | 10/1955 | William |
| 3,083,311 A | 3/1963 | Shelley |
| 3,149,256 A | 9/1964 | Walter |
| 3,153,157 A | 10/1964 | Erich |
| 3,169,203 A | 2/1965 | Lavin et al. |
| 3,223,865 A | 12/1965 | Lewis |
| 3,237,034 A | 2/1966 | Shelley |
| 3,293,470 A | 12/1966 | Richard |
| 3,411,027 A | 11/1968 | Heinz |
| 3,482,156 A | 12/1969 | Porath |
| 3,549,925 A | 12/1970 | Johnson |
| 3,621,370 A | 11/1971 | Vandervort |
| 3,713,015 A | 1/1973 | Frister |
| 3,801,844 A | 4/1974 | Steele |
| 3,809,936 A | 5/1974 | Klein |
| 3,870,928 A | 3/1975 | Allen |
| 3,903,863 A | 9/1975 | Katsumata |
| 3,942,913 A | 3/1976 | Bokelman |
| 3,944,855 A | 3/1976 | Le Van |
| 3,965,669 A | 6/1976 | Larson et al. |
| 3,973,137 A | 8/1976 | Drobina |
| 3,973,501 A | 8/1976 | Briggs |
| 3,984,750 A | 10/1976 | Pfeffer et al. |
| 3,992,641 A | 11/1976 | Heinrich et al. |
| 4,001,887 A | 1/1977 | Platt et al. |
| 4,004,426 A | 1/1977 | Laing |
| 4,013,937 A | 3/1977 | Pelly et al. |
| 4,015,174 A | 3/1977 | Cotton |
| 4,020,369 A | 4/1977 | Shoupp et al. |
| 4,023,751 A | 5/1977 | Richard |
| 4,035,701 A | 7/1977 | Jensen |
| 4,039,848 A | 8/1977 | Winderl |
| 4,050,295 A | 9/1977 | Harvey |
| 4,051,402 A | 9/1977 | Gruber |
| 4,074,159 A | 2/1978 | Robison |
| 4,074,180 A | 2/1978 | Sharpe et al. |
| 4,081,726 A | 3/1978 | Brimer et al. |
| 4,095,922 A | 6/1978 | Farr |
| 4,100,743 A | 7/1978 | Trumbull et al. |
| 4,107,987 A | 8/1978 | Robbins et al. |
| 4,126,933 A | 11/1978 | Anderson et al. |
| 4,141,331 A | 2/1979 | Mallory |
| 4,142,696 A | 3/1979 | Nottingham |
| 4,142,969 A | 3/1979 | Funk et al. |
| 4,151,051 A | 4/1979 | Evans |
| 4,155,252 A | 5/1979 | Morrill |
| 4,159,496 A | 6/1979 | Stevens |
| 4,167,692 A | 9/1979 | Sekiya et al. |
| 4,168,459 A | 9/1979 | Roesel |
| 4,179,633 A | 12/1979 | Kelly |
| 4,181,468 A | 1/1980 | Kent et al. |
| 4,187,441 A | 2/1980 | Oney |
| 4,191,893 A | 3/1980 | Grana et al. |
| 4,196,572 A | 4/1980 | Hunt |
| 4,203,710 A | 5/1980 | Farr |
| 4,211,945 A | 7/1980 | Tawse |
| 4,215,426 A | 7/1980 | Klatt |
| 4,237,391 A | 12/1980 | Schur et al. |
| 4,245,601 A | 1/1981 | Crowder |
| 4,246,490 A | 1/1981 | Keramati et al. |
| 4,247,785 A | 1/1981 | Apgar |
| 4,253,031 A | 2/1981 | Frister |
| 4,254,344 A | 3/1981 | Fancy et al. |
| 4,260,901 A | 4/1981 | Woodbridge |
| 4,261,312 A | 4/1981 | Hart |
| 4,261,562 A | 4/1981 | Flavell |
| 4,276,481 A | 6/1981 | Parker |
| 4,286,581 A | 9/1981 | Atkinson |
| 4,289,970 A | 9/1981 | Deibert |
| 4,291,235 A | 9/1981 | Bergey et al. |
| 4,297,604 A | 10/1981 | Tawse |
| 4,302,683 A | 11/1981 | Burton |
| 4,305,031 A | 12/1981 | Wharton |
| 4,308,479 A | 12/1981 | Richter |
| 4,313,080 A * | 1/1982 | Park ............ B60L 53/11 180/65.225 |
| 4,316,096 A | 2/1982 | Syverson |
| 4,317,437 A | 3/1982 | Lindgren |
| 4,322,667 A | 3/1982 | Ohba |
| 4,329,138 A | 5/1982 | Riordan |
| 4,338,557 A | 7/1982 | Wanlass |
| 4,339,704 A | 7/1982 | McSparran et al. |
| 4,340,822 A | 7/1982 | Gregg |
| 4,355,276 A | 10/1982 | Vittay |
| 4,358,693 A | 11/1982 | Palmer et al. |
| 4,364,005 A | 12/1982 | Kohzai et al. |
| 4,373,488 A | 2/1983 | Neuhalfen |
| 4,385,246 A | 5/1983 | Schur et al. |
| 4,389,691 A | 6/1983 | Hancock |
| 4,394,720 A | 7/1983 | Gabor |
| 4,402,524 A | 9/1983 | D'Antonio et al. |
| 4,406,950 A | 9/1983 | Roesel |
| 4,412,170 A | 10/1983 | Roesel |
| 4,419,617 A | 12/1983 | Reitz |
| 4,433,280 A | 2/1984 | Lindgren |
| 4,433,355 A | 2/1984 | Chew et al. |
| 4,434,389 A | 2/1984 | Langley et al. |
| 4,434,617 A | 3/1984 | Walsh |
| 4,444,444 A | 4/1984 | Benedetti |
| 4,446,377 A | 5/1984 | Kure-Jensen et al. |
| 4,454,865 A | 6/1984 | Tammen |
| 4,456,858 A | 6/1984 | Loven |
| 4,458,489 A | 7/1984 | Walsh |
| 4,459,536 A | 7/1984 | Wirtz |
| 4,473,751 A | 9/1984 | Rombach et al. |
| 4,477,745 A | 10/1984 | Lux |
| 4,503,368 A | 3/1985 | Sakamoto |
| 4,511,805 A | 4/1985 | Boy-Marcotte et al. |
| 4,513,576 A | 4/1985 | Dibrell et al. |
| RE31,947 E | 7/1985 | Farr |
| 4,532,431 A | 7/1985 | Iliev et al. |
| 4,532,460 A | 7/1985 | Gale et al. |
| 4,535,263 A | 8/1985 | Avery |
| 4,536,668 A | 8/1985 | Boyer |
| 4,536,672 A | 8/1985 | Kanayama et al. |
| 4,539,485 A | 9/1985 | Neuenschwander |
| 4,549,121 A | 10/1985 | Gale |
| 4,575,671 A | 3/1986 | Lee et al. |
| 4,578,609 A | 3/1986 | McCarty |
| 4,581,999 A | 4/1986 | Campagnuolo et al. |
| 4,591,746 A | 5/1986 | Kamiyama |
| 4,598,240 A | 7/1986 | Gale et al. |
| 4,599,551 A | 7/1986 | Wheatley et al. |
| 4,601,354 A | 7/1986 | Campbell et al. |
| 4,605,874 A | 8/1986 | Whiteley |
| 4,628,219 A | 12/1986 | Troscinski |
| 4,630,817 A | 12/1986 | Buckley |
| 4,638,224 A | 1/1987 | Gritter |

(56) References Cited

U.S. PATENT DOCUMENTS

| | | |
|---|---|---|
| 4,639,647 A | 1/1987 | Posma |
| 4,641,080 A | 2/1987 | Glennon et al. |
| 4,642,031 A | 2/1987 | Farr |
| 4,642,988 A | 2/1987 | Benson |
| 4,644,233 A | 2/1987 | Suzuki |
| 4,654,066 A | 3/1987 | Garcia et al. |
| 4,654,537 A | 3/1987 | Gaspard |
| 4,656,379 A | 4/1987 | McCarty |
| 4,658,166 A | 4/1987 | Oudet |
| 4,658,346 A | 4/1987 | Templeton |
| 4,664,685 A | 5/1987 | Young |
| 4,668,885 A | 5/1987 | Scheller |
| 4,674,199 A | 6/1987 | Lakic |
| 4,675,591 A | 6/1987 | Pleiss |
| 4,678,954 A | 7/1987 | Takeda et al. |
| 4,682,067 A | 7/1987 | Oudet |
| 4,687,945 A | 8/1987 | Ebeling |
| 4,692,675 A | 9/1987 | Falk |
| 4,698,538 A | 10/1987 | Yoshida |
| 4,698,562 A | 10/1987 | Gale et al. |
| 4,710,667 A | 12/1987 | Whiteley |
| 4,713,569 A | 12/1987 | Schwartz |
| 4,729,218 A | 3/1988 | Haselbauer et al. |
| 4,737,070 A | 4/1988 | Horiuchi et al. |
| 4,739,203 A | 4/1988 | Miyao et al. |
| 4,772,842 A | 9/1988 | Ghosh |
| 4,779,038 A | 10/1988 | Eckerfeld |
| 4,783,028 A | 11/1988 | Olson |
| 4,783,038 A | 11/1988 | Gilbert et al. |
| 4,785,228 A | 11/1988 | Goddard |
| 4,806,812 A | 2/1989 | Masterman |
| 4,809,510 A | 3/1989 | Gaspard et al. |
| 4,811,091 A | 3/1989 | Morrison et al. |
| 4,814,651 A | 3/1989 | Elris et al. |
| 4,819,361 A | 4/1989 | Boharski |
| 4,831,300 A | 5/1989 | Lindgren |
| 4,835,433 A | 5/1989 | Brown |
| 4,843,270 A | 6/1989 | Dijken |
| 4,845,749 A | 7/1989 | Brickell et al. |
| 4,851,703 A | 7/1989 | Means |
| 4,862,021 A | 8/1989 | Larocca |
| 4,864,151 A | 9/1989 | Wyczalek et al. |
| 4,866,321 A | 9/1989 | Blanchard et al. |
| 4,872,805 A | 10/1989 | Horiuchi et al. |
| 4,874,346 A | 10/1989 | Wachspress |
| 4,876,991 A | 10/1989 | Galitello |
| 4,879,045 A | 11/1989 | Eggerichs |
| 4,879,484 A | 11/1989 | Huss |
| 4,879,501 A | 11/1989 | Haner |
| 4,884,953 A | 12/1989 | Golben |
| 4,885,526 A | 12/1989 | Szabo |
| 4,890,049 A | 12/1989 | Auinger |
| 4,893,040 A | 1/1990 | Turner et al. |
| 4,904,926 A | 2/1990 | Pasichinskyj |
| 4,906,877 A | 3/1990 | Ciaio |
| 4,914,412 A | 4/1990 | Engdahl et al. |
| 4,927,329 A | 5/1990 | Kliman et al. |
| 4,933,609 A | 6/1990 | Clark |
| 4,948,044 A | 8/1990 | Cacciatore |
| 4,950,973 A | 8/1990 | Kouba |
| 4,953,052 A | 8/1990 | Cartlidge et al. |
| 4,959,605 A | 9/1990 | Vaidya et al. |
| 4,963,780 A | 10/1990 | Hochstrasser |
| 4,973,868 A | 11/1990 | Wust |
| 4,977,529 A | 12/1990 | Gregg et al. |
| 4,980,595 A | 12/1990 | Arora |
| 4,985,875 A | 1/1991 | Mitchell |
| 4,994,700 A | 2/1991 | Bansal et al. |
| 5,002,020 A | 3/1991 | Kos |
| 5,003,209 A | 3/1991 | Huss et al. |
| 5,003,517 A | 3/1991 | Greer |
| 5,021,698 A | 6/1991 | Pullen et al. |
| 5,030,867 A | 7/1991 | Yamada et al. |
| 5,043,592 A | 8/1991 | Hochstrasser |
| 5,043,911 A | 8/1991 | Rashid |
| 5,047,680 A | 9/1991 | Toeroek |
| 5,053,662 A | 10/1991 | Richter |
| 5,053,732 A | 10/1991 | Elgass et al. |
| 5,057,726 A | 10/1991 | Mole et al. |
| 5,057,731 A | 10/1991 | Hancock |
| 5,058,833 A | 10/1991 | Carmouche |
| 5,065,305 A | 11/1991 | Rich |
| 5,072,145 A | 12/1991 | Davis et al. |
| 5,117,142 A | 5/1992 | von Zweygbergk |
| 5,120,332 A | 6/1992 | Wells |
| 5,130,595 A | 7/1992 | Arora |
| 5,146,146 A | 9/1992 | Samann |
| 5,155,375 A | 10/1992 | Holley |
| 5,164,826 A | 11/1992 | Dailey |
| 5,174,109 A | 12/1992 | Lampe |
| 5,184,040 A | 2/1993 | Lim |
| 5,184,458 A | 2/1993 | Lampe et al. |
| 5,191,256 A | 3/1993 | Reiter et al. |
| 5,208,498 A | 5/1993 | Hamajima |
| 5,220,223 A | 6/1993 | Mehnert |
| 5,220,232 A | 6/1993 | Rigney et al. |
| 5,225,712 A | 7/1993 | Erdman |
| 5,227,702 A | 7/1993 | Nahirney |
| 5,237,815 A | 8/1993 | McArthur |
| 5,237,817 A | 8/1993 | Bornemisza et al. |
| 5,258,697 A | 11/1993 | Ford et al. |
| 5,267,129 A | 11/1993 | Anderson |
| 5,270,635 A * | 12/1993 | Hoffman ............... H02J 7/02 |
| | | 320/140 |
| 5,281,094 A | 1/1994 | McCarty et al. |
| 5,283,488 A | 2/1994 | Ponnappan et al. |
| 5,289,041 A | 2/1994 | Holley |
| 5,289,072 A | 2/1994 | Lange |
| 5,306,972 A | 4/1994 | Hokanson et al. |
| 5,317,498 A | 5/1994 | Dhyandchand et al. |
| 5,336,933 A | 8/1994 | Ernster |
| 5,346,370 A | 9/1994 | Krohn |
| 5,355,044 A | 10/1994 | Uchida et al. |
| 5,369,324 A | 11/1994 | Saether |
| 5,370,112 A | 12/1994 | Perkins |
| 5,371,426 A | 12/1994 | Nagate et al. |
| 5,397,922 A | 3/1995 | Paul et al. |
| 5,400,596 A | 3/1995 | Shlien |
| 5,406,186 A | 4/1995 | Fair |
| 5,409,435 A | 4/1995 | Daniels |
| 5,413,010 A | 5/1995 | Sakakibara et al. |
| 5,418,436 A | 5/1995 | Apuzzo |
| 5,427,194 A | 6/1995 | Miller |
| 5,433,175 A | 7/1995 | Hughes et al. |
| 5,448,123 A | 9/1995 | Nilson et al. |
| 5,468,378 A | 11/1995 | de la Torre Barreiro |
| 5,469,045 A | 11/1995 | Dove et al. |
| 5,473,205 A | 12/1995 | Haaland |
| 5,481,146 A | 1/1996 | Davey |
| 5,484,120 A | 1/1996 | Blakeley et al. |
| 5,489,290 A | 2/1996 | Furnish |
| 5,489,810 A | 2/1996 | Ferreira et al. |
| 5,496,238 A | 3/1996 | Taylor |
| 5,504,382 A | 4/1996 | Douglass et al. |
| 5,512,811 A | 4/1996 | Latos et al. |
| 5,517,822 A | 5/1996 | Haws et al. |
| 5,523,635 A | 6/1996 | Ferreira et al. |
| 5,523,637 A | 6/1996 | Miller |
| 5,530,307 A | 6/1996 | Horst |
| 5,568,005 A | 10/1996 | Davidson |
| 5,594,289 A | 1/1997 | Minato |
| 5,610,448 A | 3/1997 | Dattilo |
| 5,614,773 A | 3/1997 | Fabris |
| 5,619,423 A | 4/1997 | Scrantz |
| 5,625,241 A | 4/1997 | Ewing et al. |
| 5,625,276 A | 4/1997 | Scott et al. |
| 5,626,103 A | 5/1997 | Haws et al. |
| 5,637,934 A | 6/1997 | Fabris |
| 5,637,935 A | 6/1997 | Haaland |
| 5,641,276 A | 6/1997 | Heidelberg et al. |
| 5,650,679 A | 7/1997 | Boggs et al. |
| 5,653,135 A | 8/1997 | Miller et al. |
| 5,656,915 A * | 8/1997 | Eaves ............... H02J 7/0024 |
| | | 320/120 |

(56) References Cited

U.S. PATENT DOCUMENTS

| | | |
|---|---|---|
| 5,659,300 A | 8/1997 | Dresselhuys et al. |
| 5,670,861 A * | 9/1997 | Nor ................. B60L 3/0069 |
| | | 340/636.15 |
| 5,682,073 A | 10/1997 | Mizuno |
| 5,689,165 A | 11/1997 | Jones et al. |
| 5,689,175 A | 11/1997 | Hanson et al. |
| 5,690,209 A | 11/1997 | Kofoed |
| 5,696,413 A | 12/1997 | Woodbridge et al. |
| 5,696,419 A | 12/1997 | Rakestraw et al. |
| 5,699,218 A | 12/1997 | Kadah |
| 5,708,314 A | 1/1998 | Law |
| 5,709,103 A | 1/1998 | Williams |
| 5,710,474 A | 1/1998 | Mulgrave |
| 5,715,716 A | 2/1998 | Miller et al. |
| 5,717,316 A | 2/1998 | Kawai |
| 5,719,458 A | 2/1998 | Kawai |
| 5,720,194 A | 2/1998 | Miller et al. |
| 5,726,517 A | 3/1998 | Gueraud et al. |
| 5,731,649 A | 3/1998 | Caamano |
| 5,735,123 A | 4/1998 | Ehrig |
| 5,736,838 A | 4/1998 | Dove et al. |
| 5,744,896 A | 4/1998 | Kessinger et al. |
| 5,747,964 A * | 5/1998 | Turnbull .................. H02J 7/00 |
| | | 320/124 |
| 5,753,989 A | 5/1998 | Syverson et al. |
| 5,760,507 A | 6/1998 | Miller et al. |
| 5,762,584 A | 6/1998 | Daniels |
| 5,773,910 A | 6/1998 | Lange |
| 5,773,962 A * | 6/1998 | Nor .................. H02J 7/0016 |
| | | 320/122 |
| 5,775,229 A | 7/1998 | Folk et al. |
| 5,777,413 A | 7/1998 | Nagata et al. |
| 5,784,267 A | 7/1998 | Koenig et al. |
| 5,785,137 A | 7/1998 | Reuyl |
| 5,793,137 A | 8/1998 | Smith |
| 5,799,484 A | 9/1998 | Nims |
| 5,801,454 A | 9/1998 | Leininger |
| 5,806,959 A | 9/1998 | Adams et al. |
| 5,833,211 A | 11/1998 | Berling |
| 5,833,440 A | 11/1998 | Berling |
| 5,838,085 A | 11/1998 | Roesel et al. |
| 5,838,138 A | 11/1998 | Henty |
| 5,839,508 A | 11/1998 | Tubel et al. |
| 5,844,342 A | 12/1998 | Taga et al. |
| 5,844,385 A | 12/1998 | Jones et al. |
| 5,850,111 A | 12/1998 | Haaland |
| 5,850,138 A | 12/1998 | Adams et al. |
| 5,850,351 A * | 12/1998 | Lotfy .................. H02J 7/0016 |
| | | 340/636.15 |
| 5,850,732 A | 12/1998 | Willis et al. |
| 5,867,004 A | 2/1999 | Drager et al. |
| 5,874,797 A | 2/1999 | Pinkerton |
| 5,886,450 A | 3/1999 | Kuehnle |
| 5,889,348 A | 3/1999 | Muhlberger et al. |
| 5,892,311 A | 4/1999 | Hayasaka |
| 5,893,343 A | 4/1999 | Rigazzi |
| 5,903,113 A | 5/1999 | Yamada et al. |
| 5,912,522 A | 6/1999 | Rivera |
| 5,917,295 A | 6/1999 | Mongeau |
| 5,923,111 A | 7/1999 | Eno et al. |
| 5,939,813 A | 8/1999 | Schoeb |
| 5,942,829 A | 8/1999 | Huynh |
| 5,945,766 A | 8/1999 | Kim et al. |
| 5,952,756 A | 9/1999 | Hsu et al. |
| 5,968,680 A | 10/1999 | Wolfe et al. |
| 5,973,436 A | 10/1999 | Mitcham |
| 5,982,070 A | 11/1999 | Caamano |
| 5,982,074 A | 11/1999 | Smith et al. |
| 5,990,590 A | 11/1999 | Roesel et al. |
| 5,997,252 A | 12/1999 | Miller |
| 5,998,902 A | 12/1999 | Sleder et al. |
| 6,002,192 A | 12/1999 | Krivospitski et al. |
| 6,005,786 A | 12/1999 | Bluemel et al. |
| 6,014,015 A | 1/2000 | Thorne et al. |
| 6,020,711 A | 2/2000 | Rubertus et al. |
| 6,027,429 A | 2/2000 | Daniels |
| 6,032,459 A | 3/2000 | Skowronski |
| 6,034,463 A | 3/2000 | Hansson |
| 6,037,672 A | 3/2000 | Grewe |
| 6,037,696 A | 3/2000 | Sromin et al. |
| 6,043,579 A | 3/2000 | Hill |
| 6,047,104 A | 4/2000 | Cheng |
| 6,055,163 A | 4/2000 | Wagner et al. |
| 6,057,622 A | 5/2000 | Hsu |
| 6,062,016 A | 5/2000 | Edelman |
| 6,064,122 A | 5/2000 | McConnell |
| 6,065,281 A | 5/2000 | Shekleton et al. |
| 6,066,898 A | 5/2000 | Jensen |
| 6,066,906 A | 5/2000 | Kalsi |
| 6,081,053 A | 6/2000 | Maegawa et al. |
| 6,082,112 A | 7/2000 | Shekleton |
| 6,086,250 A | 7/2000 | Rouhet et al. |
| 6,087,750 A | 7/2000 | Raad |
| 6,093,293 A | 7/2000 | Haag et al. |
| 6,093,986 A | 7/2000 | Windhorn |
| 6,097,104 A | 8/2000 | Russell |
| 6,100,809 A | 8/2000 | Novoselsky et al. |
| 6,104,097 A | 8/2000 | Lehoczky |
| 6,104,115 A | 8/2000 | Offringa et al. |
| 6,105,630 A | 8/2000 | Braun et al. |
| 6,109,222 A | 8/2000 | Glezer et al. |
| 6,121,752 A | 9/2000 | Kitahara et al. |
| 6,125,625 A | 10/2000 | Lipinski et al. |
| 6,127,758 A | 10/2000 | Murry et al. |
| 6,149,410 A | 11/2000 | Cooper |
| 6,157,107 A | 12/2000 | Aoshima et al. |
| 6,158,953 A | 12/2000 | Lamont |
| 6,166,473 A | 12/2000 | Hayasaka |
| 6,169,332 B1 | 1/2001 | Taylor et al. |
| 6,170,251 B1 | 1/2001 | Skowronski et al. |
| 6,172,429 B1 | 1/2001 | Russell |
| 6,172,440 B1 | 1/2001 | Sasaki et al. |
| 6,175,210 B1 | 1/2001 | Schwartz et al. |
| 6,177,735 B1 | 1/2001 | Chapman et al. |
| 6,178,751 B1 | 1/2001 | Shekleton et al. |
| 6,181,235 B1 | 1/2001 | Smith |
| 6,189,621 B1 | 2/2001 | Vail |
| 6,191,561 B1 | 2/2001 | Bartel |
| 6,194,802 B1 | 2/2001 | Rao |
| 6,195,869 B1 | 3/2001 | Pullen et al. |
| 6,198,174 B1 | 3/2001 | Nims et al. |
| 6,199,381 B1 | 3/2001 | Unger et al. |
| 6,199,519 B1 | 3/2001 | Van Blarigan |
| 6,211,633 B1 | 4/2001 | Jones et al. |
| 6,215,206 B1 | 4/2001 | Chitayat |
| 6,218,760 B1 | 4/2001 | Sakuragi et al. |
| 6,226,990 B1 | 5/2001 | Conrad |
| 6,242,827 B1 | 6/2001 | Wolf et al. |
| 6,242,840 B1 | 6/2001 | Denk et al. |
| 6,244,034 B1 | 6/2001 | Taylor et al. |
| 6,246,138 B1 | 6/2001 | Nims |
| 6,255,743 B1 | 7/2001 | Pinkerton et al. |
| 6,265,846 B1 | 7/2001 | Flechsig et al. |
| 6,269,639 B1 | 8/2001 | Conrad |
| 6,269,640 B1 | 8/2001 | Conrad |
| 6,274,945 B1 | 8/2001 | Gilbreth et al. |
| 6,274,960 B1 | 8/2001 | Sakai et al. |
| 6,275,012 B1 | 8/2001 | Jabaji |
| 6,276,124 B1 | 8/2001 | Soh et al. |
| 6,279,318 B1 | 8/2001 | Conrad |
| 6,279,319 B1 | 8/2001 | Conrad |
| 6,284,106 B1 | 9/2001 | Haag et al. |
| 6,286,310 B1 | 9/2001 | Conrad |
| 6,288,467 B1 | 9/2001 | Lange et al. |
| 6,291,901 B1 | 9/2001 | Cefo |
| 6,293,101 B1 | 9/2001 | Conrad |
| 6,294,842 B1 | 9/2001 | Skowronski |
| 6,297,977 B1 | 10/2001 | Huggett et al. |
| 6,300,689 B1 | 10/2001 | Smalser |
| 6,307,278 B1 | 10/2001 | Nims et al. |
| 6,307,717 B1 | 10/2001 | Jeong |
| 6,309,268 B1 | 10/2001 | Mabru |
| 6,311,490 B1 | 11/2001 | Conrad |
| 6,311,491 B1 | 11/2001 | Conrad |

(56) References Cited

U.S. PATENT DOCUMENTS

| | | | |
|---|---|---|---|
| 6,314,773 B1 | 11/2001 | Miller et al. |
| 6,329,783 B1 | 12/2001 | Vrionis et al. |
| 6,332,319 B1 | 12/2001 | Conrad |
| 6,336,326 B1 | 1/2002 | Conrad |
| 6,339,271 B1 | 1/2002 | Noble et al. |
| 6,345,666 B1 | 2/2002 | Conrad |
| 6,348,683 B1 | 2/2002 | Verghese et al. |
| 6,362,718 B1 | 3/2002 | Patrick et al. |
| 6,363,706 B1 | 4/2002 | Meister et al. |
| 6,370,928 B1 | 4/2002 | Chies et al. |
| 6,373,162 B1 | 4/2002 | Liang et al. |
| 6,373,230 B2 | 4/2002 | Jabaji |
| 6,380,648 B1 | 4/2002 | Hsu |
| 6,384,564 B1 | 5/2002 | Pollock |
| 6,397,946 B1 | 6/2002 | Vail |
| 6,405,522 B1 | 6/2002 | Pont et al. |
| 6,407,465 B1 | 6/2002 | Peltz et al. |
| 6,411,003 B1 | 6/2002 | Sasaki et al. |
| 6,420,852 B1 * | 7/2002 | Sato | H01M 10/482 |
| | | | 320/134 |
| 6,435,925 B1 | 8/2002 | Mabru |
| 6,438,937 B1 | 8/2002 | Pont et al. |
| 6,445,101 B2 | 9/2002 | Ley |
| 6,445,105 B1 | 9/2002 | Kliman et al. |
| 6,453,658 B1 | 9/2002 | Willis et al. |
| 6,454,920 B1 | 9/2002 | Haag et al. |
| 6,455,964 B1 | 9/2002 | Nims |
| 6,455,970 B1 | 9/2002 | Shaefer et al. |
| 6,463,730 B1 | 10/2002 | Keller et al. |
| 6,467,725 B1 | 10/2002 | Coles et al. |
| 6,470,933 B1 | 10/2002 | Volpi |
| 6,479,534 B1 | 11/2002 | Bentley et al. |
| 6,483,222 B2 | 11/2002 | Pelrine et al. |
| 6,486,640 B2 | 11/2002 | Adams |
| 6,501,195 B1 | 12/2002 | Barton |
| 6,503,056 B2 | 1/2003 | Eccles et al. |
| 6,504,281 B1 | 1/2003 | Smith et al. |
| 6,512,305 B1 | 1/2003 | Pinkerton et al. |
| 6,518,680 B2 | 2/2003 | McDavid |
| 6,526,757 B2 | 3/2003 | Mackay |
| 6,528,902 B1 | 3/2003 | Barton |
| 6,531,799 B1 | 3/2003 | Miller |
| 6,531,848 B1 * | 3/2003 | Chitsazan | H02J 7/0016 |
| | | | 320/153 |
| 6,538,358 B1 | 3/2003 | Krefta et al. |
| 6,541,887 B2 | 4/2003 | Kawamura |
| 6,545,373 B1 | 4/2003 | Andres et al. |
| 6,546,769 B2 | 4/2003 | Miller et al. |
| 6,548,925 B2 | 4/2003 | Noble et al. |
| 6,563,717 B2 | 5/2003 | Lunding et al. |
| 6,565,243 B1 | 5/2003 | Cheung |
| 6,566,764 B2 | 5/2003 | Rebsdorf et al. |
| 6,579,137 B2 | 6/2003 | Mabru |
| 6,590,298 B1 | 7/2003 | Du Plessis |
| 6,606,864 B2 | 8/2003 | Mackay |
| 6,622,487 B2 | 9/2003 | Jones |
| 6,631,080 B2 | 10/2003 | Trimble et al. |
| 6,634,176 B2 | 10/2003 | Rouse et al. |
| 6,644,027 B1 | 11/2003 | Kelly |
| 6,647,716 B2 | 11/2003 | Boyd |
| 6,655,341 B2 | 12/2003 | Westerbeke |
| 6,657,348 B2 | 12/2003 | Qin et al. |
| 6,664,688 B2 | 12/2003 | Naito et al. |
| 6,666,027 B1 | 12/2003 | Cardenas |
| 6,669,416 B2 | 12/2003 | Klement |
| 6,672,413 B2 | 1/2004 | Moore et al. |
| 6,675,583 B2 | 1/2004 | Willis et al. |
| 6,677,685 B2 | 1/2004 | Pfleger et al. |
| 6,679,977 B2 | 1/2004 | Haag et al. |
| 6,684,642 B2 | 2/2004 | Willis et al. |
| 6,700,217 B1 | 3/2004 | North et al. |
| 6,700,248 B2 | 3/2004 | Long |
| 6,702,404 B2 | 3/2004 | Anwar et al. |
| 6,703,719 B1 | 3/2004 | McConnell |
| 6,703,747 B2 | 3/2004 | Kawamura |
| 6,710,469 B2 | 3/2004 | McDavid |
| 6,710,491 B2 | 3/2004 | Wu et al. |
| 6,710,492 B2 | 3/2004 | Minagawa |
| 6,710,502 B2 | 3/2004 | Maslov et al. |
| 6,713,936 B2 | 3/2004 | Lee |
| 6,717,313 B1 | 4/2004 | Bae |
| 6,720,688 B1 | 4/2004 | Schiller |
| 6,724,115 B2 | 4/2004 | Kusase |
| 6,727,632 B2 | 4/2004 | Kusase |
| 6,731,019 B2 | 5/2004 | Burns et al. |
| 6,732,531 B2 | 5/2004 | Dickey |
| 6,735,953 B1 | 5/2004 | Wolfe et al. |
| 6,737,829 B2 | 5/2004 | Sastry |
| 6,741,010 B2 | 5/2004 | Wilkin |
| 6,756,719 B1 | 6/2004 | Chiu |
| 6,759,775 B2 | 7/2004 | Grimm |
| 6,765,307 B2 | 7/2004 | Gerber et al. |
| 6,766,647 B2 | 7/2004 | Hartzheim |
| 6,771,000 B2 | 8/2004 | Kim et al. |
| 6,803,696 B2 | 10/2004 | Chen |
| 6,853,107 B2 | 2/2005 | Pyntikov et al. |
| 6,894,411 B2 | 5/2005 | Schmid et al. |
| 6,894,455 B2 | 5/2005 | Cai et al. |
| 6,897,595 B1 | 5/2005 | Chiarenza |
| 6,901,212 B2 | 5/2005 | Masino |
| 6,956,313 B2 | 10/2005 | El-Gabry et al. |
| 6,969,927 B1 | 11/2005 | Lee |
| 7,002,259 B2 | 2/2006 | Howes et al. |
| 7,081,696 B2 | 7/2006 | Ritchey |
| 7,102,248 B2 | 9/2006 | Wobben |
| 7,119,513 B2 | 10/2006 | Ishikawa |
| 7,126,312 B2 | 10/2006 | Moore |
| 7,193,391 B2 | 3/2007 | Moore |
| 7,239,098 B2 | 7/2007 | Masino |
| 7,248,006 B2 | 7/2007 | Bailey et al. |
| 7,250,702 B2 | 7/2007 | Abou et al. |
| 7,348,764 B2 | 3/2008 | Stewart et al. |
| 7,382,103 B2 | 6/2008 | Shirazee et al. |
| 7,391,180 B2 | 6/2008 | Armiroli et al. |
| 7,400,077 B2 | 7/2008 | Caroon |
| 7,405,490 B2 | 7/2008 | Moehlenkamp |
| 7,427,849 B2 | 9/2008 | Kaneko et al. |
| 7,482,708 B1 | 1/2009 | Barton et al. |
| 7,514,834 B2 | 4/2009 | Takeuchi |
| 7,525,285 B2 | 4/2009 | Plett |
| 7,545,052 B2 | 6/2009 | Llorente et al. |
| 7,554,303 B1 | 6/2009 | Kawamura |
| 7,595,574 B2 | 9/2009 | Ritchey |
| 7,602,158 B1 | 10/2009 | Iacob |
| 7,649,274 B2 | 1/2010 | Burt |
| 7,710,081 B2 | 5/2010 | Saban et al. |
| 7,816,805 B2 | 10/2010 | Tanaka et al. |
| 7,948,141 B2 | 5/2011 | Takeuchi |
| 8,097,970 B2 | 1/2012 | Hyvaerinen |
| 8,106,563 B2 | 1/2012 | Ritchey |
| 8,138,620 B2 | 3/2012 | Wagoner et al. |
| 8,212,371 B2 | 7/2012 | Maibach et al. |
| 8,212,445 B2 | 7/2012 | Ritchey |
| 8,288,992 B2 * | 10/2012 | Kramer | H02J 7/0016 |
| | | | 320/121 |
| 8,330,419 B2 | 12/2012 | Kim et al. |
| 8,426,063 B2 | 4/2013 | Lin |
| 8,427,105 B2 | 4/2013 | Plett |
| 8,466,595 B2 | 6/2013 | Spooner |
| 8,470,464 B2 * | 6/2013 | Troutman | H01M 10/482 |
| | | | 429/150 |
| 8,564,247 B2 * | 10/2013 | Hintz | H02J 7/0016 |
| | | | 320/121 |
| 8,577,529 B2 * | 11/2013 | Takahashi | H02J 7/0048 |
| | | | 701/22 |
| 8,610,383 B2 | 12/2013 | De Sousa et al. |
| 8,614,529 B2 | 12/2013 | Ritchey |
| 8,614,563 B2 | 12/2013 | Baughman |
| 8,685,563 B1 | 4/2014 | Lin |
| 8,729,861 B2 | 5/2014 | Nishida et al. |
| 8,796,993 B2 * | 8/2014 | White | G01R 31/3648 |
| | | | 324/427 |
| 8,798,832 B2 * | 8/2014 | Kawahara | H01M 10/48 |
| | | | 701/32.7 |

(56) References Cited

U.S. PATENT DOCUMENTS

| | | | |
|---|---|---|---|
| 8,823,296 B2 | 9/2014 | De Sousa et al. | |
| 8,917,155 B2 | 12/2014 | Adachi et al. | |
| 8,928,282 B2* | 1/2015 | Kudo | H01M 10/441 |
| | | | 320/122 |
| 8,988,045 B2* | 3/2015 | Klein | H01M 10/448 |
| | | | 320/155 |
| 9,024,586 B2* | 5/2015 | Vance | B60L 3/0046 |
| | | | 320/122 |
| 9,054,533 B2* | 6/2015 | Gaul | H02J 7/00 |
| 9,093,864 B2* | 7/2015 | Abe | H02J 13/00017 |
| 9,130,377 B2 | 9/2015 | Barsukov et al. | |
| 9,147,910 B2 | 9/2015 | Chuah et al. | |
| 9,153,845 B2* | 10/2015 | Tanaka | H01M 10/425 |
| 9,153,996 B2 | 10/2015 | De Sousa et al. | |
| 9,197,081 B2* | 11/2015 | Finberg | H02J 7/0016 |
| 9,230,730 B2 | 1/2016 | Heins | |
| 9,395,420 B2* | 7/2016 | White | G01R 31/3648 |
| 9,450,274 B2* | 9/2016 | Vo | H02J 7/0016 |
| 9,496,727 B2 | 11/2016 | Liu et al. | |
| 9,520,613 B2* | 12/2016 | Brockerhoff | B60L 58/19 |
| 9,564,763 B2* | 2/2017 | Finberg | H02J 7/0016 |
| 9,579,961 B2* | 2/2017 | Harris | B60L 53/14 |
| 9,669,726 B2* | 6/2017 | Luo | H02J 7/0069 |
| 9,705,340 B2 | 7/2017 | Lucea | |
| 9,787,107 B2* | 10/2017 | Lutze | H02J 7/0016 |
| 9,812,981 B2 | 11/2017 | Ritchey et al. | |
| 9,873,342 B2 | 1/2018 | De Sousa et al. | |
| 9,885,757 B2 | 2/2018 | Liu et al. | |
| 9,960,611 B2* | 5/2018 | Toya | H02J 7/0048 |
| 9,979,211 B2 | 5/2018 | Barsukov et al. | |
| 10,069,313 B2* | 9/2018 | Tkachenko | H01M 10/441 |
| 10,073,128 B2* | 9/2018 | Yoshioka | G01R 31/3644 |
| 10,074,997 B2* | 9/2018 | Vo | H02J 7/342 |
| 10,103,591 B2 | 10/2018 | Heins | |
| 10,147,983 B2* | 12/2018 | Kawahara | H01M 10/482 |
| 10,222,428 B2* | 3/2019 | Saint-Marcoux | H01M 10/425 |
| 10,232,716 B2* | 3/2019 | Higuchi | B60L 50/60 |
| 10,256,643 B2* | 4/2019 | Toya | H02J 7/005 |
| 10,263,435 B2 | 4/2019 | Kim et al. | |
| 10,277,041 B2* | 4/2019 | Zane | H02J 7/0016 |
| 10,291,162 B1 | 5/2019 | Heins | |
| 10,298,026 B2* | 5/2019 | Trimboli | H02M 3/33507 |
| 10,305,298 B2* | 5/2019 | Kristensen | H02J 7/0016 |
| 10,305,409 B2 | 5/2019 | Wang et al. | |
| 10,330,732 B2* | 6/2019 | Roumi | G01R 31/367 |
| 10,483,791 B2* | 11/2019 | Mergener | H02J 7/0016 |
| 10,483,899 B2 | 11/2019 | Hustedt | |
| 10,543,303 B2* | 1/2020 | Zilbershlag | H01M 10/488 |
| 10,561,775 B2* | 2/2020 | Zilbershlag | H01M 50/172 |
| 10,644,537 B2* | 5/2020 | Krishnan | H02J 7/0016 |
| 10,778,014 B2 | 9/2020 | Barsukov et al. | |
| 10,833,512 B2* | 11/2020 | Remboski | H02J 7/24 |
| 10,958,075 B2* | 3/2021 | Collins | H02M 7/4835 |
| 10,958,083 B2* | 3/2021 | Halsey | H01M 50/269 |
| 10,985,552 B2* | 4/2021 | Tada | H01M 50/581 |
| 10,985,587 B2* | 4/2021 | Matsumura | H02J 7/007 |
| 10,992,144 B2* | 4/2021 | Li | H02J 7/0047 |
| 10,992,146 B2* | 4/2021 | Flowers | H02J 7/00041 |
| 11,005,276 B2* | 5/2021 | Lee | H01M 10/425 |
| 11,095,148 B2* | 8/2021 | Mergener | H02J 7/00 |
| 11,128,153 B1* | 9/2021 | Cho | H02J 7/007184 |
| 11,133,680 B2 | 9/2021 | Wang et al. | |
| 11,171,494 B2 | 11/2021 | Tang et al. | |
| 11,277,012 B2* | 3/2022 | Ono | H02J 7/0019 |
| 11,336,104 B2 | 5/2022 | Poland et al. | |
| 2002/0012261 A1 | 1/2002 | Moindron | |
| 2002/0047418 A1 | 4/2002 | Seguchi et al. | |
| 2002/0057030 A1 | 5/2002 | Fogarty | |
| 2002/0070707 A1* | 6/2002 | Sato | H01M 10/425 |
| | | | 320/134 |
| 2003/0047209 A1 | 3/2003 | Yanai et al. | |
| 2004/0021437 A1 | 2/2004 | Maslov et al. | |
| 2004/0037221 A1 | 2/2004 | Aisa | |
| 2004/0174652 A1 | 9/2004 | Lewis | |
| 2004/0232796 A1 | 11/2004 | Weissensteiner | |
| 2004/0251761 A1 | 12/2004 | Hirzel | |
| 2005/0013085 A1 | 1/2005 | Kinsella et al. | |
| 2005/0024015 A1* | 2/2005 | Houldsworth | H02J 7/0014 |
| | | | 320/119 |
| 2005/0052155 A1 | 3/2005 | Surig | |
| 2005/0099314 A1 | 5/2005 | Aisa | |
| 2005/0184689 A1 | 8/2005 | Maslov et al. | |
| 2005/0212487 A1* | 9/2005 | Sodeno | H02J 7/1446 |
| | | | 320/132 |
| 2005/0248440 A1 | 11/2005 | Stevens | |
| 2005/0269989 A1* | 12/2005 | Geren | H02J 7/0016 |
| | | | 320/119 |
| 2005/0280264 A1 | 12/2005 | Nagy | |
| 2006/0022639 A1 | 2/2006 | Moore | |
| 2006/0033475 A1 | 2/2006 | Moore | |
| 2006/0056127 A1 | 3/2006 | Lewis | |
| 2006/0097698 A1* | 5/2006 | Plett | H02J 7/0048 |
| | | | 320/118 |
| 2006/0232069 A1 | 10/2006 | Lim et al. | |
| 2006/0273766 A1 | 12/2006 | Kawamura | |
| 2007/0073445 A1 | 3/2007 | Llorente et al. | |
| 2007/0182273 A1 | 8/2007 | Burt | |
| 2007/0210733 A1 | 9/2007 | Du et al. | |
| 2008/0012538 A1 | 1/2008 | Stewart et al. | |
| 2008/0088200 A1 | 4/2008 | Ritchey | |
| 2008/0106100 A1 | 5/2008 | Hyvarinen | |
| 2008/0116759 A1 | 5/2008 | Lin | |
| 2008/0266742 A1 | 10/2008 | Henke et al. | |
| 2009/0027006 A1 | 1/2009 | Vezzini et al. | |
| 2009/0066291 A1* | 3/2009 | Tien | H02J 7/0016 |
| | | | 320/118 |
| 2009/0078481 A1* | 3/2009 | Harris | B60K 16/00 |
| | | | 701/22 |
| 2009/0167247 A1* | 7/2009 | Bai | H02J 7/0016 |
| | | | 320/134 |
| 2009/0208837 A1 | 8/2009 | Lin | |
| 2009/0251100 A1* | 10/2009 | Incledon | H02J 7/0016 |
| | | | 320/137 |
| 2009/0267414 A1 | 10/2009 | Kiyohara et al. | |
| 2010/0019593 A1 | 1/2010 | Ritchey | |
| 2010/0073970 A1 | 3/2010 | Abolhassani et al. | |
| 2010/0090553 A1 | 4/2010 | Ritchey | |
| 2010/0207580 A1 | 8/2010 | Nishida et al. | |
| 2010/0244781 A1* | 9/2010 | Kramer | H02J 7/0016 |
| | | | 320/162 |
| 2010/0244847 A1* | 9/2010 | Kudo | B60L 58/12 |
| | | | 324/433 |
| 2010/0261048 A1* | 10/2010 | Kim | B60L 3/0046 |
| | | | 429/150 |
| 2010/0305792 A1* | 12/2010 | Wilk | B60L 50/61 |
| | | | 701/22 |
| 2011/0057617 A1* | 3/2011 | Finberg | H02J 7/0016 |
| | | | 320/122 |
| 2011/0078470 A1* | 3/2011 | Wang | G06F 1/28 |
| | | | 429/150 |
| 2011/0089897 A1* | 4/2011 | Zhang | H02J 7/0016 |
| | | | 320/116 |
| 2011/0127960 A1 | 6/2011 | Plett | |
| 2011/0169454 A1* | 7/2011 | Maruyama | H01M 10/441 |
| | | | 320/118 |
| 2011/0241630 A1 | 10/2011 | Ritchey et al. | |
| 2011/0260687 A1* | 10/2011 | Kudo | H01M 10/441 |
| | | | 320/118 |
| 2011/0266806 A1 | 11/2011 | Numajiri | |
| 2012/0013304 A1* | 1/2012 | Murase | B60L 58/21 |
| | | | 320/116 |
| 2012/0065824 A1* | 3/2012 | Takahashi | H02J 7/0016 |
| | | | 903/903 |
| 2012/0074898 A1* | 3/2012 | Schwartz | H02J 7/0018 |
| | | | 320/134 |
| 2012/0091964 A1* | 4/2012 | Vance | H02J 7/0014 |
| | | | 320/122 |
| 2012/0094150 A1* | 4/2012 | Troutman | H01M 50/51 |
| | | | 429/61 |
| 2012/0194403 A1 | 8/2012 | Cordier et al. | |
| 2012/0206105 A1* | 8/2012 | Nishizawa | H01M 10/482 |
| | | | 320/134 |

(56) References Cited

U.S. PATENT DOCUMENTS

| | | |
|---|---|---|
| 2012/0229060 A1 | 9/2012 | Ritchey et al. |
| 2012/0256592 A1 | 10/2012 | Baughman |
| 2012/0274331 A1 | 11/2012 | Liu et al. |
| 2013/0002201 A1 | 1/2013 | Bodkin et al. |
| 2013/0026989 A1 | 1/2013 | Gibbs et al. |
| 2013/0026993 A1* | 1/2013 | Hintz .................. H02J 7/0016 320/119 |
| 2013/0033231 A1* | 2/2013 | Zhang ................. H02J 7/0016 320/116 |
| 2013/0065093 A1* | 3/2013 | White .................. H01M 10/42 429/50 |
| 2013/0069598 A1* | 3/2013 | Tanaka ................ H01M 10/44 320/134 |
| 2013/0169234 A1 | 7/2013 | Chuah et al. |
| 2014/0015488 A1 | 1/2014 | Despesse |
| 2014/0021924 A1* | 1/2014 | Abe .................. H02J 13/00017 320/118 |
| 2014/0077752 A1 | 3/2014 | Barsukov et al. |
| 2014/0145684 A1 | 5/2014 | Liu et al. |
| 2014/0167708 A1 | 6/2014 | Ritchey |
| 2014/0167780 A1* | 6/2014 | White .................. H01M 10/42 324/538 |
| 2014/0252922 A1 | 9/2014 | Ritchey et al. |
| 2014/0253271 A1 | 9/2014 | Heins |
| 2014/0287278 A1 | 9/2014 | Despesse |
| 2014/0312828 A1* | 10/2014 | Vo ....................... H02J 7/0016 429/7 |
| 2014/0327407 A1 | 11/2014 | Lucea |
| 2014/0347903 A1 | 11/2014 | Ritchey et al. |
| 2014/0361743 A1* | 12/2014 | Lin ...................... B60L 58/15 320/109 |
| 2014/0368168 A1* | 12/2014 | Beckman ............ H02J 7/00714 320/134 |
| 2015/0028817 A1* | 1/2015 | Brockerhoff ........ H02J 7/0013 429/61 |
| 2015/0219721 A1* | 8/2015 | Yang ................... G01R 31/367 324/437 |
| 2015/0231985 A1* | 8/2015 | Li ....................... G01R 31/367 320/134 |
| 2015/0380959 A1* | 12/2015 | Chang ................. H02J 7/0016 320/118 |
| 2016/0043579 A1* | 2/2016 | Finberg ............... H02J 7/0016 320/116 |
| 2016/0072316 A1 | 3/2016 | Barsukov et al. |
| 2016/0111900 A1* | 4/2016 | Beaston .............. H02J 7/0014 320/134 |
| 2016/0134210 A1 | 5/2016 | Bock et al. |
| 2016/0190830 A1* | 6/2016 | Kuhlmann .......... H02J 13/00002 320/116 |
| 2016/0336764 A1 | 11/2016 | Becker et al. |
| 2016/0336765 A1* | 11/2016 | Trimboli ............ H02J 1/102 |
| 2016/0336767 A1* | 11/2016 | Zane ................... H02J 1/102 |
| 2016/0351976 A1* | 12/2016 | Kawahara ........... G01R 31/3842 |
| 2017/0016961 A1 | 1/2017 | Lucea |
| 2017/0054306 A1* | 2/2017 | Vo ....................... H02J 7/0024 |
| 2017/0104347 A1* | 4/2017 | Shimonishi ........ H01M 10/0569 |
| 2017/0117721 A1* | 4/2017 | Toya .................. H02J 7/0013 |
| 2017/0214253 A1 | 7/2017 | Kim et al. |
| 2017/0264110 A1* | 9/2017 | Toya .................. H02J 7/005 |
| 2017/0299660 A1* | 10/2017 | Saint-Marcoux ...... B60L 58/14 |
| 2017/0346334 A1* | 11/2017 | Mergener ........... H02J 7/0016 |
| 2018/0008760 A1* | 1/2018 | Zilbershlag ........ H01M 10/488 |
| 2018/0019694 A1 | 1/2018 | Spickard |
| 2018/0056798 A1* | 3/2018 | Syouda ............... H02J 7/0019 |
| 2018/0062402 A1* | 3/2018 | Syouda ............... H02J 7/0019 |
| 2018/0123357 A1 | 5/2018 | Beaston et al. |
| 2018/0219390 A1* | 8/2018 | Tkachenko ........ H02J 7/0016 |
| 2018/0226810 A1* | 8/2018 | Barsukov et al. |
| 2018/0241227 A1* | 8/2018 | Halsey ............... H01M 50/296 |
| 2018/0278146 A1 | 9/2018 | Guven et al. |
| 2018/0301929 A1* | 10/2018 | Krishnan ........... H01M 8/0656 |
| 2018/0337536 A1* | 11/2018 | Li ....................... H02J 7/00 |
| 2018/0339093 A1* | 11/2018 | Zilbershlag ........ H01M 10/4257 |
| 2018/0366959 A1* | 12/2018 | Coenen ............... G01R 31/392 |
| 2019/0103750 A1* | 4/2019 | Kristensen .......... H02J 7/0024 |
| 2019/0148952 A1* | 5/2019 | Remboski .......... H02J 7/00309 320/128 |
| 2019/0229540 A1* | 7/2019 | Lee .................... H02J 7/0024 |
| 2019/0273380 A1* | 9/2019 | Collins ............... H02J 3/38 |
| 2019/0280488 A1 | 9/2019 | Tang et al. |
| 2019/0299799 A1* | 10/2019 | Hinterberger ....... H02J 7/00712 |
| 2019/0393696 A1* | 12/2019 | Tada .................. H01M 50/581 |
| 2020/0036047 A1* | 1/2020 | Aikens ............... H01M 10/0525 |
| 2020/0044459 A1* | 2/2020 | Lee .................... H01M 10/425 |
| 2020/0052524 A1* | 2/2020 | Mergener ........... H02J 7/0063 |
| 2020/0099110 A1* | 3/2020 | Lin .................... H02J 7/0019 |
| 2020/0203961 A1* | 6/2020 | Flowers ............. H02J 7/0013 |
| 2020/0220364 A1 | 7/2020 | Wang et al. |
| 2020/0244076 A1* | 7/2020 | Wang ................. H02M 7/49 |
| 2020/0274203 A1* | 8/2020 | Kirleis .............. H01M 10/482 |
| 2020/0274368 A1* | 8/2020 | Crouse, Jr. ......... H02J 7/0021 |
| 2020/0274371 A1* | 8/2020 | Kirleis .............. B60L 53/00 |
| 2020/0274386 A1* | 8/2020 | Kirleis .............. B64D 27/26 |
| 2020/0321788 A1* | 10/2020 | Ono .................. H02J 7/0019 |
| 2020/0412159 A1* | 12/2020 | Snyder .............. G01R 31/36 |
| 2021/0013784 A1 | 1/2021 | Shirazee |
| 2021/0044119 A1 | 2/2021 | Poland et al. |
| 2021/0075230 A1* | 3/2021 | Ono .................. H02J 7/005 |
| 2021/0098996 A1* | 4/2021 | Ono .................. H02J 7/0013 |
| 2021/0098998 A1 | 4/2021 | Eo |
| 2021/0234380 A1* | 7/2021 | Ono .................. H02J 7/0013 |
| 2021/0249873 A1* | 8/2021 | Despesse ........... H02J 7/0014 |
| 2021/0273461 A1* | 9/2021 | Lin .................... H02J 7/0016 |
| 2021/0296912 A1* | 9/2021 | Cho .................. H02J 7/0024 |
| 2021/0302505 A1* | 9/2021 | Worry ............... G01R 31/367 |
| 2021/0313830 A1* | 10/2021 | Dowler .............. H02J 7/0024 |
| 2022/0060029 A1* | 2/2022 | Syouda .............. H02J 7/00712 |

FOREIGN PATENT DOCUMENTS

| | | |
|---|---|---|
| CA | 2341095 A1 | 10/2001 |
| CA | 2459126 | 4/2003 |
| CA | 2543354 C | 12/2014 |
| CN | 1082740 C | 4/2002 |
| CN | 101582672 A | 11/2009 |
| CN | 102148111 A | 8/2011 |
| CN | 102484448 A | 5/2012 |
| CN | 202841012 U | 3/2013 |
| CN | 107683554 A | 2/2018 |
| DE | 19733208 C1 | 10/1998 |
| DE | 102006033629 A1 | 1/2008 |
| EP | 0603778 B1 | 6/1996 |
| EP | 0613234 B1 | 11/2001 |
| EP | 1416604 A2 | 5/2004 |
| EP | 1413046 81 | 5/2006 |
| EP | 1717946 A2 | 11/2006 |
| EP | PI0415663 A | 12/2006 |
| EP | 1068663 B1 | 5/2008 |
| EP | 2797221 A1 | 10/2014 |
| JP | 2001161098 A | 6/2001 |
| JP | 2001204198 A | 7/2001 |
| JP | 3481037 B2 | 12/2003 |
| JP | 2004336836 A | 11/2004 |
| JP | 2006521781 A | 9/2006 |
| JP | 2007097341 A | 4/2007 |
| JP | 2009080093 A | 4/2009 |
| JP | 4790618 B2 | 7/2011 |
| JP | 5798015 B2 | 8/2015 |
| KR | 1020070082819 | 8/2007 |
| KR | 102066323 B1 | 1/2020 |
| SE | 9701662 | 6/1998 |
| WO | 8100651 A1 | 3/1981 |
| WO | 8807782 A1 | 10/1988 |
| WO | 9708009 A1 | 3/1997 |
| WO | 9808291 A1 | 2/1998 |
| WO | 9848290 A1 | 10/1998 |
| WO | 2004001949 A1 | 12/2003 |
| WO | 2004004109 A2 | 1/2004 |
| WO | 2004088832 A1 | 10/2004 |
| WO | 2005043740 A2 | 5/2005 |
| WO | 2007098227 A2 | 8/2007 |
| WO | 2008067649 A2 | 6/2008 |

(56) References Cited

FOREIGN PATENT DOCUMENTS

| WO | 2008091035 | A1 | 7/2008 |
|----|------------|----|--------|
| WO | 2008119864 | A1 | 7/2008 |
| WO | 1680861 | B1 | 10/2008 |
| WO | 2010057892 | A1 | 5/2010 |
| WO | 2010057893 | A1 | 5/2010 |
| WO | 2013155601 | A1 | 10/2013 |
| WO | 2013247003 | A1 | 10/2013 |
| WO | 2018213919 | A1 | 11/2018 |
| WO | 2020047663 | A1 | 3/2020 |
| WO | 2021094744 | A1 | 5/2021 |

OTHER PUBLICATIONS

Speltino, et al., "Cell Equalization in Battery Stacks Through State of Charge Estimation Polling", 2010 American Contra! Conference Marriott Waterfront, Baltimore, MD, USA Jun. 30-Jul. 2, 2010, 6 pages.

Welsh, "A Comparison of Active and Passive Cell Balancing Techniques for Series/Parallel Battery Packs" Thesis, Electrical and Computer Engineering Graduate Program, The Ohio State Univesrity, 2009, 115 pages.

"New Motor architecture could be a game-changer", High Power Media Ltd., E-Mobility Engineering, 2021, 6 pages.

"Single Wound and Dual Winding Motor", Yaskawa America, Models & Ratings, 220v Motor/400V Motor, Standard 200V Series.

"What, is Dynamic Torque Switching?", Info@epropelled.com, 4 pages.

Anders, "Analysis of a gas turbine driven hybrid drive system for heavy vehicles", Thesis/Dissertation, ETDEWEB, U.S. Department of Energy Office of Scientific and Technical information, Jul. 1, 1999, 4 pages.

Canadian Examination Report, dated Mar. 3, 2017, for CA 2,773,102, 4 pages.

Canadian Examination Report, dated Nov. 1, 2017, for CA 2,773,040, 4 pages.

Canadian Office Action, for Canadian Application No. 2,487,668, dated Oct. 6, 2011, 4 pages.

Canadian Office Action, for Canadian Application No. 3,061,619, dated Sep. 2, 2021, 4 pages.

Chinese Office Action dated Jan. 29, 2022 for Chinese Application No. 2018800337539, 8 pages (English translation of action).

Eckart Nipp, "Alternative to Field-Weakening of Surface-Mounted Permanent-magnet Motors for Variable-Speed Drives", IEEE Xplore 1995, 8 pages.

Eckart Nipp, "Permanent Magnet Motor Drives with Switched Stator Windings", Kungl Tekniska Hogskolan, TRITA-EMD-9905 ISSN-1102-0172, Submitted to the School of Electric Engineering and Information Technology, 1999, 315 pages.

European Examination Report, dated Apr. 18, 2017, for EP 10 814 529.3, 6 pages.

Extended European Search Report, dated Oct. 14, 2020, for EP 18806122, 7 pages.

First Office Action and Search Report (with English Translation) from corresponding CN application No. 201080039251.0, dated Jan. 30, 2014, 16 pages.

Huang, et al., "Electrical Two-Speed Propulsion by Motor Winding Switching and Its Control Strategies for Electric Vehicles" IEEE transactions on Vehicular Technology, vol. 48, No. 2, Mar. 1999, 12 pages.

International Preliminary Report on Patentability and Written Opinion, dated Mar. 6, 2012, for PCT/US2010/047750, 5 pages.

International Preliminary Report on Patentability with Written Opinion dated Nov. 26, 2019, for international Application No. PCT/CA2018/050222, filed Feb. 27, 2018, 6 pages.

International Search Report and Written Opinion dated Jul. 12, 2022 in PCT/CA2022/050620, 15 pages.

International Search Report and Written Opinion dated Aug. 15, 2022 in PCT/CA2022/050753.

International Search Report and Written Opinion dated Sep. 21, 2022 in PCT/CA2022/050620, 17 pages.

International Search Report and Written Opinion, dated Jun. 2, 2020, for PCT/CA2020/050534, 10 pages.

International Search Report and Written Opinion, dated May 24, 2011, for PCT/US2010/047750, 7 pages.

International Search Report and Written Opinion, dated May 8, 2018, for PCT/CA2018/050222, 7 pages.

International Search Report and Written Opinion, dated Nov. 13, 2019, for PCT/CA2019/051239, 9 pages.

International Search Report and Written Opinion, dated Sep. 28, 2007, for PCT/CA2007/001040, 8 pages.

International Search Report for PCT/CA2020/050534, dated Jun. 2, 2020, 4 pages.

Maslov, et al. "Low-Speed High-Torque Brushless PM Motor for Propulsion Applicatins With an Advanced Magentic Path Design," U.S. Appl. No. 60/399,415, filed Jul. 31, 2002, 18 pages.

Non Final Office Action for U.S. Appl. No. 17/727,143, dated Aug. 22, 2022, 28 pages.

Notice of Allowance dated Jun. 15, 2021, for Ritchey, "Variable Coil Configuration System Control, Apparatus and Method," U.S. Appl. No. 16/615,493, 10 pages.

Tang et al., "A Reconfigurable-Winding System For Electric Vehicle Drive Applications", 2017 IEEE Transportation Electrification Conference and Expo (ITEC), 6 pages.

Tang, "Electric Motor Performance Improvement Techniques", 2016 U.S. DOE Vehicle Technologies Office Review, Project ID:EDT071, Oak Ridge National Laboratory, 23 pages.

Written Opinion for PCT/CA2020/050534, dated Jun. 2, 2020, 6 pages.

Villani M., et al., "Fault-tolerant brushless DC drive for aerospace application. In the XIX International Conference on Electrical Machines—ICEM Sep. 6, 2010", 1-7.

Horsche et al. "Realising Serial Hybrid Energy Storage Systems (sHESS) by implementing Switching Circuits on Battery Cell Level", EVS29 Symposium, Montreal Quebec, Canada, Jun. 19-22, 2016.

\* cited by examiner

SYSTEMS AND METHODS FOR INDIVIDUAL CONTROL OF A PLURALITY OF BATTERY CELLS

PRIOR APPLICATIONS

This Application is a continuation of U.S. patent application Ser. No. 17/727,143 filed Apr. 22, 2022, which claims the benefit of U.S. Provisional Application No. 63/262,017, filed Oct. 1, 2021, and U.S. Provisional Application No. 63/183,980, filed May 4, 2021, the disclosures of all of which are incorporated by reference into the Detailed Description below.

TECHNICAL FIELD

The present disclosure generally relates to energy and provision of energy from a storage system and more particularly to a Battery Control System (BCS) including its architecture, operation principle and controller.

BACKGROUND

Traditional fixed configuration battery architectures are subject to considerable limitations where battery management is concerned, and this is due to design limitations and lack of flexibility in energy storage systems. As battery packs are repeatedly charged and discharged, individual battery cells may exhibit different characteristics—for instance, some cells may charge or discharge faster than others. Cells exhibiting abnormal characteristics may be overcharged or undercharged and continue to degrade more quickly than healthy cells. The abnormal performance of these unhealthy cells decreases the capacity and efficiency of the system as a whole and may cause damage to those cells. For instance, unhealthy cells may limit the operational cycle of the entire battery collective and may cause more serious problems, such as extreme heating and even explosion due to the impacts of thermal runaway events within the weaker cells.

Lithium ferrophosphate (LFP) batteries tend to degrade over ordinary cycling as a result of formation of a solid-electrolyte interphase (SEI) layer in the negative electrode. SEI grows from electrochemical decomposition of the electrolyte, which competes with the desired Faradaic half-cell reaction at the electrode surface, thus interfering with reversible lithium intercalation. Consequently, the SEI layer increases the internal resistance of the cell, resulting in reduced charging/discharging efficiency, power loss, operating temperature increase, and reduced battery life.

Designers of battery-based power systems utilizing multiple battery cells are concerned with over-exhaustion of energy stores of weaker cells and poor energy conversion efficiency. Because of these challenges, some techniques have been developed to manage charging and discharging to improve the capability and efficiency of the battery systems, such as active cell balancing. Although some progress has been made to improve the operation of energy storage systems with respect to the aforementioned issues, there remain difficult and complex challenges in the control of the storage and release of stored energy.

SUMMARY

One aspect of this disclosure is directed to facilitating charging different battery cells in the same string at different current levels, which in turn enables the use of battery cells at different state of charge (SoC) and state of health (SoH). This capability is applicable to a variety of battery-utilization and battery-charging applications. One such application is a battery-based an energy storage system for powering equipment, homes, buildings, or other consumers of electrical power who have traditionally taken power from a power grid. Other applications include energy storage for power generation facilities to provide increased capacity in peak periods, or during periods when renewable power sources are less available (e.g., at night or during dark/overcast weather conditions in the case of solar power, during periods of low wind or dangerously high winds in the case of wind power). Other applications include vehicles (e.g., road, rail, sea, air) that are battery-powered or hybrid-powered and thus carry batteries onboard. In some related applications, energy storage systems utilizing at least some of the disclosed techniques can effectively make use of second-life battery cells, which ended their prior service due to SoH. Certain implementations may achieve a comparable SoC among all cells and minimize SoH deterioration for those cells, thereby extending their service life. According to some embodiments, as detailed below, cells may be switched in and out based on their SoC or SoH. According to one aspect, all cells are maintained at a same SOH so that an entire rack of cells can be changed simultaneously.

A battery control system (BCS) according to one aspect is a portion of a storage system that can control the charging and discharging current of each individual battery cell based on its SoC and SoH. The BCS may be operated to maximize the cell's lifetime before it is no longer usable, even second-life battery cells.

According to one aspect of the embodiments, a battery control system, comprises a first plurality of switching circuits, each of the switching circuits of the first plurality of switching circuits including a respective high side switch, a respective low side switch and a respective battery cell, the high side switch selectively operable to couple a voltage of the respective battery cell into an accumulated voltage of the first plurality of switching circuits in an ON setting of the high side switch and the respective low side switch selectively operable to omit the voltage of the respective battery cell in the accumulated voltage of the first plurality of switching circuits in an ON setting of the low side switch. The system further comprises a first switching control circuit communicatively coupled to control the respective setting of the respective high side switch and the respective low side switch of each of the switching circuits of the first plurality of switching circuits.

According to a related aspect, a method of operating a battery control system includes receiving battery information of one or more battery cells from a multiplexing circuit by a battery control system controller; creating a sorted order based at least in part on each cell's virtual position in a serial string and the battery information by the optimization algorithm; executing a grid current control algorithm based on a charging/discharging power setpoint and grid voltage; outputting a control signal to control the one or more battery cells to satisfy a power/voltage requirement; comparing the control signal with all battery cell information to generate a switch setting for each of the one or more battery cells; and transmitting the switch setting for each of the one or more battery cells to the switching circuit.

In a related aspect, a battery control system, includes a plurality of battery cells arranged as a plurality of controllable units, with each controllable unit including at least one of the battery cells of the plurality. Switching circuitry is coupled to the plurality of battery cells, and arranged to facilitate individualized control of each of the controllable units, wherein the individualized control includes selective activation/deactivation of each controllable unit within an aggregation of battery cells. Sensing circuitry is arranged at each controllable unit to measure conditions of at least one battery cell of that controllable unit. Further, controller circuitry is operatively coupled to the switching circuitry and to the sensing circuitry, and is operative to read the sensing circuitry and to cause the switching circuitry to dynamically activate and deactivate the controllable units within the aggregation of battery cells based on the individualized control according to battery-management instructions.

The battery management instructions, when executed, cause the controller circuitry to estimate a state of each controllable unit based on the measured conditions of the at least one battery cell in that controllable unit, wherein the estimated state is indicative of a performance capability of that controllable unit, determine a hierarchy of the plurality of controllable units, the hierarchy being based on the respective states of the controllable units, perform the individualized control based on the hierarchy such that a respective position of each of the controllable units within the hierarchy is used to set a duration of the activation of that controllable unit within the aggregation of battery cells, adjust ordering of the hierarchy in response to changes in the estimated states of one or more of the controllable units, and adjust ordering of the hierarchy in response to operational history of one or more of the controllable units regardless of any changes in the estimated states of those controllable units.

In another related aspect, an energy storage system includes a set of battery control systems (BCS's), with each BCS comprising a plurality of battery cells arranged as a plurality of controllable units, wherein each controllable unit includes at least one of the battery cells of the plurality, and switching circuitry coupled to the plurality of battery cells, and arranged to facilitate individualized control of each of the controllable units. The individualized control includes selective activation/deactivation of each controllable unit within an aggregation of battery cells. Sensing circuitry is arranged at each controllable unit to measure conditions of at least one battery cell of that controllable unit, and a system controller is operatively coupled to the switching circuitry and to the sensing circuitry, and operative to estimate an energy storage level of each BCS of the set, and adjust a relative rate of charging and a relative rate of discharging of battery cells among the set of BCS's based on the estimated energy levels.

A method for operating a battery control system according to another related aspect of the embodiments includes measuring conditions of at least one battery cell of each controllable unit, estimating a state of each controllable unit based on the measured conditions of the at least one battery cell in that controllable unit where the estimated state is indicative of a performance capability of that controllable unit, determining a hierarchy of the plurality of controllable units, the hierarchy being based on the respective states of the controllable units, dynamically activating and deactivating individual ones of the controllable units based on the hierarchy such that a respective position of each of the controllable units within the hierarchy is used to set a duration of the activation of that controllable unit, adjusting ordering of the hierarchy in response to changes in the estimated states of one or more of the controllable units, and adjusting the ordering of the hierarchy in response to operational history of one or more of the controllable units regardless of any changes in the estimated states of those controllable units.

In another aspect, A method for operating an energy storage system is disclosed which includes providing a set of battery control systems (BCS's), each BCS having a plurality of battery cells arranged as a plurality of controllable units, wherein each controllable unit includes at least one of the battery cells of the plurality; performing individualized control of each of the controllable units, wherein the individualized control includes selective activation/deactivation of each controllable unit within an aggregation of battery cells; measuring conditions of at least one battery cell of each controllable unit; estimating an energy storage level of each BCS of the set; and adjusting a relative rate of charging and a relative rate of discharging of battery cells among the set of BCS's based on the estimated energy levels.

Further aspects are disclosed which are directed to instructions contained on one or more non-transitory machine-readable storage medium which are executable by a controller of an energy-storage system to facilitate operation of the system in accordance with various aspects described herein.

BRIEF DESCRIPTION OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc.

Reference throughout this specification to "an embodiment", "one embodiment", "one implementation", "one aspect", or "an implementation" means that a particular feature, structure or characteristic described in connection with the implementation is included in at least one implementation. Thus, the appearances of the phrases "in one implementation", "in an implementation", "in one aspect", "in an example", "in an embodiment", or the like, in various places throughout this specification are not necessarily all referring to the same implementation. Furthermore, the particular features, structures, or characteristics may be combined in any suitable manner in one or more implementations.

Unless the context requires otherwise, throughout the specification and claims that follow, the word "comprising" or "comprises" is synonymous with "including" or "includes" and is inclusive or open-ended (i.e., does not exclude additional, unrecited elements or method acts).

As used in this specification and the appended claims, the singular forms "a," "an," and "the" include plural referents unless the content clearly dictates otherwise. It should also be noted that the term "or" is generally employed in its inclusive-or sense (i.e., "and/or"), unless an exclusive-or interpretation is expressly and unambiguously set forth.

The headings and Abstract of the Disclosure provided herein are for convenience only and do not interpret the scope or meaning of the embodiments.

System Overview

Figure 1A:
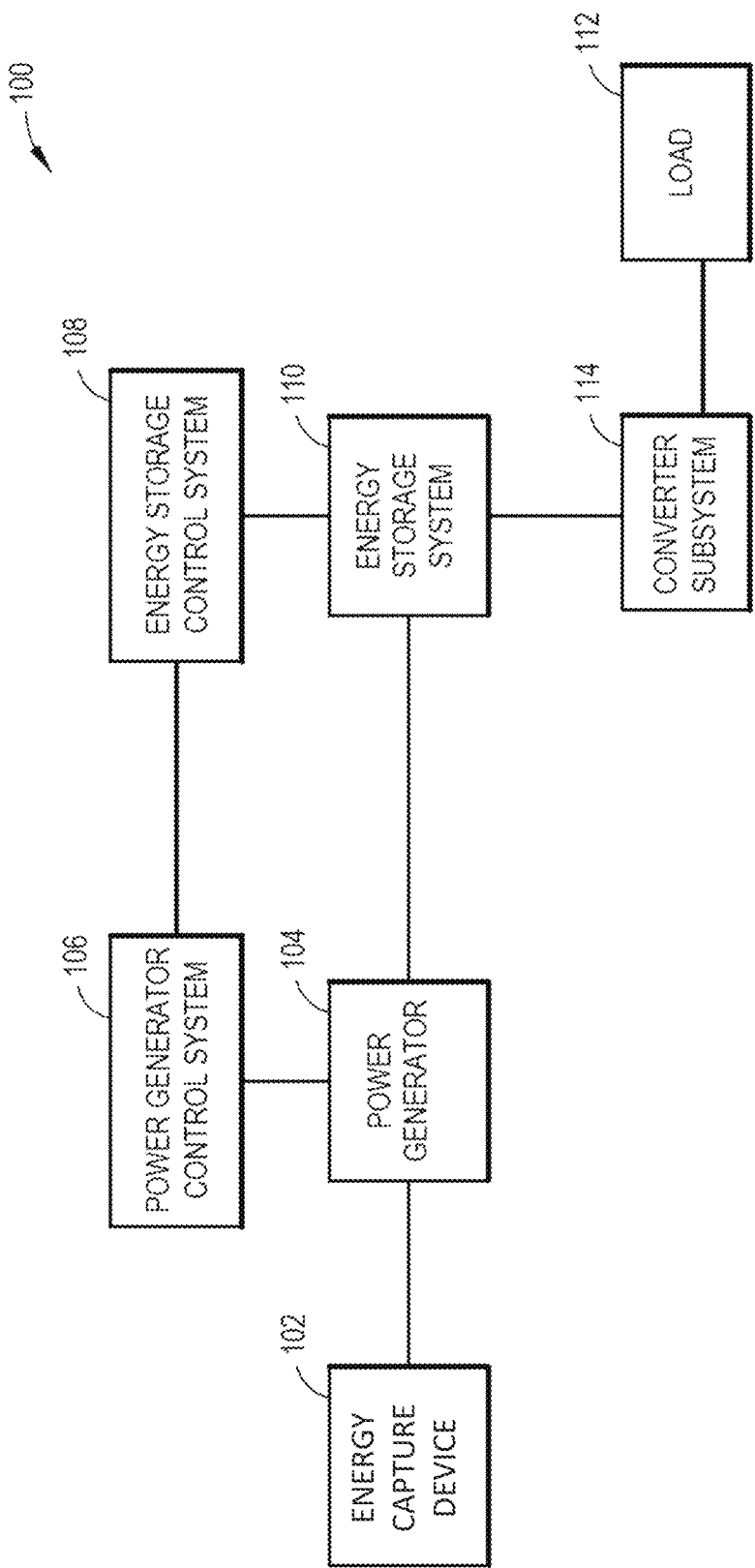
FIG. 1A is a block diagram illustrating a system in which electrical power is generated and stored in a plurality of battery cells according to one or more implementations.

FIG. 1A is a block diagram illustrating a system 100 in which electrical power is generated and stored in a plurality of battery cells according to one or more implementations. The system 100 includes an energy-capture device 102, a power generator 104, a power generator control system 106, an energy storage system 110, an energy storage control system 108, and a load 112.

The energy-capture device 102 may be a mechanical energy source, such as a turbine or other rotational element that, as a result of being rotated, provides mechanical energy via corresponding rotation of a rotor or shaft to the power generator 104. The power generator 104 includes a stator generating electrical power as a result of the mechanical energy received from the mechanical energy-capture device 102. Relative operation of the mechanical energy-capture device 102 and the power generator 104 is described in U.S. Pat. No. 8,878,373, which is incorporated herein by reference.

In related embodiments, the energy-capture device 102 and power generator 104 may be integrated as a singular system. For example, in some implementations, the energy-capture device 102 and power generator 104 may be a photovoltaic (i.e., solar) energy-capture system, which receives solar energy, and produces an electrical power output.

As described in further detail, the power generator 104 includes a plurality of solid-state electronic modules that are operative to selectively output a power signal based on power output of the power generator 104.

Although the power generator control system 106 and the energy system control system 108 are described and depicted as being distinct control systems, the power generator control system 106 and the energy system control system 108 may be part of a single control system in at least some implementations that control the power generator 104 and energy storage system 110.

The power generator control system 106 is communicatively and electrically coupled to the power generator 104 to control power output therefrom. In particular, the power generator control system 106 is electrically communicatively coupled to controllers of the solid-state electronic modules of the power generator 104 via an interface to control the output of the solid-state electronic modules. In at least some implementations, the power generator control system 106 may interact with the solid-state electronic modules to change a topology configuration of the solid-state electronic modules. The topology configuration refers to the relative arrangement of components of the solid-state electronic modules. Modifying the topology configuration changes the current and voltage characteristics of output power waveform generated by the solid-state electronic modules.

The energy storage system 110 comprises a plurality of battery cells, and switches that are operable to selectively control the charging and discharging of individual battery cells or commonly-controllable groups of battery cells as individually-controllable units. For the sake of brevity, the individual battery cells in the present description represent individually controllable units (e.g., which are switchable into, or bypassed, in the greater battery circuit composed of a combination of switchable units). It should be understood that, in the present context, each mention of a "cell," "battery cell" or "individual battery cell" refers to an individually-controllable unit of one or more physical cells, unless a different meaning is expressly set forth.

A switch may be associated with each battery cell in some implementations that is operable to selectively connect the battery cell with one or more terminals of other battery cells to organize sets of battery cells into a desired topology for charging or discharging the battery cells. Using the switches, the battery cells may be selectively engaged with, or disengaged from, each other, selectively engaged with or disengaged from input of the energy storage system 110, or selectively engaged with or disengaged from output of the energy storage system 110. In some implementations, the switches include one or more solid-state switches, such as metal-oxide-semiconductor field-effect transistors (MOSFETs), bipolar junction transistors (BJTs), insulated-gated bipolar junction transistors (IGBT), thyristors (e.g., silicon controlled rectifiers), diodes, triodes, or the like. In some implementations, the switches may also include electromechanical switches, such as multi-throw switches, contactors, or relay switches.

The topology of a set of battery cells may be dynamically reconfigured to achieve the desired waveform of output voltage or output current capacity based on charging or discharge characteristics of the battery cells, and on the state-of-health of the battery cells.

The energy storage control system 108 may determine a state associated with each of the battery cells or with sets of the battery cells. The state may be indicative of a charging capability of the cell—for instance, the rate at which the cell is currently capable of charging or with the charge capacity of the cell; or a discharging capability of the cell, such as the rate at which the cell is able to discharge or the capacity of the cell to discharge. In other examples, a state of health (SOH) measure may be determined based on one or more indicia. For instance: the internal resistance, capacity, nominal voltage at full charge, the voltage under load, rate of self-discharge, the ability to accept a charge, the number of charge-discharge cycles of the cell, the age of the cell, the temperature of the cell during its previous use, or the total energy charged and discharged. The energy storage system 110 may include one or more monitoring systems that monitor these, or other, properties or states of each of the battery cells to determine their performance or SOH over time. For instance, additional monitored conditions may include instances in which individual battery cells have been overcharged or undercharged, or instances when the battery cells have experienced potentially damaging conditions, such as temperatures exceeding recommended temperature ranges for the battery cells.

The monitoring systems may communicate with the energy storage control system 108, which may computationally determine information related to the SoC, performance, or SoH of the battery cells, and use the information in connection with how to determine topology configurations of the battery cells for charging or discharging. For instance, the energy storage control system 108 may store data related to the performance or health of the battery cells in memory of the control system 108, and prioritize charging or discharging of certain cells having better performance or health characteristics. Certain cells exhibiting lower quality health or performance may be disengaged from other battery cells and flagged for investigation, maintenance, or replacement. The monitoring systems may be connected with current, voltage, temperature, or other sensors, connected to the battery cells or terminals thereof for determining performance or health information thereof. For instance, the voltage measured across terminals of a battery cell may be compared with the current flow to and from the battery cell to determine the internal resistance of the cell, or the voltage may be compared with an expected voltage measurement to determine the SOH of the battery cell. In other examples, usage indicia associated with each battery cell may be maintained in non-volatile memory. The usage indicia may include one or more indicators such as: a counter for charging or discharging cycles, a counter of excessive-temperature events that is incremented when the measured temperature of the cell exceeds a defined threshold, a counter of excessive-current events that is incremented when a measured charging or discharging current exceeds a corresponding threshold, a timer that measures the duration of when a cell is discharged below a defined threshold or in an over-temperature or over-current events, or the like.

The energy storage system 110 may further include one or more power conditioners that modify characteristics of power provided from the battery cells. For instance, the one or more power conditioners may convert direct current (DC) from a battery cell or set of battery cells into alternating current (AC) having a determined set of electrical characteristics based on loading conditions associated with the load 112. The electrical characteristics include current capacity, voltage level, and frequency of the alternating current produced.

The system 100 may include a converter subsystem 114 that selectively provides power from the power generator 104 or the energy storage system 110 to the load 112. The converter subsystem 114 may include a set of power converters that can convert DC provided from the energy storage system 110 into alternating current to be provided to the load 112. The converter subsystem 114 may also include a second set of converters to convert power supplied from the power generator 104 into a different form for provisioning to the load 112. The first and second sets of power converters of the converter subsystem 114 may operate in concert with one another to provide the desired output—for instance, the first set of power converters may convert DC from the energy storage system 110 into AC having a set of desired electrical characteristics (e.g., frequency, current capacity, voltage level, phase) and the second set of power converters may convert AC or DC from the power generator 104 into AC having the same set of desired electrical characteristics. The power converters may include a set of electronic switching components, as described in U.S. Pat. No. 8,878,373.

The converter subsystem 114 may be controlled by a control system in communication with the energy storage control system 108 and the power generator control system 106. The control system controlling the converter subsystem 114 may obtain information regarding power requirements of the load 112 or expected power requirements of the load 112 and interact with the energy storage control system 108 and the power generator 104 to determine how to satisfy the power requirements or expected power requirements. The control system controlling the converter subsystem 114 may be part of a control system that includes the power generator control system 106 or the energy storage control system 108. In such implementations, the larger control subsystem may be part of an integrated system that generates electrical power, stores electrical power (i.e., in the energy storage system 110), determines power requirements of the load 112, and interacts with the constituent parts of the system to optimize performance of the system.

Each control system 106, 108, (as well as any other control system or "controller" described herein) may include a digital controller that includes one or more processing devices (e.g., microprocessor core(s)), random-access memory, non-volatile data storage, input/output circuitry, and system-interconnect circuitry, arranged according to a suitable architecture. The respective control system's circuitry may be implemented as a microcontroller system with in which these components are integrated as a singular packaged integrated circuit (IC) or provided as a chipset. Notably, the non-volatile data storage contains instructions executable by the microprocessor core(s) that, when executed, transform the control circuitry into a special-purpose controller that implements one or more control algorithms, portions of which are described below.

In related embodiments, one or both of the control systems 106, 108 may be distributed over multiple devices, each having respective processor circuitry and instructions which carry out a respective portion of that control system's algorithm(s). For example, consistent with some of the embodiments described below, the energy storage control system 108 may be implemented with a first portion executing on a processor of the polarity inverter 152 (FIG. 1B), while other portions are executing at each of the multiplexing circuits 204 (FIGS. 3-6).

Battery Control System Embodiments

Figure 1B:
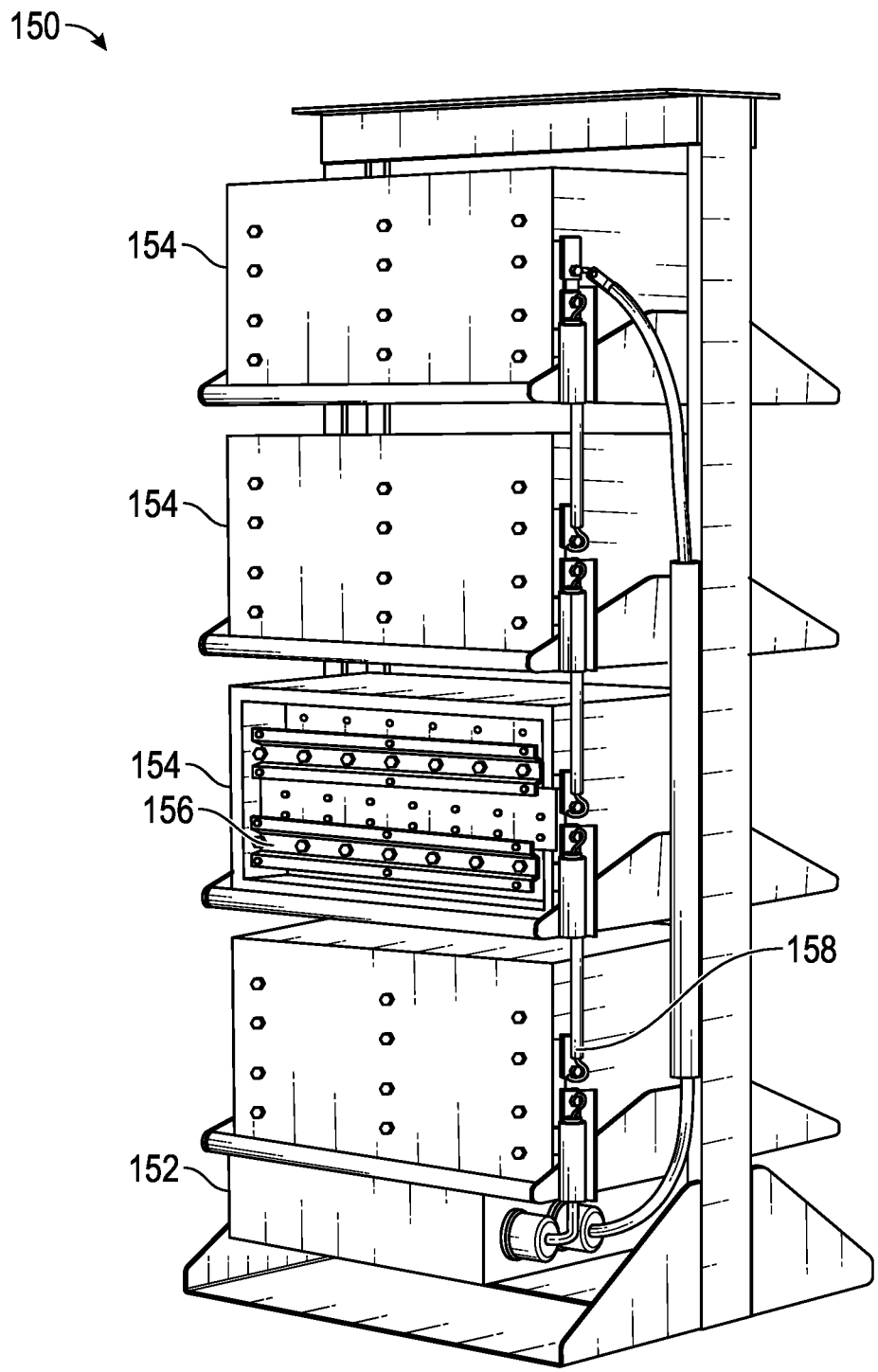
FIG. 1B is a diagram illustrating overall hardware architecture for a battery control system (BCS) as an example of the system of FIG. 1A, according to one type of embodiment.

FIG. 1B is a diagram illustrating an example of an overall hardware architecture for a battery control system (BCS) 150 according to an embodiment. BCS 150 is an implementation of energy storage system 110, energy storage control system 108, and converter subsystem 114. According to one aspect, the BCS 150 includes an energy storage system 110 that can control the charging and discharging current of each individual battery cell based on its SoC and SOH. Such control of the charging and discharging current of each individual battery cell may maximize each cell's lifetime before it becomes no longer usable. As an example, described in greater detail below, the BCS 150 may implement an optimization algorithm to select which battery cell should be charged or discharged at a certain time or at a certain current level in order to balance the overall usage of the battery cells and maximize their individual lifetimes.

The BCS 150 can be constructed in single phase or multi-phase system. Each phase comprises an inverter 152, which is an implementation of the converter subsystem 114, and n battery racks 154, with each rack containing m battery cells 156, making the system contain a total of n×m battery cells. A controller or multiplexing control circuit may be provided on each rack to control the battery cell switching operation and to communicate with the inverter 152 by suitable communication protocol. In addition, there may be an additional controller or inverter control circuit as part of the inverter 152, which may provide overall coordination of the components of BCS 150 and to provide an interface accessible to authorized users such as system administrators.

A wire harness system 158 provides electrical interconnection between all battery racks 154 and the inverter 152.

Figure 2:
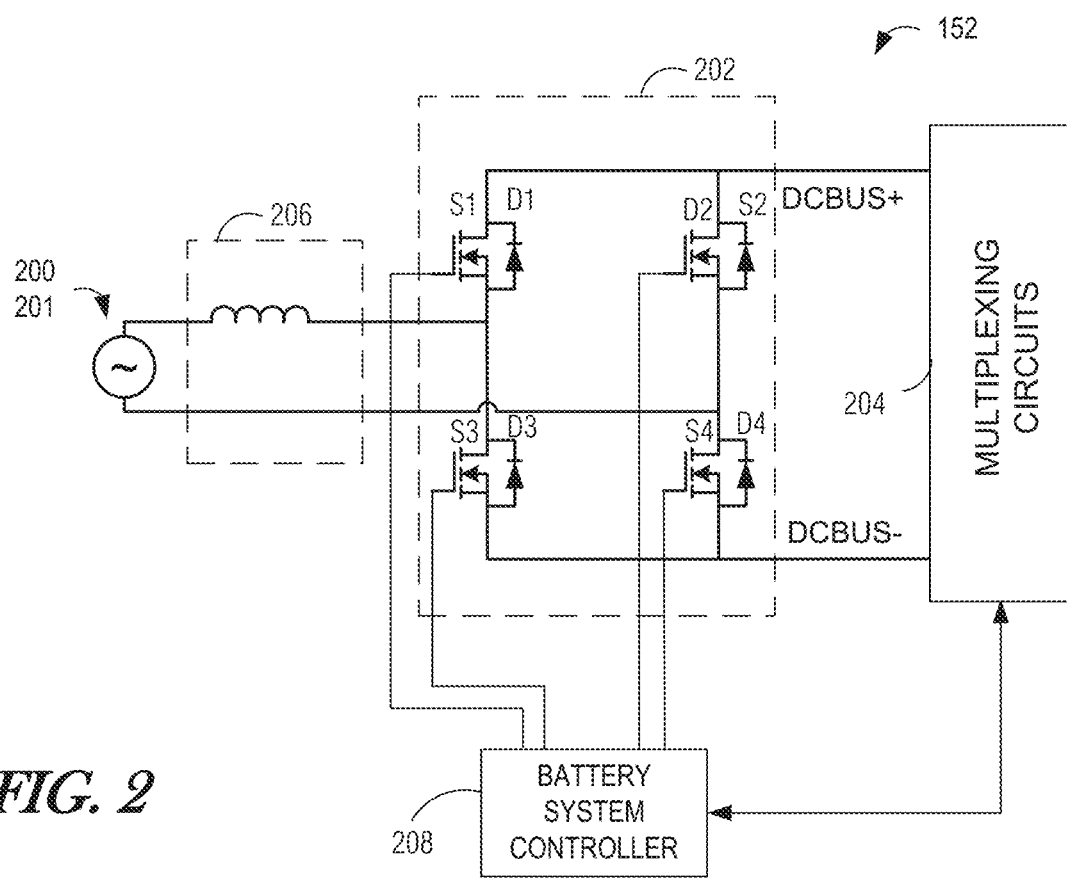
FIG. 2 is a simplified schematic diagram illustrating a portion of a polarity inverter of the BCS of FIG. 1B according to an example.

FIG. 2 is a simplified schematic diagram illustrating a portion of inverter 152 according to an example. The inverter 152 may work to transfer power from a power source to charge battery cells 156, or to discharge battery cells 156 into a load. The circuit includes a full H-bridge and full-wave rectifier topology 202. The input or output of the circuit, respectively, is connected to an energy source or load 200, 201. The energy source or load 200, 201 may be an electrical grid which at one time can supply power to the BCS 150, and at another time, draw power from BCS 150, through filtering components 206. Terminals DCBUS+ and DCBUS− are coupled to multiplexing circuits 204.

The switching elements S1-S4 are may each be implemented with one or more semiconductor switching devices of a type as discussed above. The diodes D1-D4 may be implemented with discrete components or they may be integral to their respective switching elements S1-S4.

The H-bridge arrangement of the switching elements S1-S4 is used to provide alternating current from the unidirectional current output from the battery cells of the BCS 150.

The inverter 152 rectifies the negative grid voltage to a positive voltage to connect with the battery cells 156 via the multiplexing circuits 204. In this function, the switching frequency may be twice the grid frequency, resulting in negligible switching loss, which is typically a significant loss in a regular switching mode inverter.

In the example depicted, the inverter 152 includes a battery system controller 208 (which is an implementation of the energy storage control system 108). The battery system controller 208 is arranged, as shown, to control each of the switching elements S1-S4. In addition, the battery system controller 208 may be interfaced with the multiplexing circuits 204 to read sensed conditions and other battery cell information, and to command the switching of battery cells. To this end, the multiplexing circuits 204 may include communication circuitry (e.g., a microcontroller that includes a universal asynchronous receiver transmitter (UART), amplification/line-driver circuitry) to implement the physical layer and protocol stack, as appropriate.

The inverter 152 may also regulate or provision the charging or load current. In some embodiments, following a setpoint provided by an external controller, discussed below, to charge or discharge battery cells.

Figure 3:
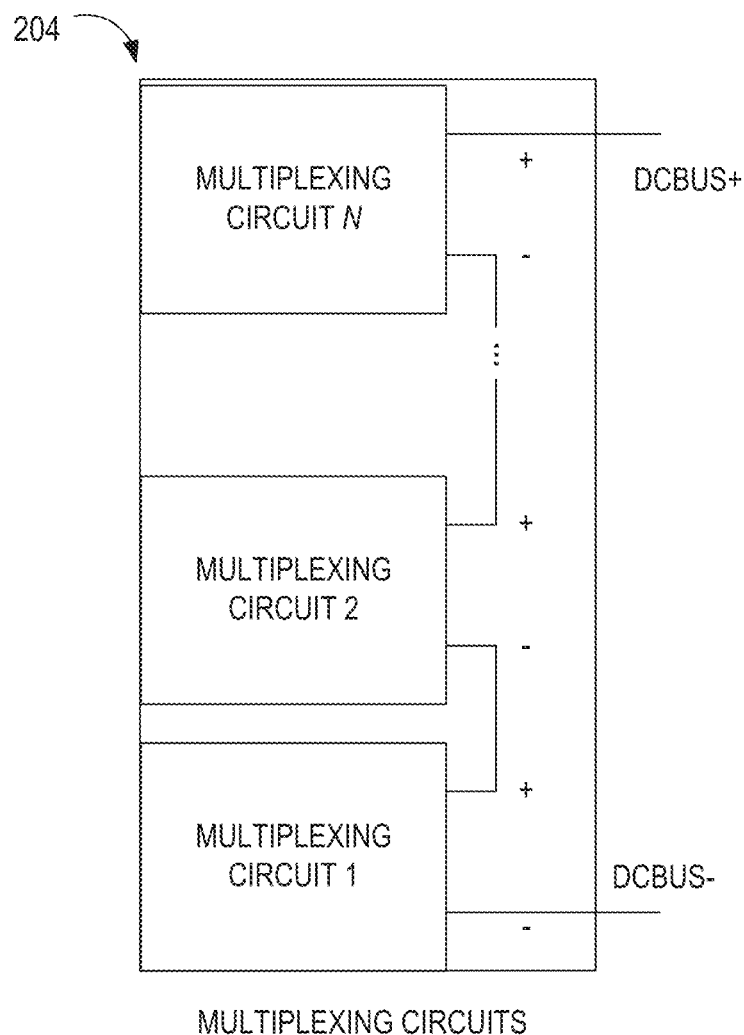
FIG. 3 is block diagram illustrating a multiplexing circuit of the BCS of FIG. 1B according to an example.
Figure 4:
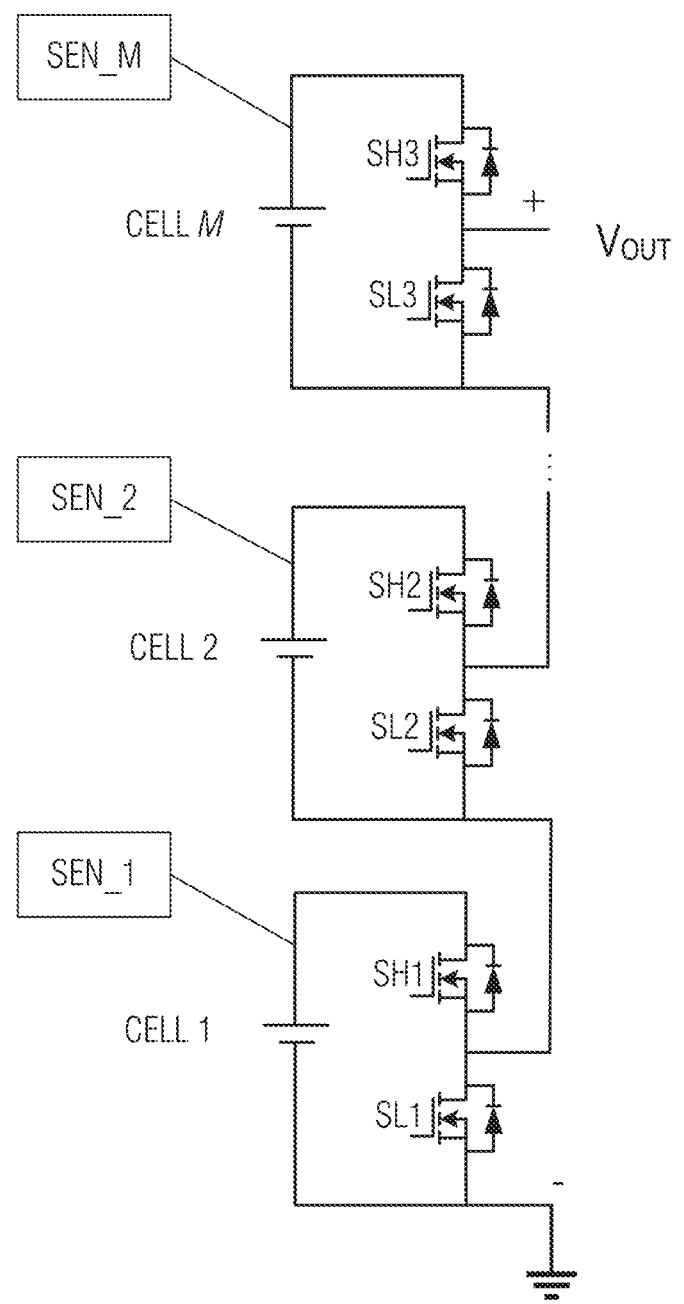
FIG. 4 is a simplified circuit diagram illustrating a portion of the multiplexing circuitry of FIG. 3 in greater detail according to one example.

The multiplexing circuits 204 contain individual circuits, which may be arranged according to one example, as illustrated in FIG. 3. Each one of the individual multiplexing circuits 1, 2, ..., N controls one or more battery cells. FIG. 4 illustrates multiplexing circuitry according to one example in greater detail. Each battery cell is a voltage source of a half bridge, which can be connected or disconnected from the overall circuit by turning on one of the two switching devices SL, SH. For instance, when the high side device SH is on, the battery cell is connected to the serial output voltage. The Cell is bypassed when the low side device SL is on. According to some implementations, the two switching devices SL, SH work complementarily with a deadtime. The deadtime may be provided so that both devices are off to avoid current shoot-through damaging the switching devices and potentially affecting the battery cell. The control signaling for each switching device SL, SH may be provided by battery system controller 208 (or other implementation of the energy storage control system 108).

As shown in the example of FIG. 4, each multiplexing circuit switches its corresponding cell 1, 2, ..., M (referred to generally as cell n) in and out of the overall circuit using two switches, high-side switch SHn and low-side switch SLn. For each cell n, either SHn or SLn is on at any given time. When SHn is on and SLn is off cell n is in the circuit. Alternatively, when SHn is off and SLn is on cell n is bypassed. As each switch SHn, SLn is switched to be included or omitted from the aggregated circuit, the overall output voltage Vout is varied. As the multiplexer rate changes the output frequency changes.

The multiplexing circuit includes one or more sensors SEN_1, SEN_2, ..., SEN_M that are arranged to monitor one of more of cell voltage, cell current, and cell temperature. The monitored condition(s) measured by the sensors are provided to the battery system controller 208 (or other controller which implements the energy storage control system 108). If any cell is experiencing an over-temperature, overvoltage, or overcurrent condition, the cell may be switched out of the circuit by the controller 108, 208. In addition, the SOH of the battery cell may be assessed using such measurements. Thus, global protection for each cell is provided. For example, if a cell experiences an over-temperature condition, that cell is switched off until it cools down and can be reintroduced into the overall circuit. In various implementations, the rest period is based at least in part on the voltage, current, or temperature of the cell. Thus, impedance for a given cell is reduced and the life of the given cell is prolonged.

Figure 5:
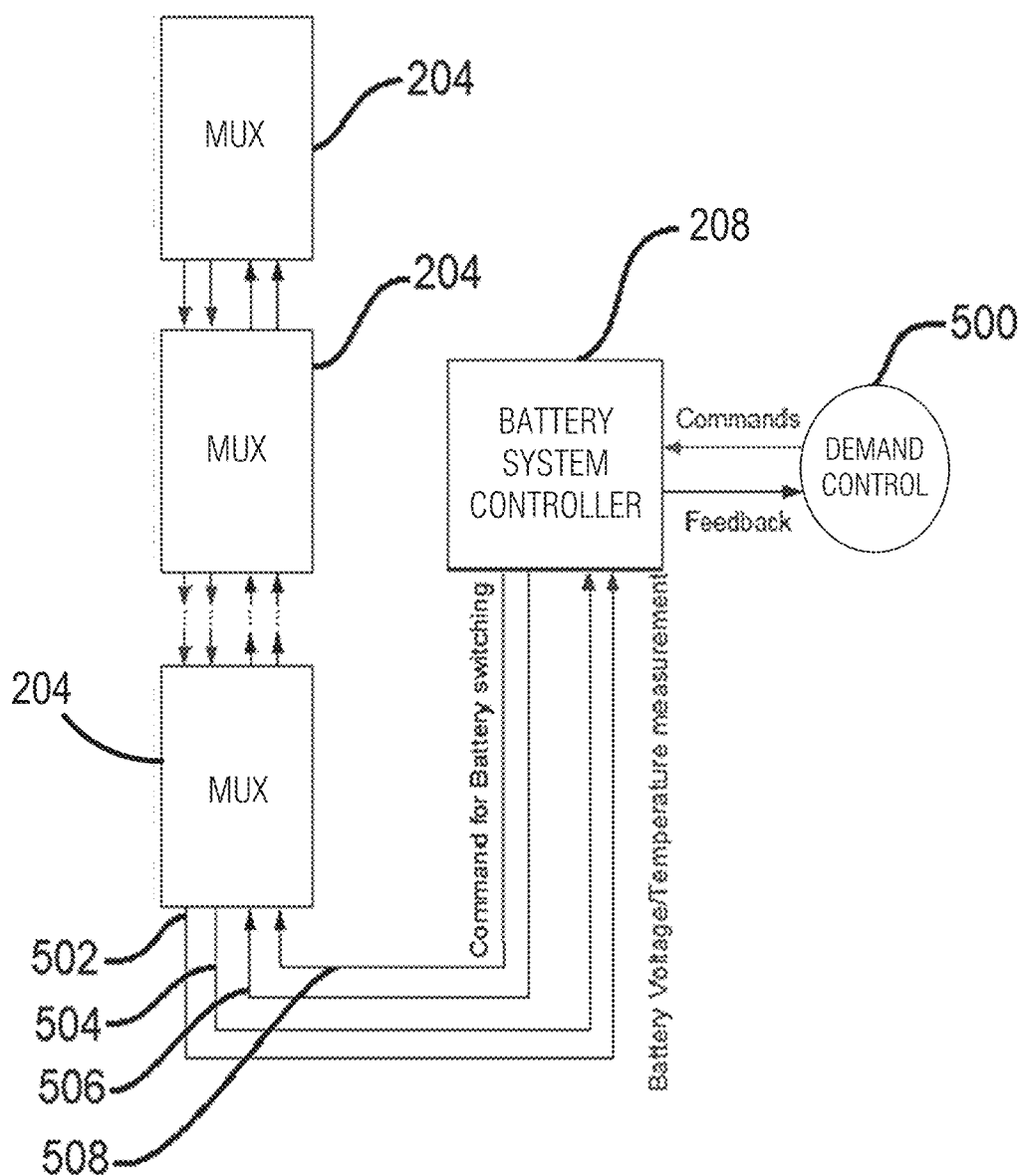
FIG. 5 is a is a system block diagram depicting a control signal arrangement of the BCS of FIG. 1B according to one embodiment.

Accordingly, the multiplexing circuit 204 has three main functions: switching to add or remove individually-controllable battery cells from the battery circuit, communication to send sensed measurements and receive control signaling from energy storage control system 108, and provide local protection for each cell, in similar fashion to the employment of the monitored conditions described above (which are communicated to the battery system controller 208), but this local protection can be implemented directly in the multiplexing circuit 204, without requiring communication between components. FIG. 5 is a is a system block diagram depicting a control signal arrangement according to one embodiment. An example of a communications arrangement is shown between multiplexing circuits (MUXs) 204, the battery system controller 208, and demand controller 500. Each multiplexing circuit 204 communicates with the battery system controller 208 to receive the battery cell switching commands from demand controller 500. In some implementations, the battery cell information, or overall battery system performance, SoC, SoH, or other power availability or capacity information (which is derived from the collective battery cell information of all of the monitored battery cells) may be provided to a demand controller 500. Demand controller 500 may a controller associated with the load, power grid, a control center, or other system that utilizes the BCS 150.

The user of demand controller 500, who may be a grid operator for example, issues commands and receives feedback from the battery system controller 208. The battery system controller 208 communicates with the multiplexing circuits 204 and implements control algorithms to coordinate the operation of multiplexing circuits 204.

According to one type of implementation, the battery system controller 208 sends messages to the multiplexing circuits 204 via a first type of communications interface (such as one or more serial busses 504, 506). The messages sent to the multiplexing circuits 204 include battery switching commands. The battery system controller 208 receives messages from the multiplexing circuits 204 via the first type of communications interface, or via a second type of communications interface (such as a controller area network (CAN) bus 502, 504). The messages sent from the multiplexing circuits 204 may include battery voltages, currents, temperature measurements, SoC, SoH, charging or discharging regimes, and the like. The first type or the second type of communications interfaces may be embodied as FLEXRAY, I$^2$C, universal serial bus (USB), an interface according to any of the IEEE 1394-family standards, an IEEE 802.3 (Ethernet) local area network, Fibre Channel (FC), a wireless network interface in accordance with a standard of the IEEE 802.11-family (WiFi) or the IEEE 802.15-family (WPAN/Bluetooth), or any other suitable communication method.

Figure 6:
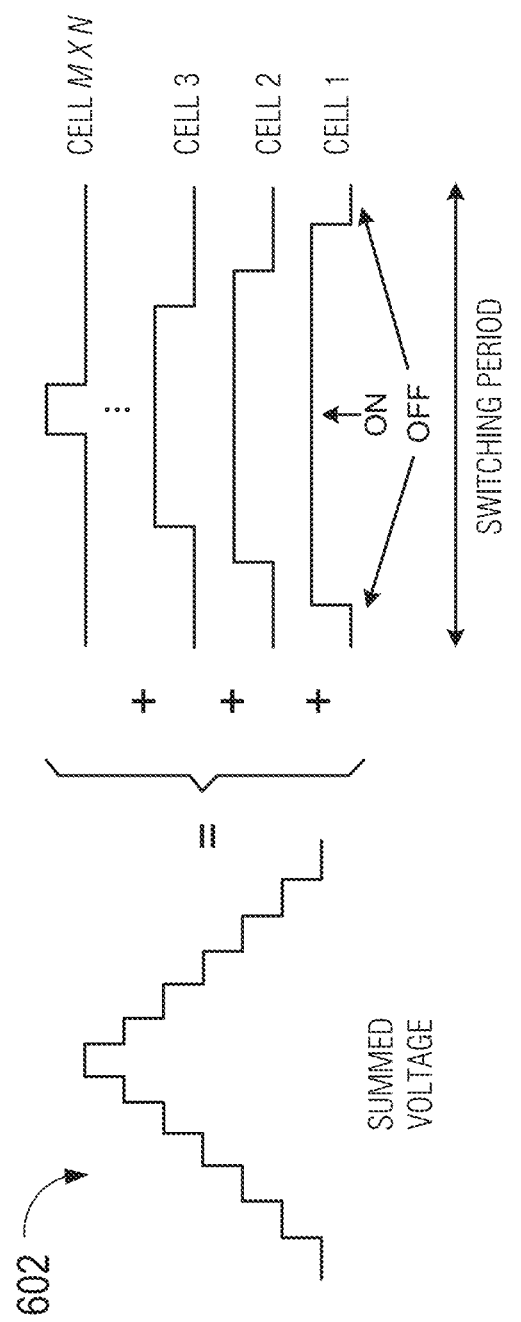
FIG. 6 is a diagram illustrating individual battery cells being switched into and out of the battery circuit according to an operational example of the BCS of FIG. 1B in which an aggregated voltage of the battery circuit has a periodic waveform.

FIG. 6 is a diagram illustrating individual battery cells being switched into and out of the battery circuit according to an operational example. The voltages of the individual battery cells are summed by the series connection of the multiplexing circuits 204. Utilizing timed switching, the individual battery cells, CELL 1, CELL 2, CELL 3, . . . , CELL M×N are either activated or bypassed at different times and for various durations to create a specific waveform. The illustrated waveform example as indicated at 602 is a voltage waveform that resembles a triangular waveform. In related embodiments, the voltage waveform is shaped in this manner to resemble a sinusoidal waveform, a square waveform, or other shape.

Figure 7:
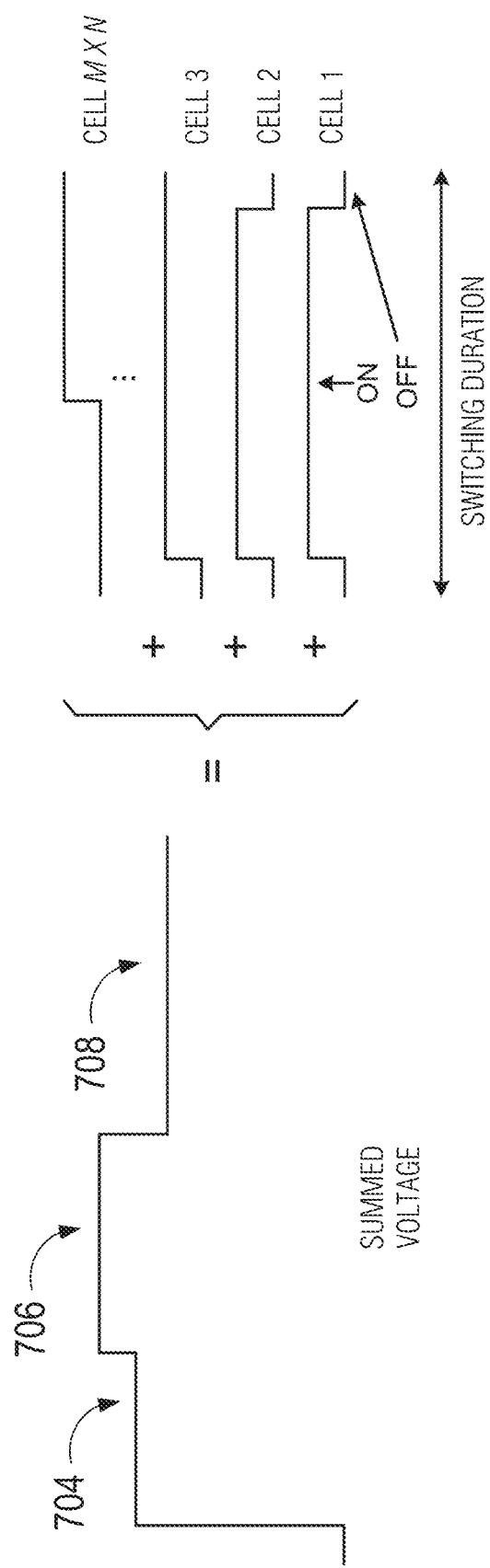
FIG. 7 is a related diagram illustrating individual battery cells being switched into and out of the battery circuit according to an operational example in which an aggregated voltage of the battery circuit is a time-varying DC voltage.

In a related embodiment, the battery cells CELL 1, CELL 2, CELL 3, . . . , CELL M×N may be switched to generate a time-varying DC voltage. FIG. 7 is a diagram illustrating an example of such a time-varying DC voltage. In this example, a group of battery cells are switched on to produce a first DC voltage 704. The DC voltage may be adjusted as called for by a controller, such as controller 208. For instance, additional cell(s) may be activated to produce a greater DC voltage 706. Subsequently, some activated cells may be bypassed to reduce the DC voltage to voltage 708. This example demonstrates that activation of the battery cells is not necessarily in accordance with a predefined waveform having a periodicity. Rather, a DC voltage may be maintained as a steady state, or it may be adjusted as called for by the operating regime of the BCS implemented by the controller.

Figure 8:
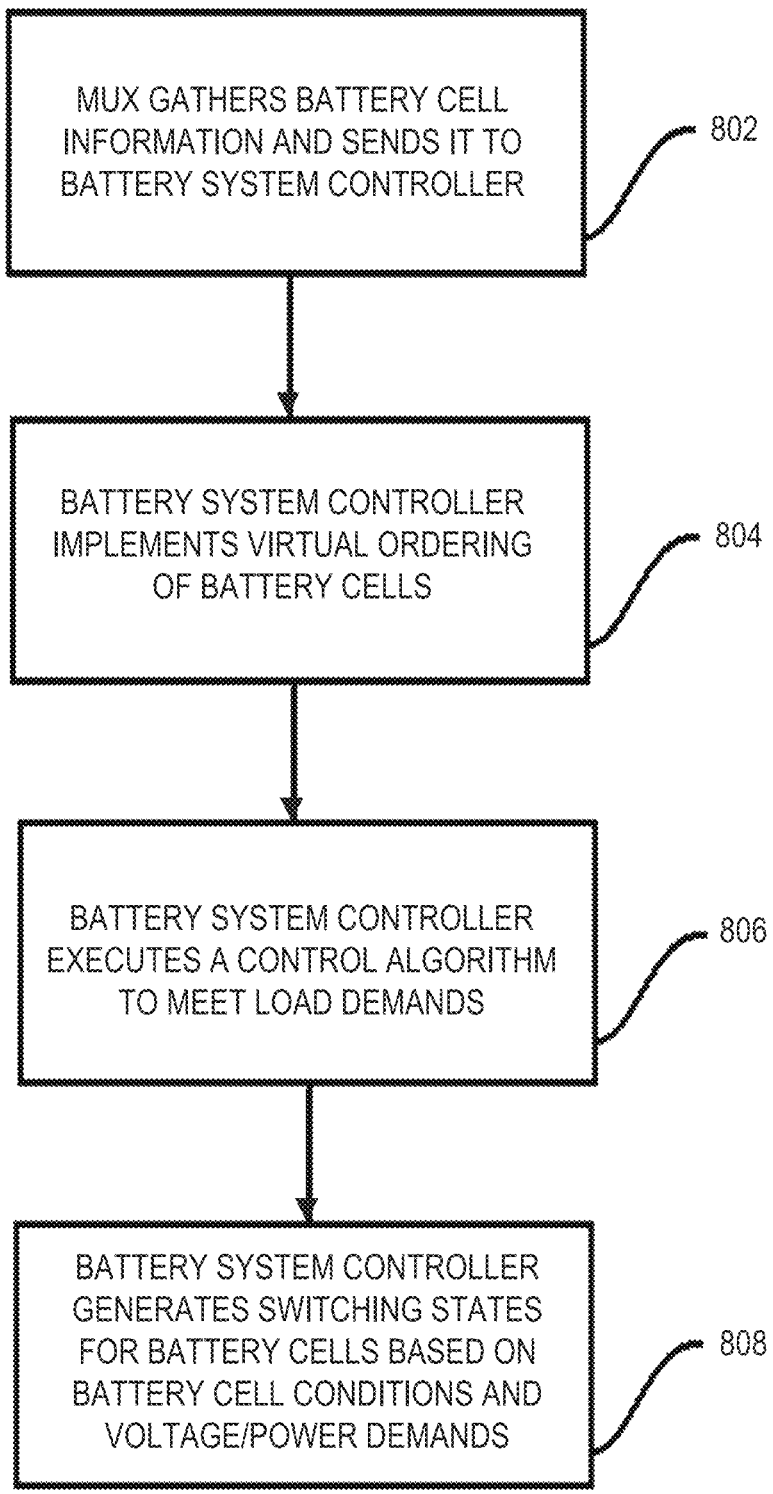
FIG. 8 is process flowchart illustrating operation of the BCS 150 of FIG. 1B according to some embodiments.

FIG. 8 is process flowchart illustrating operation of the BCS 150 according to some embodiments. At 802, the multiplexing circuits 204 collect battery cell information (e.g., voltage, current, temperature, or any other measurable quantity that is indicative of the SoC of SOH) using their respective sensors. The multiplexing circuits 204 transmit this battery cell information to the battery system controller 208, which may reside partially or entirely at the multiplexing circuits 204, inverter 152, a control center, or grid operator's system.

At 804, the battery system controller 208 implements a virtual ordering of battery cell voltage based on each cell's virtual positioning in a serial string defined by the optimization algorithm output. One example of virtual ordering of cells in the serial string is depicted in FIG. 6, where the virtual positions are represented by the reference designators BAT_1 through BAT_77.

At 806, the battery system controller 208 executes a control algorithm based on a charging/discharging power setpoint and, where applicable, the grid voltage. A control signal is output to control the battery cells to satisfy the power/voltage demand at the load. At 808, the battery system controller 208 compares the control signal with all battery cell voltages to generate a switch setting for each battery cell and then transmits these settings to the multiplexing circuits.

Figure 9:
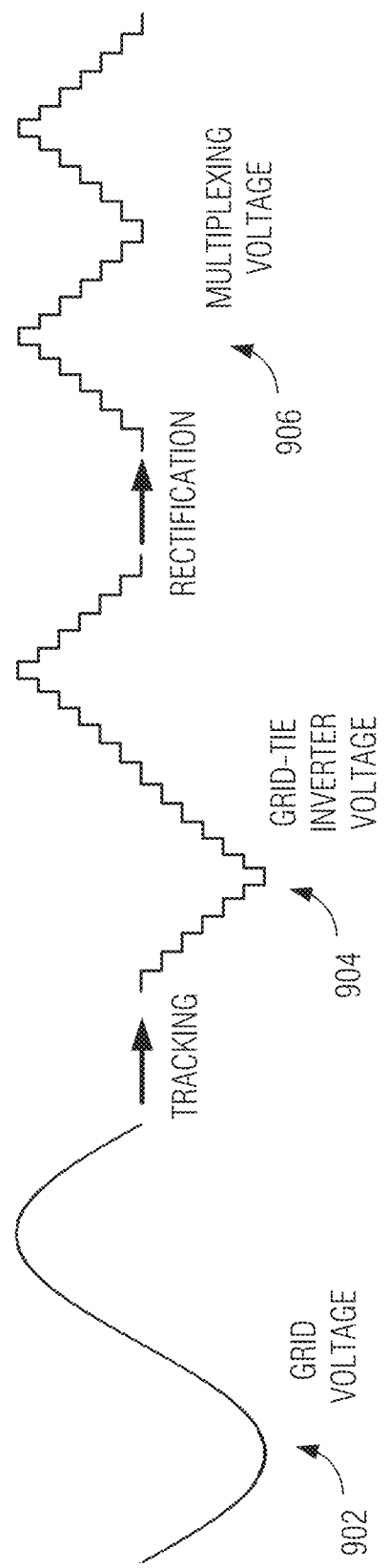
FIG. 9 is a diagram illustrating voltage waveforms at various nodes of the BCS of FIG. 1B according to an example use case.

FIG. 9 is a diagram illustrating voltage waveforms at various nodes of the BCS 150 during an example use case. In this example, the use case is a battery charging regime. As shown, grid voltage 902 is an AC voltage having a sinusoidal waveform.

Grid-tie voltage is produced by switching battery cells in and out of the greater battery circuit by the multiplexing circuits 204 to approximately track grid voltage 902. Adding and removing battery cells from the series combination creates a stepwise voltage waveform as shown. At any moment, when the overall voltage of the series-combination of battery cells producing grid-tie voltage 904 is lower than grid voltage 902, charging current flows from the power grid to the battery cells. The magnitude of the charging current is controllable by adjusting the combined voltage of the battery cells.

Multiplexing voltage 906 as shown is a rectified waveform as seen by the combination of battery cells. Notably, certain individual battery cells may be selectively connected to, or bypassed by, the charging current by switching those battery cells via the corresponding multiplexing circuits.

Figure 10A:
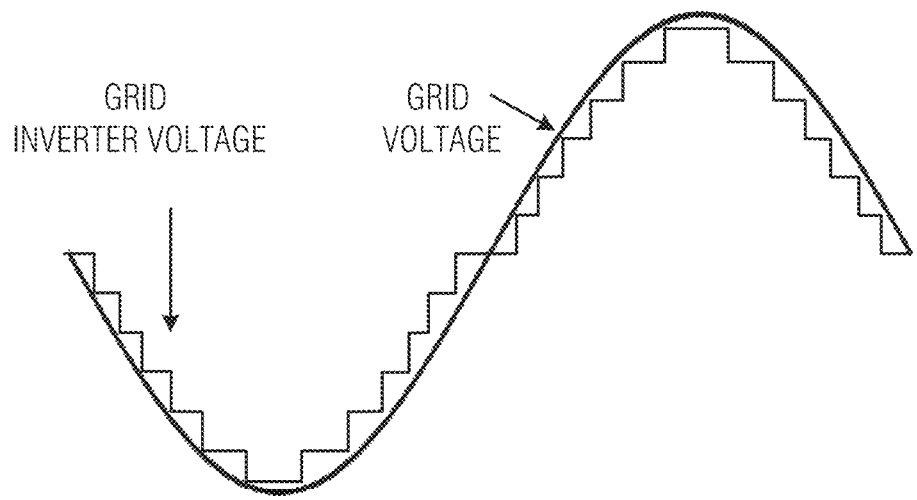
FIG. 10A is a diagram illustrating overlaid voltage waveforms of a grid inverter voltage and the voltage of an electrical grid according to an example.
Figure 10B:
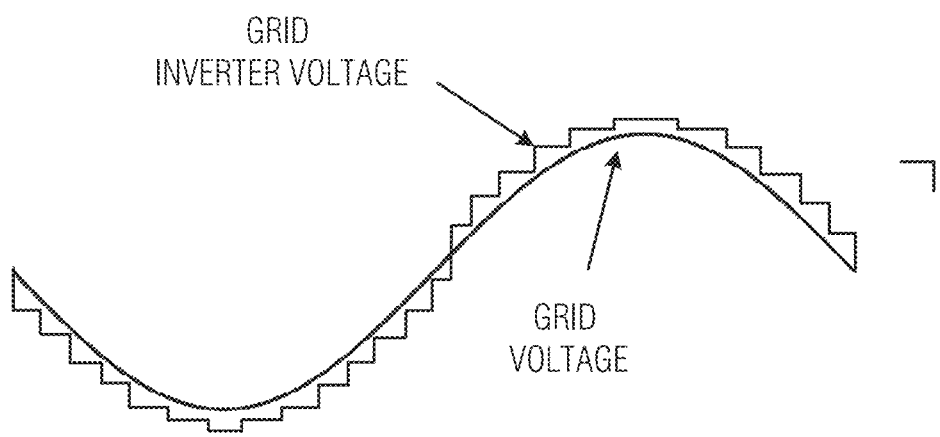
FIG. 10B is a similar diagram to FIG. 10A illustrating overlaid voltage waveforms of the grid inverter voltage and the grid voltage, in which the grid inverter voltage exceeds the grid voltage, resulting in power transfer from the battery cells to the grid according to another example.

FIG. 10A is a diagram illustrating overlaid voltage waveforms of the grid inverter voltage and the grid voltage. As shown, the stepwise grid inverter voltage waveform has a smaller amplitude than the grid voltage, which indicates that the BCS 150 is operating in its charging regime. FIG. 10B is a similar diagram illustrating overlaid voltage waveforms of the grid inverter voltage and the grid voltage, in which the grid inverter voltage exceeds the grid voltage, resulting in power transfer from the battery cells to the grid, which is consistent with operation of the BCS 150 in its discharging (power-supplying) regime.

In some embodiments, the battery cells and inverter 152 are switched at low frequency, for example, twice as grid frequency. This low switching frequency minimizes switching loss on the battery cells and the inverter switching devices. With a sufficient number of cells the multiplexed battery system can generate a voltage that is very close to the sinusoidal waveform of the grid voltage, which is to say, the waveform has low harmonic distortion and minimal harmonic content from the switching itself, therefore the inverter output filter is minimized, which leads to reducing cost and size. Further, because different battery cells in the same string are exposed to different on time durations during one half cycle of the grid voltage the cells can be selected such that they charged at different average current levels.

In related embodiments, the battery cells are used to produce a time-varying DC voltage with switching of the cells primarily done to adjust the aggregated voltage as needed, and to balance the utilization (aging) of the cells. Such implementations can further reduce the amount of switching and the associated switching losses. A DC system may be utilized with an AC grid voltage using inverter circuitry. A suitable inverter may produce the appropriate waveform in synchronization with the grid voltage waveform.

Figure 11:
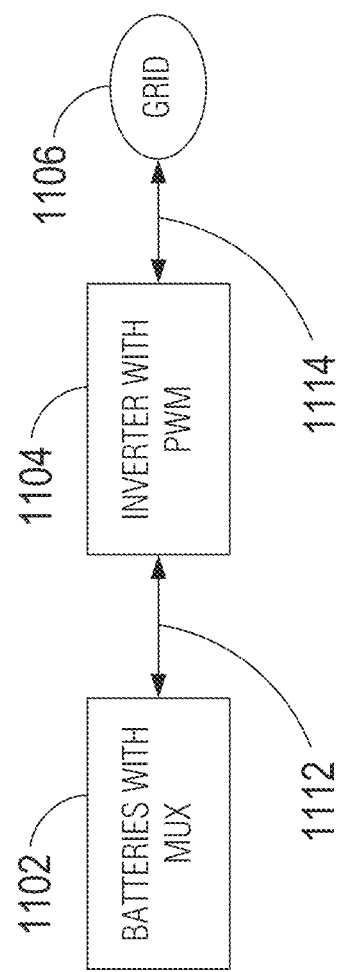
FIG. 11 is a block diagram illustrating an arrangement for interfacing a variable DC voltage battery system with an AC system such as an electrical grid according to various embodiments.

FIG. 11 is a block diagram illustrating an arrangement for interfacing a variable DC voltage battery system with an AC system such as an electrical grid according to various embodiments. As depicted, a switched battery system 1102 with a multiplexing circuit produces a variable DC voltage 1112. Inverter 1104 includes a voltage-waveform generating circuit such as a pulse width modulator (PWM). The nominal DC voltage is supplied by switched battery system 1102 as an input to inverter 1104. In turn, inverter 1104 converts the variable DC voltage into an AC waveform 1114 that is synchronized to the grid 1106. In related embodiments, the arrangement may operate in forward or reverse order, with power flowing from switched battery system 1102 to grid 1106, or from grid 1106 to switched battery system 1102.

In variations of the arrangement of FIG. 11, control of the power flow, whether in the forward direction or in the reverse direction, may be adjusted using either the aggregated voltage of switched battery system 1102, inverter 1104, or by a combination thereof. In one arrangement, the PWM of inverter 1104 may be controlled simply to track the AC voltage of grid 1106 and not to adjust the amplitude of AC waveform 1114 relative to the voltage of grid 1106. Instead, the switched battery system 1102 creates a suitable series or series-parallel combination of cells to supply the appropriate DC voltage level for the inverter operation in addition to optimizing the additional power source connecting to the DC bus. In another embodiment, inverter 1104 may be operated to regulate the produced AC waveform 1114 to control the amount of power flow. In yet another related embodiment, both, switched battery system 1102, and inverter 1104, may be operated in concert to control the direction of power flow and also to control the amount of power flow.

The disclosed system and method can therefore be utilized with battery cells at different SoC and SoH, and these battery cells may be rotated to rebalance the total utilization of the cells. In some embodiments, the disclosed system and method can be used in an energy storage system using second-life battery cells, which have been retired from their initial service due to a relatively low SoH.

According to one aspect, an advanced optimization algorithm is utilized to select which battery cell is charged and discharged at which current level to maximize its life individually or the whole string. This algorithm can be is based on a battery aging model including SOC and SOH estimation. Depending on a number of battery cells and algorithm complexity, it can be implemented in the microcontroller or inverter control circuit of the inverter, another computer, a central controller, or utilizing big data based computing.

Battery Cell Sorting

A related aspect of the disclosure is directed to controlling the individual cells (or individually-controllable groups of cells) of a BCS by prioritizing and scheduling the placement of those cells in circuit to achieve desired current profiles. Advantageously, in some scenarios, well-controlled charging and discharging current profiles may be useful to mitigate the formation of SEI. For instance, the use of pulsed current with a resting time, or the use of reversed current while charging or discharging battery cells, may help to reduce polarization and thickness of the SEI layer.

In some embodiments, the state indicia (e.g., SoC, SoH) of each of the battery cells is maintained in a data structure by the energy storage control system 108 or battery system controller 208. The data structure may be organized and stored as a table, an array, an ordered list, a database, or other suitable data structure.

Figure 12:
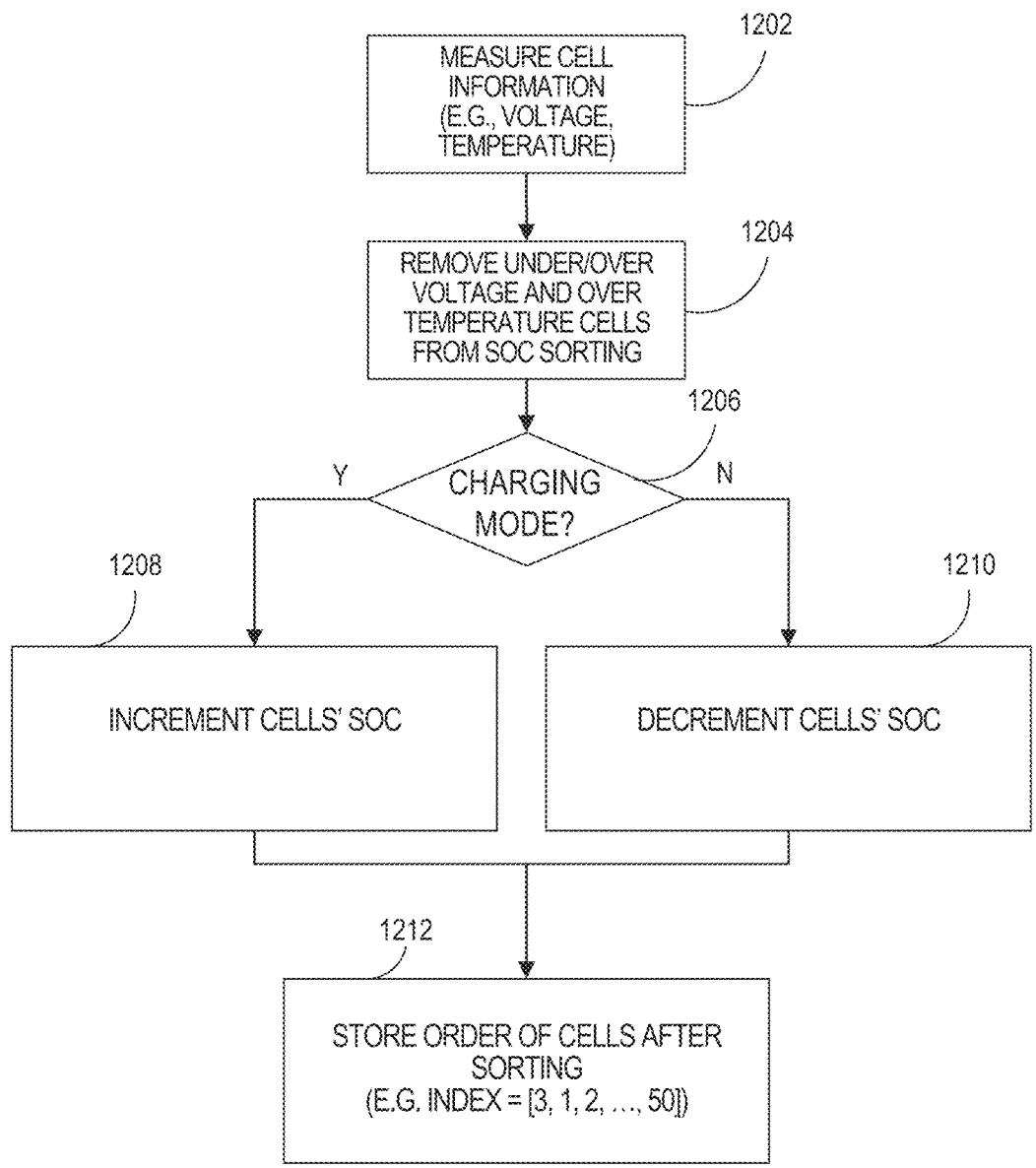
FIG. 12 is a flow diagram illustrating an example algorithm, which may be carried out by an energy storage control system for adjusting the state of charge (SoC) of individual battery cells or individually-controllable units of groups of cells.

Notably, the battery cells may be tagged, grouped, or sorted in the data structure according to their respective state indicia, such as SoC. FIG. 12 is a flow diagram illustrating an example algorithm, which may be carried out by energy storage control system 108 (e.g., battery system controller 208) for adjusting the SoC. The algorithm may be carried out for each cell. As depicted, the cell's information is measured at 1202. In one example, this measurement may be performed by local sensing as part of the multiplexing circuitry 204 as described above with reference to FIG. 4. The measurements may include voltage or temperature sensing.

At 1204, any out-of-range condition is determined. For instance, under- or overvoltage conditions, an over-temperature condition, or the like, where the measured quantity is compared against an upper range threshold and, where appropriate, a lower range threshold. If the out-of-range condition is found for a given cell, that cell may be omitted from SoC assessment, and it may be flagged for resting, further evaluation, or decommissioning, according to various embodiments.

Decision 1206 determines if the cell is in a charging or discharging regime. In the case where the cell is charging, the process branches to 1208, where the cell's SoC value is incremented. In the case where the cell is discharging, the cell's SoC is decremented at 1210. At 1212, the cell's sorting order may be determined based on the resulting SoC value for that cell, relative to the respective SoCs of the other cells in the battery system.

Figure 13:
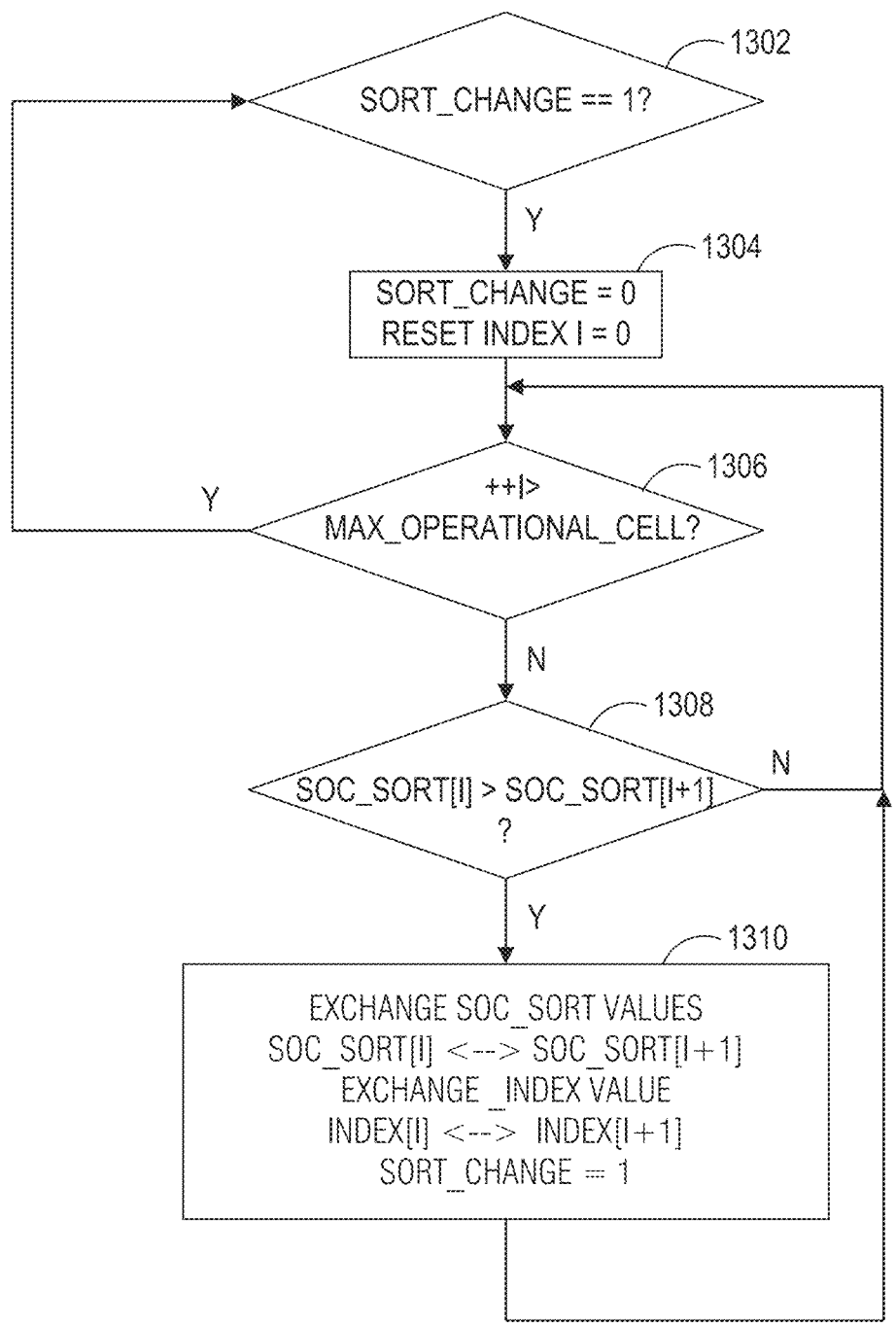
FIG. 13 is a flow diagram illustrating an example sorting algorithm that may be performed as part an operation of the algorithm of FIG. 12.

FIG. 13 is a flow diagram illustrating an example sorting algorithm that may be performed as part of operation 1208. The sorting algorithm uses an index, I, to iterate through the data structure of battery cells to place the cells in order according to their SoC. As depicted, the process begins at decision 1302 check if the SORT_CHANGE flag is set to 1 (meaning that the sorting process is not complete, i.e., ongoing). In the affirmative case, the process continues to 1304, where the SORT_CHANGE flag is set to 0, and index I is reset to 0.

Next, at decision 1306, a determination is made whether the index I is already at the maximum value among the operational cells. In the affirmative case, the process loops back to 1302. In the negative case (meaning that the index I is not at its maximum) the process continues to decision 1308, which tests whether the SoC of the present cell in question is greater than the SoC of the next-higher-indexed cell. In the negative case, there is no call for reordering these cells in the sort order of the data structure, and process iterates from decision 1306. In the case where the cell has a greater SoC than the next-highest-indexed cell in the sort order, the process advances to 1310, which exchanges the two compared cells. Also, the respective index values are swapped, and the SORT_CHANGE flag is set to 1. The process then iterates from decision 1306.

Once the sort ordering is updated, the battery cells may be more readily managed to balance their utilization. In one example, battery cells with relatively higher SoC than other cells are placed in-circuit for longer durations relative to those other cells having lower SoC when the BCS 150 is operating in its discharging regime. According to its position in the sorting order, the cell voltage is turned on/off by comparing with the present controller output.

Figure 14:
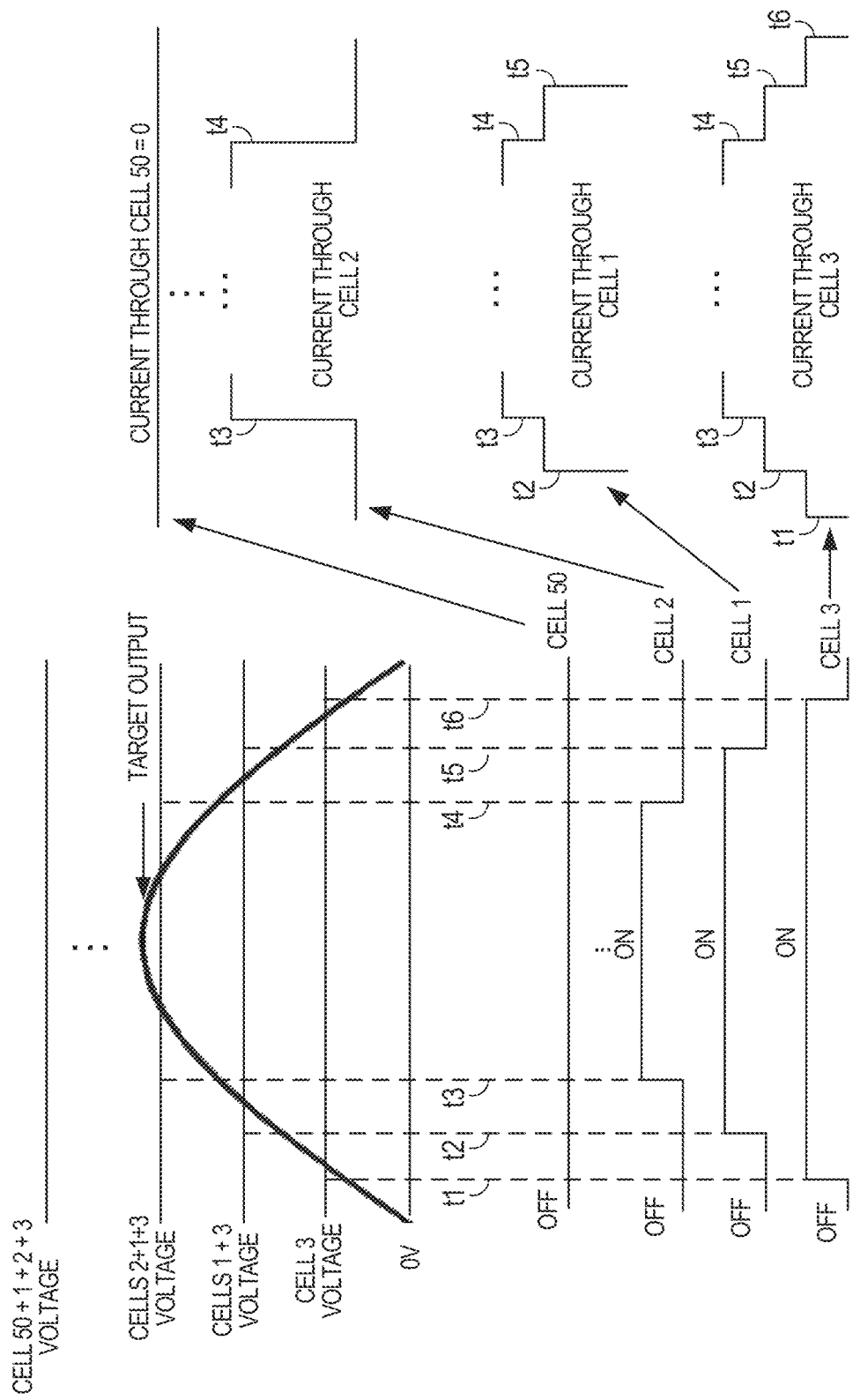
FIG. 14 is a timing diagram illustrating an example of operating battery cells for different durations during generation of an AC-power wave.

FIG. 14 is a timing diagram illustrating an example of operating battery cells for different durations during generation of an AC-power wave. As shown in this simplified example, there are several cells of the battery, call 1, cell 2, cell 3, and cell 50. The cells are arranged in series according to the topology of FIG. 4, and are individually switchable to either contribute charge to the overall battery (the ON setting), or be bypassed (the OFF setting). Accordingly, the voltages of the cells which are switched ON are summed to produce the overall output of the BCS. The battery cells are switched ON and OFF sequentially to produce a stepwise voltage waveform generally resembling an ideal sinusoidal wave, which is the target output, similarly to the technique described above with reference to FIG. 6.

In this example, the battery cells are selectively switched such that the cells with greater SoC values are on for the longer durations. For instance, assume cell 3 has the greatest SoC, followed by cell 1, then cell 2, and so on, up through cell 50 (stated another way, SoC[cell 3]>SoC[cell 1]>SoC[cell 2]> . . . >SoC[cell 50]). Accordingly, cell 3 is switched ON at time t1, and switched OFF at time t6; cell 1 is switched ON at time t2, and OFF at time t5; and cell 2 is switched ON at time t3 and OFF at time t4. Cell 50 in this example is not needed to achieve the target output, and remains OFF throughout the duration of the power output.

The current waveforms through each of cell 3, cell 1, cell 2, and cell 50 are depicted on the right side of the diagram. Cell 3, being in the ON setting for the longest duration of t1-t6 supplies more energy than the other cells. Likewise, cell 1 supplies more energy than cell 2. As a result, the cells with the higher SoC will decrease their respective SoC faster than other cells; thus, the system will reach a balanced SoC state among the cells eventually.

Moreover, in this example, the cells are given rest periods. For cell 1, the rest periods are between times t1 and t2, and between times t5 and t6. For cell 2, the rest periods are between times t1 and t3, and between times t4 and t6. Cell 50 has a rest period for the entire half-cycle. The cells (including cell 3) may additionally have a short rest period between the half-cycles of output (i.e., between time t1 of the present half-cycle, and time t6 of the preceding half-cycle).

The rest periods are generally short (within millisecond ranges), which is not long enough to provide cell recovery; however, the rest periods still provide the benefit of mitigating heating of the cells due to continuous current. This benefit can become more important as SoC levels approach 0% or 100%, where internal resistance tends to increase and result in higher self-heating temperature of the cells.

In a related aspect, to accommodate for a worst-case scenario in which cells are discharged to 100% depth of discharge, while there may also be a number of non-usable "dead" cells, the BCS is designed to achieve the required peak output voltage using a portion of the total number of cells of the battery. In some embodiments, the cells which are not being used to generate the present output voltage, i.e., the resting cells, are allowed to remain in their OFF setting for several half-cycles (or longer). For example, to reach the peak voltage of 168V (for 120 VAC system), considering the particular minimum operational voltage of a cell at 2.6V, there are 65 cells required to be in the serial circuit. In a particular system designed with 72 cells, there is a minimum of 7 cells that can be rested at a given time.

These cells can be selected for resting based on their respective state (SoC, SoH, temperature, historical usage—charge/discharge cycles, etc., or some combination of conditions) and can be scheduled to rest for a duration of seconds, minutes or hours. For certain battery cell compositions, this extended resting time can have a significant effect on improving the battery's overall useful life.

Figure 15:
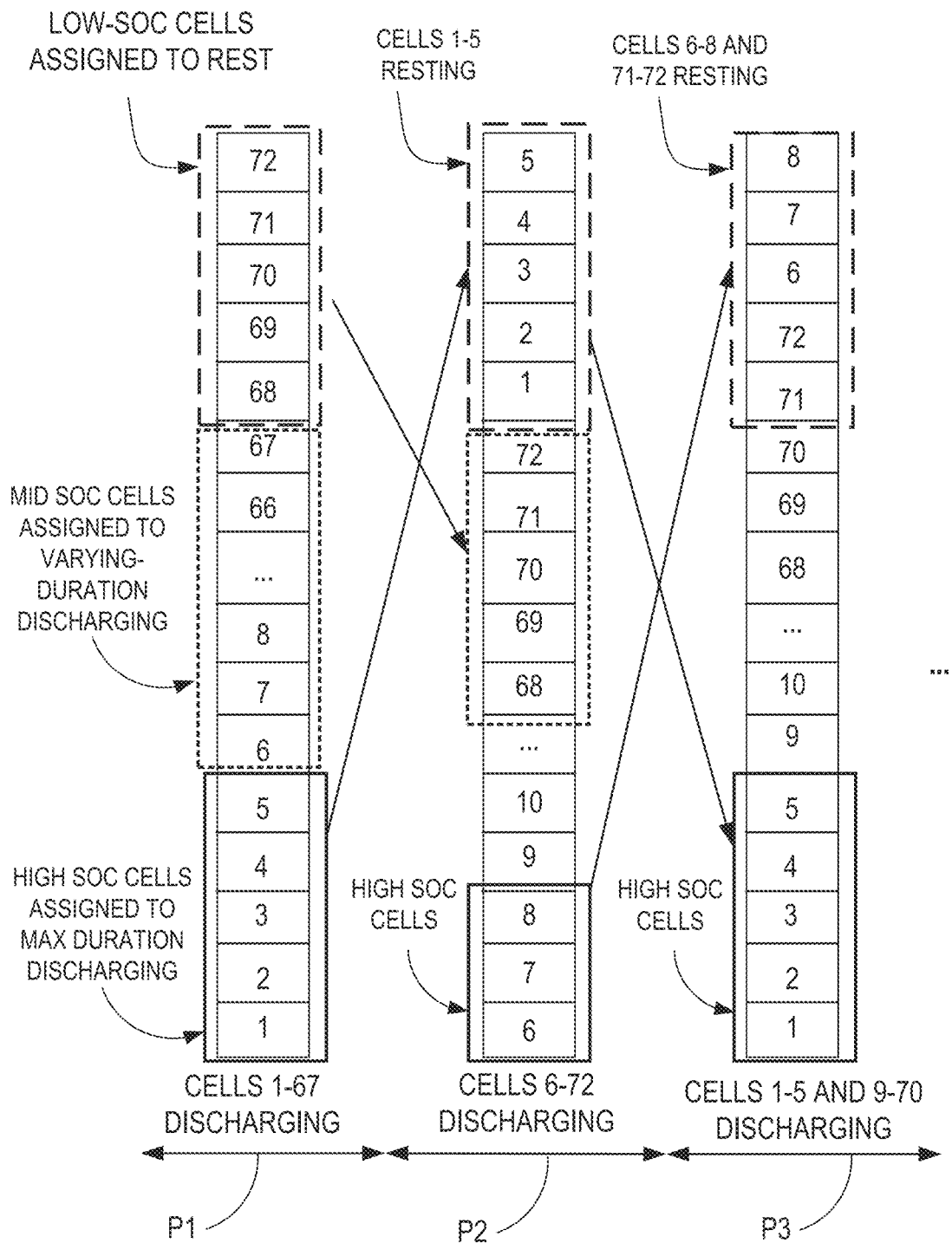
FIG. 15 is a diagram illustrating an example of a cell-resting algorithm that may be carried out during a discharging regime.

In some embodiments, the resting time of a particular cell is chosen based on its position in the sorted data structure as discussed above. FIG. 15 is a diagram illustrating an example of a cell-resting algorithm that may be carried out by the energy storage control system 108 or battery system controller 208 during the discharging regime. FIG. 15 depicts portions of a cell-sorting data structure as described above with reference to FIGS. 13-14 at various states during three periods of operation P1, P2, and P3, according to an example implementation. Periods P1-P3 are not necessarily aligned with cycles of the AC waveform produced by polarity inverter 152. Each period may include multiple cycles of the AC waveform, and may begin or end at the zero crossing of the AC waveform or at other points along the waveform.

In this example, the cells are ordered by SoC, with cell 1 having the highest SoC, and cell 72 having the lowest SoC. According to one implementation of a cell modulation scheme, during period P1, cells 1-67 are used to supply power in their discharging regime, while cells 68-72 are placed in a resting status to not be activated. Among cells 1-67, cells 1-5 are assigned to have the longest-duration ON setting when generating the output power waveform, with the other cells, 6-67, given correspondingly shorter ON settings similarly to the technique described in the example above with reference to FIG. 14. In this example, cells which are represented higher in the order correspond to shorter ON durations. Resting cells 68-72 are bypassed entirely (i.e., there is no current discharged from these cells). The duration of period P1 may be on the order of a few minutes, for example.

In period P2, the high-SoC cells 1-5, which have experienced long ON durations are placed in a resting mode (e.g., as represented by their re-ordering to the top of the sorting data structure) regardless of their SoC level. The selection of cells 1-5 for resting may be made according to cell-resting criteria. The cell-resting criteria may be defined in terms of minimum duty cycle, quantity M of cells at the bottom of the sort order, temperature rise over a monitoring period, or other criteria that corresponds to a certain intensity of usage. Cells 68-72 may be shifted down in the sorting data structure (but still near the top) so that these low-SoC cells are now includable among active (non-resting) cells, but which are discharged for short durations to minimize further reduction of their SoC. The remaining cells are also shifted downward in the sorting data structure, such that these cells are switched ON for shorter or longer durations commensurate with their placement in the sorting order. In this example, cells 6-8 are high-SoC cells relative to the other active cells, and are assigned to the longest-duration ON setting. The duration of period P2 may be on the order of a few minutes, for example.

In period P3, high-SoC cells 1-5, and which have been resting during period P2, are placed at the bottom of the sorting data structure to once again be assigned to the high-duration discharging. Cells 6-8, having been utilized for high-duration discharging, are placed at the top of the sorting order as shown to rest. Assuming that low-SoC cells 71-72 are not needed to supply voltage for the output power generation, these cells may also be rested to preserve their SoC. The remaining cells, 9-70, are switched ON for shorter or longer durations commensurate with their placement in the sorting order. This example demonstrates that different quantities of cells may be assigned to the maximum-duration discharge operation in different periods. Likewise, different quantities of cells may be rested in the different periods.

In a related embodiment, the sorting order of the cells in the data structure may be adjusted between periods, based on changes to the SoC of each of the cells as the cells are utilized. For instance, if the SoC of cell 1 is no longer in the maximum-SoC group, that physical cell may be reassigned a different index number and placed in the sorting order appropriately, so that another cell with higher SoC is subjected to the longest-duration discharging.

In another related embodiment, one or more cell condition (s) besides SoC may be taken into account in the sorting order. For example, SoH, operational history (charging/discharging cycles), cell temperature, etc.

Current Sharing Between Parallel BCS Modules

Figure 16:
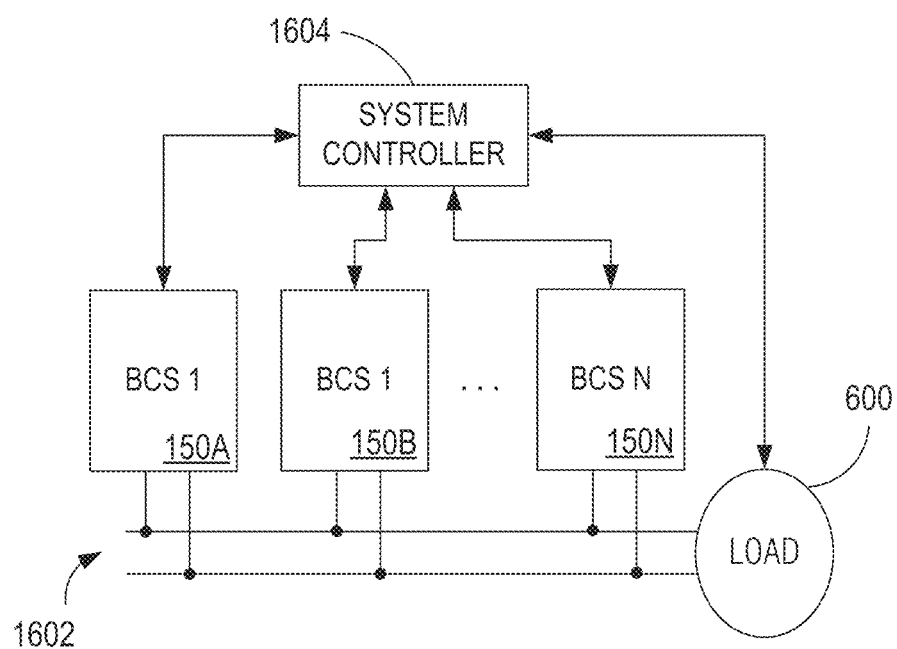
FIG. 16 is a block diagram illustrating an example arrangement of multiple BCS's that are aggregated in parallel with one another.

In a large-scale energy storage system, multiple BCS's are typically aggregated in parallel with one another. FIG. 16 illustrates one such arrangement, where multiple BCS's, 150A, 150B, . . . , 150N (referred to generally as BCS 150) are connected in parallel via power lines 1602 to the load 600, which may be a power grid. System controller 1604 executes instructions to that reads the status and conditions of each of the BCS's 150, communicates with a controller of load 600 (which may be an energy management system (EMS)), including reading power demands from the EMS, and issues commands to each BCS 150 to coordinate the overall operation of the BCS's.

In each BCS 150, the different battery cells may have different SoH. In addition, at any given moment, the battery cells in a BCS 150 can have different SoC. Therefore, the overall energy storage capacity of each BCS 150 may be different. According to another aspect of this disclosure, system controller 1604 executes a multi-level optimization algorithm to maximize, or at least improve, the useful life of all battery cells in each of the BCS's 150.

At the system level, a current sharing technique between the parallel BCS's is controlled based on the stored energy in each BCS 150. This amount of energy is estimated by each BCS 150 and may be based on its cells' SoC and, optionally, on additional state indicia (e.g., SoH or other(s)). The system controller 1604 uses these values to calculate the charging/discharging current level of each BCS 150 while ensuring that the overall system of BCS's is able to satisfy the power demand of the load 600, as provided by the EMS. In case of fault detected in one or some BCS units, e.g., they are out of service, the remaining BCS units may share the power demands without interrupting operation of the system.

The following equation is an example of how the total energy stored in a BCS 150 can be calculated based on SoC, SoH and on the original capacity C of each of the cells.

$$E_k = \sum_{i=1}^{n} SoC_i \times SoH_i \times C_i,$$

where SoC and SoH are each a value between 0 and 1, and each represents a discount ratio from an ideal corresponding condition, and the capacity C is in units of energy.

In some embodiments, the power sharing between parallel BCS's 150 can be computed by, but not limited to, the following equations:

Power discharged from a BCS 150 is proportional to its stored energy, i.e. higher stored energy in a BCS 150 discharges with higher power level:

$$\frac{P_1}{E_1} = \frac{P_2}{E_2} = \ldots = \frac{P_m}{E_m},$$

whereas power charged from a BCS system is reversed proportional to its stored energy, i.e. higher stored energy BCS 150 charges with lower power level.

$$P_1 E_1 = P_2 E_2 = \ldots = P_m E_m$$

In addition, the total discharging/charging power must satisfy a command from the EMS:

$$\sum_{k=1}^{m} P_k = P_{command}$$

Note that the above equations are presented for a simple case of the power sharing method. However, other relationships can be used in related embodiments. In some of these embodiments, the following principles are implemented:

An overall lower energy storage capacity BCS operates at lower charging/discharging current than other BCS's to avoid fast aging compared to the other BCS's.

A BCS having overall lower stored energy compared to other BCS's operates at lower discharging current and higher charging current to balance the overall system.

Occasionally, one of the BCS's can operate at the opposite current direction than the other parallel BCS's, and with a very low current level (e.g. 1%-2% of the current rating of the battery cells), in order to reduce the polarization and further reduce the SEI layer. For example, after charging for 100 cycles of the AC wave, the BCS can discharge over a few cycles while other branches continue charging.

Within each BCS 150, the operation of all battery cells may be optimized, or at least improved, by controlling operation based on certain cell state or condition information such as SoC, SoH, and temperature. To minimize or at least reduce the aging effect, and hence prolong the lifetime of battery cells, one, or a combination, of the following techniques may be utilized according to some embodiments:

A cell resting process, such as the examples described above with reference to FIGS. 15-16, is employed. In the cell resting process, resting prioritized for cells having low SoC, and for cells having recently been operated in a discharging regime for relatively longer ON durations.

The charging/discharging current level of each cell is calculated during a number of electrical cycles by a cell sorting algorithm based on its SoC and SoH. A cost function of each cell is calculated based on its condition, and then sorted in appropriate order in a data structure. The battery system controller 208 uses this sorting order to determine the ON time to be set for each cell within an electrical cycle, hence, controlling the pulse duration of the current through each cell. An example of a cost function for each cell considering both SoC and temperature is given in the following equations.

In charging mode:

$$f_i = \alpha \times SoC_i + \beta \times SoH_i + \mu \times g(t_i)$$

In discharging mode:

$$f_i = \alpha \times SoC_i + \beta \times SoH_i - \mu \times g(t_i)$$

where $f_i$ is the cost function of cell i;
α is the SoC coefficient;
β is the SoH coefficient;
$t_i$ is the temperature of cell i;
μ is a temperature coefficient;
$g(t_i)$ is the cost function of the temperature, which can be linear or non-linear depending on particular battery cell characteristics.

$f_i$ can replace SoC[i] in the sorting algorithm described above with reference to FIGS. 13-14 in order to take temperature and SoH of each cell into account for sorting purposes. As a result, all these factors are computed to determine which cells are exposed to higher current.

These equations, when computed by battery system controller 208, implement the following principles:

Lower SoH and SoC cells are operated at lower average charging/discharging current to reduce the rate of aging of such cells;
Cells having relatively lower SoC compared to other cells are purposely operated at lower discharging current and higher charging current to balance SoC of all cells.
A cell having a higher temperature than the temperature of other cells is controlled to have relatively longer resting time (as compared to other cells in the BCS) to reduce its temperature and facilitate recovery of that cell.
If two cells have the same SoC and SoH, the higher-temperature cell is controlled to charge and discharge using relatively lower current than the charging or discharging currents of other cells in the BCS.

Commissioning of Battery Cells

In a related aspect, the BCS implements techniques that allow system operators to forgo performing a testing procedure of second-life battery cells prior to their incorporation in the BCS. This can provide economic and logistical benefits, such as saving operators the costs of obtaining and operating testing equipment and personnel, and speeds the time for deployment of second-life battery cells. Accordingly, in some embodiments, BCS 150 is programmed to carry out an automated commissioning process that determines the initial SoH and SoC of all the battery cells at their initial installation in the system, and each time a cell is replaced.

Figure 17:
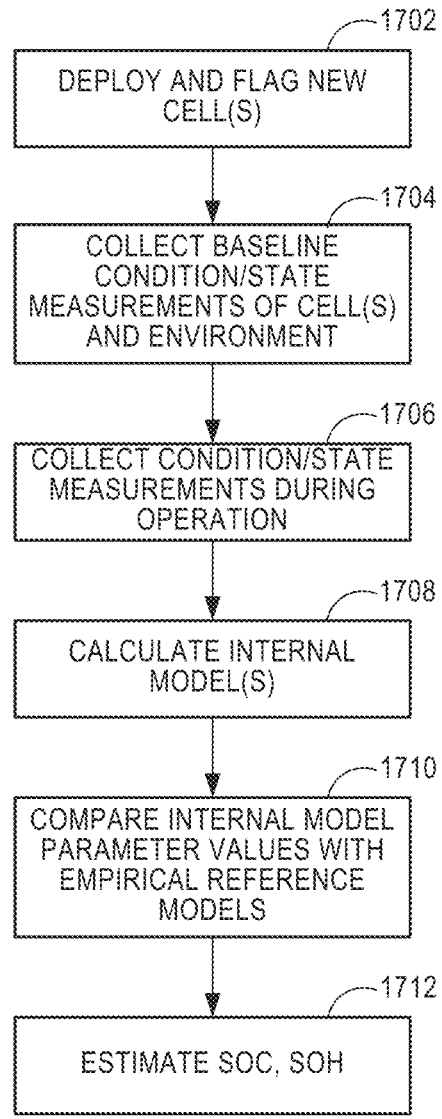
FIG. 17 is a flow diagram illustrating a commissioning process according to an example embodiment.

FIG. 17 is a flow diagram illustrating a commissioning process according to an example embodiment. The process may be carried out by battery system controller 208 of a BCS 150. At 1702, the new cell(s) are deployed in BCS 150 and are exposed to the ordinary operating environment, where they are charged and discharged in the course of operation. Each new cell may be given a unique ID and its parameters may be tracked and recorded in a suitable data structure. The new cell(s) may have their status flagged as being subject to commissioning, or their ID(s) may be placed in a commissioning data structure that is used specifically for the commissioning process.

At 1704, prior to any significant operation of the new cell(s) subject to commissioning, BCS 150 collects baseline condition and operating regime information of those cell(s), and of the environment. Examples of measured cell conditions include voltage (open-loop or under load), current, cell temperature, etc.). Examples of operating regime information include charging or discharging regimes, and duration of each. Example of environmental conditions include ambient temperature external to the cell(s).

At 1706, BCS 150 collects condition measurements and operating regime information of the new cell(s) during operation. These measurements may be made periodically according to a time schedule, in response to changes in operating regime, or according to a combination. The usage monitoring while using these cells in the ordinary course of operation under varying operating conditions (such as various load conditions, ambient temperatures, etc.), over a duration which is long enough to realize a change of their SoC, produces data for assessing more nuanced conditions of the cells, such as SoH, which are not readily observable by direct electrical or thermal measurement. Notably, the BCS 150 is able to measure open circuit voltage, and battery voltage at different charging/discharging current levels by virtue of its multiplexing architecture as described above, which permits individual control or isolation of each cell.

At 1708, the measurements are used to calculate an internal model of the cell including internal resistance, open circuit voltage, and the like. The calculated values of internal model's parameters are then compared with pre-defined empirical data which have been obtained experimentally from various other battery cells at different temperatures and SoC, SoH levels, at 1710. At 1712, the comparison results are applied to estimate the SoC and SoH of the cell(s) in question. The comparison of model parameter values and estimation of SoC and SoH may be performed using a suitable algorithm, such as a regression technique, nearest-neighbor classification, clustering, trained neural network (where the empirical measurements were used as training data), or the like.

After the commissioning period, the new battery cell(s) have their SoC and SoH values, and may be sorted and ordered in accordance with a cell-optimization strategy as described above.

ADDITIONAL NOTES AND EXAMPLES

Example 1 is a battery control system, comprising: a first plurality of switching circuits, each of the switching circuits of the first plurality of switching circuits including a respective high side switch, a respective low side switch and a respective battery cell, the high side switch selectively operable to couple a voltage of the respective battery cell into an accumulated voltage of the first plurality of switching circuits in an ON setting of the high side switch and the respective low side switch selectively operable to omit the voltage of the respective battery cell in the accumulated voltage of the first plurality of switching circuits in an ON setting of the low side switch; and a first switching control circuit communicatively coupled to control the respective setting of the respective high side switch and the respective low side switch of each of the switching circuits of the first plurality of switching circuits.

In Example 2, the subject matter of Example 1 includes, wherein the respective high side switch and the respective low side switch each of the switching circuits are electrically coupled in a half bridge arrangement, and are operated in complementary fashion with only one of the respective high side switch and the respective low side switch in a respective ON setting at a time, and with a dead time in which both the respective high side switch and the respective low side switch are in respective OFF settings before switching to the respective ON setting of the respective high side switch or the respective low side switch.

In Example 3, the subject matter of Examples 1-2 includes, wherein the first plurality of m battery cells is arranged in a first rack; and further comprising: a number N of additional pluralities of switching circuits, each of the switching circuits of the additional pluralities of switching circuits including a respective high side switch, a respective low side switch and a respective battery cell, the high side switch selectively operable to couple a voltage of the respective battery cell into an accumulated voltage of the first plurality of switching circuits in an ON setting of the high side switch and the respective low side selectively operable to omit the voltage of the respective battery cell in the accumulated voltage of the first plurality of switching circuits in an ON setting of the low side switch; and a number N of additional switching control circuit communicatively coupled to control the respective setting of the respective high side switch and the respective low side switch of each of the switching circuits of a respective one of the additional pluralities of switching circuits.

In Example 4, the subject matter of Example 3 includes, wherein the battery cells of each of the additional pluralities of switching circuits are arranged on respective ones of a number of additional racks, the additional racks being in addition to the first rack.

In Example 5, the subject matter of Example 4 includes, a wire harness that couples the battery cells of the first rack and the additional racks electrically in series.

In Example 6, the subject matter of Examples 1-5 includes, at least a first inverter comprising a plurality of switches electrically coupled in in full H-bridge topology, the first inverter having a set of input nodes and a set of output nodes, the set of input nodes electrically coupled to a power source and the set of output nodes electrically coupled to the switching circuits of at least the first plurality of switching circuits; and a battery control system control circuit communicatively coupled with at least the first switching control circuit.

In Example 7, the subject matter of Example 6 includes, wherein the power source provides a plurality of phases of power via a grid, the first inverter is a first grid inverter coupled to a first phase of power provided via the grid, and the further comprising: a plurality of additional grid tie inverters electrically coupled respective phases of power provided via the grid.

In Example 8, the subject matter of Examples 6-7 includes, wherein the battery control system control circuit controls the first inverter to rectify a negative voltage of the power source to positive voltage to connect with the battery cells of the switching circuits, wherein the first inverter operates at a switching frequency that is at least twice a frequency of a waveform provided by the power source.

In Example 9, the subject matter of Examples 6-8 includes, wherein the battery control system control circuit controls the first inverter to regulate a current provided by the power source following a set point to charge or discharge the battery cells, and the battery control system control circuit then sends a set of switching commands to the switching circuits.

In Example 10, the subject matter of Examples 6-9 includes, wherein the battery control system control circuit controls the first inverter according to an optimization algorithm to select which one or more battery cells should be charged or discharged at a certain current level in order to maximize a respective lifetime of each of the battery cells.

In Example 11, the subject matter of Example 10 includes, wherein battery control system control circuit implements sorted orders of battery cell voltage based on a virtual position of the battery cells in a serial string as defined by the optimization algorithm output.

In Example 12, the subject matter of Examples 6-11 includes, wherein switching circuits each include a respective voltage sensor and a respective temperature sensor and transmit battery information including a sensed voltage and a sensed temperature of the respective battery cell to the battery control system control circuit or to a center controller.

In Example 13, the subject matter of Examples 6-12 includes, wherein the battery control system control circuit executes a grid current control algorithm based on a charging/discharging power set point and a voltage provided by the power source to provide one or more control signals to at least the first switching control circuit.

In Example 14, the subject matter of Example 13 includes, wherein the battery control system control circuit compares the control signal with the voltages of all of the battery cells to generate respective settings of the high side switch and the low side switch for the respective battery cell, and transmits the generated settings to the respective switching circuits.

In Example 15, the subject matter of Examples 6-14 includes, wherein a charging and a discharging current of each individual ones of the battery cells is controlled based on a state of charge and a state of health of the respective battery cell.

In Example 16, the subject matter of Examples 4-15 includes, a wire harness that correctly matches polarities of the battery cells with a set of inverter terminals.

In Example 17, the subject matter of Examples 1-16 includes, wherein the first switching control circuit controls a timing of the respective settings of the respective high side switch and the respective low side switch of each of the switching circuits of the first plurality of switching circuits to produce a stair-step multiplex output voltage that resembles a positive portion of a sinusoidal waveform.

In Example 17-2, the subject matter of Examples 1-16 includes, wherein the first switching control circuit controls the respective settings of the respective high side switch and the respective low side switch of each of the switching circuits of the first plurality of switching circuits to produce a time-varying DC voltage.

Example 18 is a method of operating a battery control system, comprising: receiving battery information of one or more battery cells from a switching circuit by a battery control system controller; creating a sorted order by the switching control circuit based at least in part on a virtual position of each cell in a serial string and the battery information; executing by the switching control circuit a grid current control algorithm based on a charging/discharging power setpoint and grid voltage; outputting a control signal to control the one or more battery cells to satisfy a power/voltage requirement; comparing by the switching control circuit the control signal with all battery cell information to generate a switch setting for each of the one or more battery cells; and transmitting the switch setting for each of the one or more battery cells to the switching circuit.

In Example 19, the subject matter of Example 18 includes, wherein the battery information is at least one of voltage and temperature.

In Example 20, the subject matter of Example 19 includes, wherein the battery information is provided by one or more sensors.

In Example 21, the subject matter of Examples 18-20 includes, wherein the sorted order is based at least in part on an optimization algorithm output.

Example 22 is a battery control system, comprising: a plurality of battery cells arranged as a plurality of controllable units, wherein each controllable unit includes, at least one of the battery cells of the plurality; switching circuitry coupled to the plurality of battery cells, and arranged to facilitate individualized control of each of the controllable units, wherein the individualized control includes selective activation/deactivation of each controllable unit within an aggregation of battery cells; sensing circuitry arranged at each controllable unit to measure conditions of at least one battery cell of that controllable unit; and controller circuitry operatively coupled to the switching circuitry and to the sensing circuitry, the controller circuitry operative to read the sensing circuitry and to cause the switching circuitry to dynamically activate and deactivate the controllable units within the aggregation of battery cells based on the individualized control according to battery-management instructions; wherein the battery management instructions, when executed, cause the controller circuitry to: estimate a state of each controllable unit based on the measured conditions of the at least one battery cell in that controllable unit, wherein the estimated state is indicative of a performance capability of that controllable unit; determine a hierarchy of the plurality of controllable units, the hierarchy being based on the respective states of the controllable units; perform the individualized control based on the hierarchy such that a respective position of each of the controllable units within the hierarchy is used to set a duration of the activation of that controllable unit within the aggregation of battery cells; adjust ordering of the hierarchy in response to changes in the estimated states of one or more of the controllable units; and adjust ordering of the hierarchy in response to operational history of one or more of the controllable units regardless of any changes in the estimated states of those controllable units.

In Example 23, the subject matter of Example 22 includes, wherein the conditions measured by the sensing circuitry associated with each controllable unit include voltage of the at least one cell of that controllable unit, current through the at least one cell of that controllable unit, and temperature of at least one cell of that controllable unit.

In Example 24, the subject matter of Examples 22-23 includes, wherein the state estimated by the controller circuitry includes a state of charge (SoC) value that is indicative of an extent to which the at least one cell of a controllable unit is charged relative to its capacity.

In Example 25, the subject matter of Example 24 includes, wherein the state estimated by the controller circuitry further includes a state of health (SoH) value that is indicative of an extent of degradation of the at least one cell of a controllable unit.

In Example 26, the subject matter of Example 25 includes, wherein the SoH value is determined based on at least one condition of the at least one cell selected from the group consisting of: internal resistance, capacity, nominal voltage at full charge, the voltage under load, rate of self-discharge, ability to accept a charge, a number of charge-discharge cycles, age, temperature of the at least one cell during its previous use, the total energy charged and discharged, or any combination thereof.

In Example 27, the subject matter of Examples 25-26 includes, wherein the hierarchy includes an ordered set of respective identifiers representing the controllable units.

In Example 28, the subject matter of Examples 22-27 includes, wherein at least a first portion of the hierarchy is sorted in order of values of the respective estimated states of the controllable units.

In Example 29, the subject matter of Example 28 includes, wherein the battery-management instructions, when executed, cause controller circuitry to determine the hierarchy such that controllable units having estimated states indicative of relatively higher performance capability are assigned to a relatively higher placement in the first portion of the hierarchy, and controllable units having estimated states indicative of relatively lower performance capability are assigned to a relatively lower placement in the first portion of the hierarchy.

In Example 30, the subject matter of Example 29 includes, wherein the hierarchy is further determined based on a present temperature of each controllable unit.

In Example 31, the subject matter of Example 30 includes, wherein the hierarchy is further determined based on a combination of an estimated state of charge (SoC) value, an estimated state of health (SoH) value, and the present temperature, of each controllable unit, wherein the SoC value is indicative of an extent to which the at least one cell of the controllable unit is charged relative to its capacity, and wherein the SoH value is indicative of an extent of degradation of the at least one cell of the controllable unit.

In Example 32, the subject matter of Examples 30-31 includes, wherein in the individualized control, controllable units assigned to the relatively higher placement in the hierarchy are activated for longer durations than controllable units assigned to the relatively lower placement in the hierarchy when the battery cells are operated in a discharging regime.

In Example 33, the subject matter of Examples 30-32 includes, wherein in the individualized control, controllable units assigned to the relatively higher placement in the hierarchy are activated for shorter durations than controllable units assigned to the relatively lower placement in the hierarchy when the battery cells are operated in a charging regime.

In Example 34, the subject matter of Examples 28-33 includes, wherein a second portion of the hierarchy is sorted based on the performance history of certain ones of the controllable units.

In Example 35, the subject matter of Example 34 includes, wherein the second portion of the ordered set includes identifiers of certain controllable units which have experienced activation durations according to cell-resting criteria.

In Example 36, the subject matter of Examples 34-35 includes, wherein in the individualized control, controllable units assigned to the second portion of the hierarchy are not activated.

In Example 37, the subject matter of Examples 22-36 includes, wherein the switching circuitry includes a series arrangement of the controllable units, and wherein in the individualized control, the controllable units of the series arrangement are sequentially activated and deactivated to produce a varying-voltage waveform.

In Example 38, the subject matter of Examples 22-37 includes, wherein in the individualized control, the controllable units are activated and deactivated in response to power demand information received from a controller associated with a load.

In Example 39, the subject matter of Examples 22-38 includes, wherein the battery management instructions, when executed, cause the controller circuitry to perform a commissioning procedure applicable to deployment of a new controllable unit, wherein: the switching circuitry exposes the new controllable unit to an operating environment in which the plurality of controllable units are exposed; baseline measurements of a condition of the new controllable unit are made; additional measurements of the condition of the new controllable unit are made after a defined period of operation; the baseline measurements and the additional measurements are used to generate an internal model of the new controllable unit; the internal model is compared with empirical reference models to produce a comparison result; and a discovered state of the new controllable unit is estimated based on the comparison result, wherein the discovered state is indicative of a performance capability of that controllable unit.

In Example 40, the subject matter of Example 39 includes, wherein the defined period of operation includes varying operational conditions over a duration sufficient to realize a change in the discovered state.

In Example 41, the subject matter of Examples 39-40 includes, wherein the internal model represents parameters that include internal resistance and open circuit voltage.

Example 42 is an energy storage system, comprising: a set of battery control systems (BCS's), each BCS comprising: a plurality of battery cells arranged as a plurality of controllable units, wherein each controllable unit includes, at least one of the battery cells of the plurality; switching circuitry coupled to the plurality of battery cells, and arranged to facilitate individualized control of each of the controllable units, wherein the individualized control includes selective activation/deactivation of each controllable unit within an aggregation of battery cells; and sensing circuitry arranged at each controllable unit to measure conditions of at least one battery cell of that controllable unit; a system controller operatively coupled to the switching circuitry and to the sensing circuitry, the system controller operative to: estimate an energy storage level of each BCS of the set; and adjust a relative rate of charging and a relative rate of discharging of battery cells among the set of BCS's based on the estimated energy levels.

In Example 43, the subject matter of Example 42 includes, wherein the system controller is operative to adjust the relative rate of charging and a relative rate of discharging such that a first BCS of the set that has a relatively lower energy storage level is controlled to charge and discharge at relatively lower rates, and that a second BCS of the set that has a relatively higher energy storage level is controlled to charge and discharge at relatively higher rates.

In Example 44, the subject matter of Examples 42-43 includes, wherein the system controller is operative to adjust the relative rate of charging and a relative rate of discharging such that a first BCS of the set that has a relatively lower energy storage level is controlled to discharge at a relatively lower rate and to charge at a relatively higher rate, and that a second BCS of the set that has a relatively higher energy storage level is controlled to discharge at a relatively higher rate.

In Example 45, the subject matter of Examples 42-44 includes, wherein the system controller is operative to estimate the energy storage level of each BCS being based on an aggregation of a combination of an estimated state of charge (SoC) value, an estimated state of health (SoH) value, and a nominal capacity of each controllable unit within that BCS, wherein the SoC value is indicative of an extent to which the at least one cell of the controllable unit is charged relative to its capacity, and wherein the SoH value is indicative of an extent of degradation of the at least one cell of the controllable unit.

In Example 46, the subject matter of Examples 42-45 includes, wherein the system controller is operative to cause the set of BCS's to operate either in a charging regime or in a discharging regime, and further to cause at least one BCS of the set to occasionally operate in a different regime than the other BCSs of the set concurrently with operation of those other BCSs of the set.

Example 47 is a method for operating a battery control system having a plurality of battery cells arranged as a plurality of controllable units, each controllable unit including at least one of the battery cells of the plurality, the method comprising: measuring conditions of at least one battery cell of each controllable unit; estimating a state of each controllable unit based on the measured conditions of the at least one battery cell in that controllable unit, wherein the estimated state is indicative of a performance capability of that controllable unit; determining a hierarchy of the plurality of controllable units, the hierarchy being based on the respective states of the controllable units; dynamically activating and deactivating individual ones of the controllable units based on the hierarchy such that a respective position of each of the controllable units within the hierarchy is used to set a duration of the activation of that controllable unit; adjusting ordering of the hierarchy in response to changes in the estimated states of one or more of the controllable units; and adjusting the ordering of the hierarchy in response to operational history of one or more of the controllable units regardless of any changes in the estimated states of those controllable units.

In Example 48, the subject matter of Example 47 includes, wherein measuring the conditions of at least one battery cell of each controllable unit includes measuring voltage of that at least one cell, current through that at least one cell, and temperature of that at least one cell.

In Example 49, the subject matter of Examples 47-48 includes, wherein estimating the state of each controllable unit includes estimating a state of charge (SoC) value that is indicative of an extent to which the at least one cell of each controllable unit is charged relative to its capacity.

In Example 50, the subject matter of Example 49 includes, wherein estimating the state of each controllable unit further includes estimating a state of health (SoH) value that is indicative of an extent of degradation of the at least one cell of each controllable unit.

In Example 51, the subject matter of Example 50 includes, wherein the SoH value is determined based on at least one condition of the at least one cell selected from the group consisting of: internal resistance, capacity, nominal voltage at full charge, the voltage under load, rate of self-discharge, ability to accept a charge, a number of charge-discharge cycles, age, temperature of the at least one cell during its previous use, the total energy charged and discharged, or any combination thereof.

In Example 52, the subject matter of Examples 47-51 includes, wherein determining the hierarchy includes determining an ordered set of respective identifiers representing the controllable units.

In Example 53, the subject matter of Examples 47-52 includes, wherein adjusting the ordering of the hierarchy includes sorting at least a first portion of the hierarchy in order of values of the respective estimated states of the controllable units.

In Example 54, the subject matter of Example 53 includes, wherein determining the hierarchy is performed such that controllable units having estimated states indicative of relatively higher performance capability are assigned to a relatively higher placement in the first portion of the hierarchy, and controllable units having estimated states indicative of relatively lower performance capability are assigned to a relatively lower placement in the first portion of the hierarchy.

In Example 55, the subject matter of Example 54 includes, wherein the hierarchy is further determined based on a present temperature of each controllable unit.

In Example 56, the subject matter of Example 55 includes, wherein the hierarchy is further determined based on a combination of an estimated state of charge (SoC) value, an estimated state of health (SoH) value, and the present temperature, of each controllable unit, wherein the SoC value is indicative of an extent to which the at least one cell of the controllable unit is charged relative to its capacity, and wherein the SoH value is indicative of an extent of degradation of the at least one cell of the controllable unit.

In Example 57, the subject matter of Examples 55-56 includes, wherein in dynamically activating and deactivating individual ones of the controllable units, the controllable units assigned to the relatively higher placement in the hierarchy are activated for longer durations than controllable units assigned to the relatively lower placement in the hierarchy when the battery cells are operated in a discharging regime.

In Example 58, the subject matter of Examples 55-57 includes, wherein in dynamically activating and deactivating individual ones of the controllable units, controllable units assigned to the relatively higher placement in the hierarchy are activated for shorter durations than controllable units assigned to the relatively lower placement in the hierarchy when the battery cells are operated in a charging regime.

In Example 59, the subject matter of Examples 53-58 includes, wherein adjusting the ordering of the hierarchy further includes sorting a second portion of the hierarchy based on the performance history of certain ones of the controllable units.

In Example 60, the subject matter of Example 59 includes, wherein the second portion of the ordered set includes identifiers of certain controllable units which have experienced activation durations according to cell-resting criteria.

In Example 61, the subject matter of Examples 59-60 includes, wherein in dynamically activating and deactivating individual ones of the controllable units, controllable units assigned to the second portion of the hierarchy are not activated.

In Example 62, the subject matter of Examples 47-61 includes, wherein in dynamically activating and deactivating individual ones of the controllable units, the controllable units are sequentially activated and deactivated to produce a varying-voltage waveform when the battery cells are operated in a discharging regime.

In Example 63, the subject matter of Examples 47-62 includes, wherein in dynamically activating and deactivating individual ones of the controllable units, the controllable units are activated and deactivated in response to power demand information received from a controller associated with a load when the battery cells are operated in a discharging regime.

In Example 64, the subject matter of Examples 47-63 includes, performing a commissioning procedure applicable to deployment of a new controllable unit, wherein: the new controllable unit is exposed to an operating environment in which the plurality of controllable units are exposed; baseline measurements of a condition of the new controllable unit are made; additional measurements of the condition of the new controllable unit are made after a defined period of operation; the baseline measurements and the additional measurements are used to generate an internal model of the new controllable unit; the internal model is compared with empirical reference models to produce a comparison result; and a discovered state of the new controllable unit is estimated based on the comparison result, wherein the discovered state is indicative of a performance capability of that controllable unit.

In Example 65, the subject matter of Example 64 includes, wherein the defined period of operation includes varying operational conditions over a duration sufficient to realize a change in the discovered state.

In Example 66, the subject matter of Examples 64-65 includes, wherein the internal model represents parameters that include internal resistance and open circuit voltage.

Example 67 is a method for operating an energy storage system, the method comprising: providing a set of battery control systems (BCS's), each BCS having a plurality of battery cells arranged as a plurality of controllable units, wherein each controllable unit includes, at least one of the battery cells of the plurality; performing individualized control of each of the controllable units, wherein the individualized control includes selective activation/deactivation of each controllable unit within an aggregation of battery cells; measuring conditions of at least one battery cell of each controllable unit; estimating an energy storage level of each BCS of the set; and adjusting a relative rate of charging and a relative rate of discharging of battery cells among the set of BCS's based on the estimated energy levels.

In Example 68, the subject matter of Example 67 includes, adjusting the relative rate of charging and a relative rate of discharging such that a first BCS of the set that has a relatively lower energy storage level is controlled to charge and discharge at relatively lower rates, and that a second BCS of the set that has a relatively higher energy storage level is controlled to charge and discharge at relatively higher rates.

In Example 69, the subject matter of Examples 67-68 includes, adjusting the relative rate of charging and a relative rate of discharging such that a first BCS of the set that has a relatively lower energy storage level is controlled to discharge at a relatively lower rate and to charge at a relatively higher rate, and that a second BCS of the set that has a relatively higher energy storage level is controlled to discharge at a relatively higher rate.

In Example 70, the subject matter of Examples 67-69 includes, estimating the energy storage level of each BCS being based on an aggregation of a combination of an estimated state of charge (SoC) value, an estimated state of health (SoH) value, and a nominal capacity of each controllable unit within that BCS, wherein the SoC value is indicative of an extent to which the at least one cell of the controllable unit is charged relative to its capacity, and wherein the SoH value is indicative of an extent of degradation of the at least one cell of the controllable unit.

In Example 71, the subject matter of Examples 67-70 includes, causing the set of BCS's to operate either in a charging regime or in a discharging regime, and further causing at least one BCS of the set to occasionally operate in a different regime than the other BCSs of the set concurrently with operation of those other BCSs of the set.

Example 72 is at least one non-transitory machine-readable medium comprising instructions that, when executed by a controller of a battery control system having a plurality of battery cells arranged as a plurality of controllable units, each controllable unit including at least one of the battery cells of the plurality, cause the battery control system to: measure conditions of at least one battery cell of each controllable unit; estimate a state of each controllable unit based on the measured conditions of the at least one battery cell in that controllable unit, wherein the estimated state is indicative of a performance capability of that controllable unit; determine a hierarchy of the plurality of controllable units, the hierarchy being based on the respective states of the controllable units; dynamically activate and deactivating individual ones of the controllable units based on the hierarchy such that a respective position of each of the controllable units within the hierarchy is used to set a duration of the activation of that controllable unit; adjust ordering of the hierarchy in response to changes in the estimated states of one or more of the controllable units; and adjust the ordering of the hierarchy in response to operational history of one or more of the controllable units regardless of any changes in the estimated states of those controllable units.

In Example 73, the subject matter of Example 72 includes, wherein the instructions, when executed, cause the battery control system to measure the conditions of at least one battery cell of each controllable unit by measuring voltage of that at least one cell, current through that at least one cell, and temperature of that at least one cell.

In Example 74, the subject matter of Examples 72-73 includes, wherein the instructions, when executed, cause the battery control system to estimate the state of each controllable unit by estimating a state of charge (SoC) value that is indicative of an extent to which the at least one cell of each controllable unit is charged relative to its capacity.

In Example 75, the subject matter of Example 74 includes, wherein the instructions, when executed, cause the battery control system to estimate the state of each controllable unit by estimating a state of health (SoH) value that is indicative of an extent of degradation of the at least one cell of each controllable unit.

In Example 76, the subject matter of Example 75 includes, wherein the SoH value is determined based on at least one condition of the at least one cell selected from the group consisting of: internal resistance, capacity, nominal voltage at full charge, the voltage under load, rate of self-discharge, ability to accept a charge, a number of charge-discharge cycles, age, temperature of the at least one cell during its previous use, the total energy charged and discharged, or any combination thereof.

In Example 77, the subject matter of Examples 72-76 includes, wherein the instructions, when executed, cause the battery control system to determine the hierarchy by determining an ordered set of respective identifiers representing the controllable units.

In Example 78, the subject matter of Examples 72-77 includes, wherein the instructions, when executed, cause the battery control system to adjust the ordering of the hierarchy by sorting at least a first portion of the hierarchy in order of values of the respective estimated states of the controllable units.

In Example 79, the subject matter of Example 78 includes, wherein the instructions, when executed, cause the battery control system to determine the hierarchy such that controllable units having estimated states indicative of relatively higher performance capability are assigned to a relatively higher placement in the first portion of the hierarchy, and controllable units having estimated states indicative of relatively lower performance capability are assigned to a relatively lower placement in the first portion of the hierarchy.

In Example 80, the subject matter of Example 79 includes, wherein the hierarchy is further determined according to the instructions based on a present temperature of each controllable unit.

In Example 81, the subject matter of Example 80 includes, wherein the hierarchy is further determined according to the instructions based on a combination of an estimated state of charge (SoC) value, an estimated state of health (SoH) value, and the present temperature, of each controllable unit, wherein the SoC value is indicative of an extent to which the at least one cell of the controllable unit is charged relative to its capacity, and wherein the SoH value is indicative of an extent of degradation of the at least one cell of the controllable unit.

In Example 82, the subject matter of Examples 80-81 includes, wherein the instructions, when executed, cause the battery control system to dynamically activate and deactivate individual ones of the controllable units such that the controllable units assigned to the relatively higher placement in the hierarchy are activated for longer durations than controllable units assigned to the relatively lower placement in the hierarchy when the battery cells are operated in a discharging regime.

In Example 83, the subject matter of Examples 80-82 includes, wherein the instructions, when executed, cause the battery control system to dynamically activate and deactivate individual ones of the controllable units such that controllable units assigned to the relatively higher placement in the hierarchy are activated for shorter durations than controllable units assigned to the relatively lower placement in the hierarchy when the battery cells are operated in a charging regime.

In Example 84, the subject matter of Examples 78-83 includes, wherein the instructions, when executed, cause the battery control system to adjust the ordering of the hierarchy by sorting a second portion of the hierarchy based on the performance history of certain ones of the controllable units.

In Example 85, the subject matter of Example 84 includes, wherein the second portion of the ordered set includes identifiers of certain controllable units which have experienced activation durations according to cell-resting criteria.

In Example 86, the subject matter of Examples 84-85 includes, wherein the instructions, when executed, cause the battery control system to dynamically activate and deactivate individual ones of the controllable units such that controllable units assigned to the second portion of the hierarchy are not activated.

In Example 87, the subject matter of Examples 72-86 includes, wherein the instructions, when executed, cause the battery control system to dynamically activate and deactivate individual ones of the controllable units such that the controllable units are sequentially activated and deactivated to produce a varying-voltage waveform when the battery cells are operated in a discharging regime.

In Example 88, the subject matter of Examples 72-87 includes, wherein the instructions, when executed, cause the battery control system to dynamically activate and deactivate individual ones of the controllable units such that the controllable units are activated and deactivated in response to power demand information received from a controller associated with a load when the battery cells are operated in a discharging regime.

In Example 89, the subject matter of Examples 72-88 includes, wherein the instructions, when executed, cause the battery control system to perform a commissioning procedure applicable to deployment of a new controllable unit, wherein: the new controllable unit is exposed to an operating environment in which the plurality of controllable units are exposed; baseline measurements of a condition of the new controllable unit are made; additional measurements of the condition of the new controllable unit are made after a defined period of operation; the baseline measurements and the additional measurements are used to generate an internal model of the new controllable unit; the internal model is compared with empirical reference models to produce a comparison result; and a discovered state of the new controllable unit is estimated based on the comparison result, wherein the discovered state is indicative of a performance capability of that controllable unit.

In Example 90, the subject matter of Example 89 includes, wherein the defined period of operation includes varying operational conditions over a duration sufficient to realize a change in the discovered state.

In Example 91, the subject matter of Examples 89-90 includes, wherein the internal model represents parameters that include internal resistance and open circuit voltage.

Example 92 is at least one non-transitory machine-readable medium comprising instructions that, when executed by a controller of an energy storage system which includes, a set of battery control systems (BCS's), each BCS having a plurality of battery cells arranged as a plurality of controllable units, with each controllable unit including at least one of the battery cells of the plurality, causes the energy storage system to: perform individualized control of each of the controllable units, wherein the individualized control includes selective activation/deactivation of each controllable unit within an aggregation of battery cells; measure conditions of at least one battery cell of each controllable unit; estimate an energy storage level of each BCS of the set; and adjust a relative rate of charging and a relative rate of discharging of battery cells among the set of BCS's based on the estimated energy levels.

In Example 93, the subject matter of Example 92 includes, instructions that, when executed, cause the energy storage system to: adjust the relative rate of charging and a relative rate of discharging such that a first BCS of the set that has a relatively lower energy storage level is controlled to charge and discharge at relatively lower rates, and that a second BCS of the set that has a relatively higher energy storage level is controlled to charge and discharge at relatively higher rates.

In Example 94, the subject matter of Examples 92-93 includes, instructions that, when executed, cause the energy storage system to: adjust the relative rate of charging and a relative rate of discharging such that a first BCS of the set that has a relatively lower energy storage level is controlled to discharge at a relatively lower rate and to charge at a relatively higher rate, and that a second BCS of the set that has a relatively higher energy storage level is controlled to discharge at a relatively higher rate.

In Example 95, the subject matter of Examples 92-94 includes, instructions that, when executed, cause the energy storage system to: estimate the energy storage level of each BCS being based on an aggregation of a combination of an estimated state of charge (SoC) value, an estimated state of health (SoH) value, and a nominal capacity of each controllable unit within that BCS, wherein the SoC value is indicative of an extent to which the at least one cell of the controllable unit is charged relative to its capacity, and wherein the SoH value is indicative of an extent of degradation of the at least one cell of the controllable unit.

In Example 96, the subject matter of Examples 92-95 includes, instructions that, when executed, cause the energy storage system to: cause the set of BCS's to operate either in a charging regime or in a discharging regime, and further cause at least one BCS of the set to occasionally operate in a different regime than the other BCSs of the set concurrently with operation of those other BCSs of the set.

CONCLUSION

In the above description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, or communications networks have not been shown or described in detail to avoid unnecessarily obscuring descriptions of the implementations.

The foregoing detailed description has set forth various embodiments of the devices or processes via the use of block diagrams, schematics, and examples. Insofar as such block diagrams, schematics, and examples contain one or more functions or operations, it will be understood by those skilled in the art that each function or operation within such block diagrams, flowcharts, or examples can be implemented, individually or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry or writing the code for the software and or firmware would be well within the skill of one of ordinary skill in the art in light of this disclosure.

In addition, those skilled in the art will appreciate that the mechanisms taught herein are capable of being stored as a program product in a variety of forms, and that an illustrative embodiment applies equally regardless of the particular type of physical storage media used to actually carry out the distribution. Examples of such media include, but are not limited to, the following: read-only memory (ROM), electrically-erasable programmable read-only memory (EEPROM) such as flash device(s), magnetic disk, optical disk, static or dynamic random-access memory (RAM), cache memory, and the like, or any combination of these, or other, media.

U.S. International Patent Application PCT/CA 2019/051238, published as WO 2020/047663 is incorporated by reference into the present description.

The various embodiments described above can be combined to provide further embodiments. Aspects of the embodiments can be modified, if necessary, to employ systems, circuits and concepts of the various patents, applications and publications identified herein to provide yet further embodiments.

While there have been shown and described and pointed out fundamental novel features as applied to a preferred embodiment thereof, it will be understood that various omissions and substitutions and changes in the form and details of the devices illustrated, and in their operation, may be made by those skilled in the art without departing from their essential teachings. For example, it is expressly intended that all combinations of those elements or method acts that perform substantially the same function in substantially the same way to achieve the same results are within the scope. Moreover, it should be recognized that structures or elements or method acts shown or described in connection with any disclosed form or embodiment may be incorporated in any other disclosed or described or suggested form or embodiment as a general matter of design choice. It is the intention, therefore, to be limited only as indicated by the scope of the claims appended hereto.

The embodiments described herein are not meant to be an exhaustive presentation of the ways in which the various features of the disclosed subject matter may be combined. Accordingly, the embodiments are not mutually exclusive combinations of features; rather, the invention may comprise a combination of different individual features selected from different individual embodiments, as will be understood by persons of ordinary skill in the art.

Any incorporation by reference of documents above is limited such that no subject matter is incorporated that is contrary to the explicit disclosure herein. Any incorporation by reference of documents above is further limited such that no claims that are included in the documents are incorporated by reference into the claims of the present Application. The claims of any of the documents are, however, incorporated as part of the disclosure herein, unless specifically excluded. Any incorporation by reference of documents above is yet further limited such that any definitions provided in the documents are not incorporated by reference herein unless expressly included herein.

For purposes of interpreting the claims for the present invention, it is expressly intended that the provisions of 35 U.S.C. § 112(f) are not to be invoked unless the specific terms "means for" or "step for" are recited in a claim.

The invention claimed is:
1. A battery control system, comprising:
a plurality of battery cells arranged as a plurality of controllable units, wherein each controllable unit includes at least one of the battery cells of the plurality;
switching circuitry coupled to the plurality of battery cells, and arranged to facilitate individualized control of each of the controllable units, wherein the individualized control includes selective activation/deactivation of each controllable unit within an aggregation of battery cells;
sensing circuitry arranged at each controllable unit to measure conditions of at least one battery cell of that controllable unit; and
controller circuitry operatively coupled to the switching circuitry and to the sensing circuitry, the controller circuitry operative to read the sensing circuitry and to cause the switching circuitry to dynamically activate and deactivate the controllable units within the aggregation of battery cells based on the individualized control according to battery-management instructions;
wherein the battery management instructions, when executed, cause the controller circuitry to:
estimate a state of each controllable unit based on the measured conditions of the at least one battery cell in that controllable unit, wherein the estimated state is indicative of a performance capability of that controllable unit and includes a state of charge (SOC) value that is indicative of an extent to which the at least one cell of the controllable unit is charged relative to its capacity, and a state of health (SOH) value that is indicative of an extent of degradation of the at least one cell of the controllable unit;
determine a hierarchy of the plurality of controllable units, the hierarchy being based on the respective states of the controllable units, wherein controllable units having estimated states indicative of relatively higher performance capability are assigned to a relatively higher placement in the first portion of the hierarchy, and controllable units having estimated states indicative of relatively lower performance capability are assigned to a relatively lower placement in the first portion of the hierarchy;
perform the individualized control based on the hierarchy such that a respective position of each of the controllable units within the hierarchy is used to set a duration of the activation of that controllable unit within the aggregation of battery cells, wherein:
controllable units assigned to the relatively higher placement in the hierarchy are activated for longer durations than controllable units assigned to the relatively lower placement in the hierarchy when the battery cells are operated in a discharging regime; and
controllable units assigned to the relatively higher placement in the hierarchy are activated for shorter durations than controllable units assigned to the relatively lower placement in the hierarchy when the battery cells are operated in a charging regime;
adjust ordering of the hierarchy in response to changes in the estimated states of one or more of the controllable units;
further perform the individualized control to place one or more of the controllable units, which is otherwise operative according to the hierarchy, into a resting state according to cell-resting criteria which is distinct from the ordering of the hierarchy and which is based on history and durations of activations of such one or more controllable units regardless of the respective SOC or SOH values of the estimated states of those controllable units; and further perform the individualized control to remove the one or more of the controllable units from the resting state such that those one or more controllable units are activated for durations according to their respective placement in the hierarchy.

2. The battery control system of claim 1, wherein the conditions measured by the sensing circuitry associated with each controllable unit include voltage of the at least one cell of that controllable unit, current through the at least one cell of that controllable unit, and temperature of at least one cell of that controllable unit.

3. The battery control system of claim 1, wherein at least a first portion of the hierarchy is sorted in order of values of the respective estimated states of the controllable units.

4. The battery control system of claim 1, wherein the individualized control is further performed based on a present temperature of each controllable unit.

5. The battery control system of claim 1, wherein the hierarchy is further determined based on a combination of an estimated state of charge (SoC) value, an estimated state of health (SoH) value, and on a present temperature, of each controllable unit.

6. The battery control system of claim 1, wherein the switching circuitry includes a series arrangement of the controllable units, and wherein in the individualized control, the controllable units of the series arrangement are sequentially activated and deactivated to produce a varying-voltage waveform.

7. The battery control system of claim 1, wherein in the individualized control, the controllable units are activated and deactivated in response to power demand information received from a controller associated with a load.

8. The battery control system of claim 1, wherein cell-resting criteria is further based on measured temperature of the one or more controllable units.

9. The battery control system of claim 1, wherein in placing one or more of the controllable units into a resting state according to the cell-resting criteria, the cell-resting criteria is further based on measured temperature of the one or more controllable units.

10. A method for operating a battery control system having a plurality of battery cells arranged as a plurality of controllable units, each controllable unit including at least one of the battery cells of the plurality, the method comprising:

measuring conditions of at least one battery cell of each controllable unit;

estimating a state of each controllable unit based on the measured conditions of the at least one battery cell in that controllable unit, wherein the estimated state is indicative of a performance capability of that controllable unit and includes a state of charge (SOC) value that is indicative of an extent to which the at least one cell of the controllable unit is charged relative to its capacity, and a state of health (SOH) value that is indicative of an extent of degradation of the at least one cell of the controllable unit;

determining a hierarchy of the plurality of controllable units, the hierarchy being based on the respective states of the controllable units, including assigning controllable units having estimated states indicative of relatively higher performance capability to a relatively higher placement in the first portion of the hierarchy, and assigning controllable units having estimated states indicative of relatively lower performance capability to a relatively lower placement in the first portion of the hierarchy;

dynamically activating and deactivating individual ones of the controllable units based on the hierarchy such that a respective position of each of the controllable units within the hierarchy is used to set a duration of the activation of that controllable unit, including:

activating controllable units assigned to the relatively higher placement in the hierarchy for longer durations than controllable units assigned to the relatively lower placement in the hierarchy when the battery cells are operated in a discharging regime; and activating controllable units assigned to the relatively higher placement in the hierarchy for shorter durations than controllable units assigned to the relatively lower placement in the hierarchy when the battery cells are operated in a charging regime;

adjusting ordering of the hierarchy in response to changes in the estimated states of one or more of the controllable units;

further performing the individualized control of one or more of the controllable units including placing one or more of the controllable units, which is otherwise operative according to the hierarchy, into a resting state according to cell-resting criteria which is distinct from the ordering of the hierarchy and which is based on history and durations of activations of such one or more controllable units regardless of the respective SOC or SOH values of the estimated states of those controllable units; and further performing the individualized control to remove the one or more of the controllable units from the resting state such that those one or more controllable units are activated for durations according to their respective placement in the hierarchy.

11. The method of claim 10, wherein determining the hierarchy includes determining an ordered set of respective identifiers representing the controllable units.

12. The method of claim 10, wherein adjusting the ordering of the hierarchy includes sorting at least a first portion of the hierarchy in order of values of the respective estimated states of the controllable units.

13. The method of claim 10, wherein in dynamically activating and deactivating individual ones of the controllable units, the controllable units are sequentially activated and deactivated to produce a varying-voltage waveform.

14. The method of claim 10, wherein in dynamically activating and deactivating individual ones of the controllable units, the controllable units are activated and deactivated in response to power demand information received from a controller associated with a load.

15. The method of claim 10, further comprising performing a commissioning procedure applicable to deployment of a new controllable unit, wherein:

the new controllable unit is exposed to an operating environment in which the plurality of controllable units are exposed;

baseline measurements of a condition of the new controllable unit are made;

additional measurements of the condition of the new controllable unit are made after a defined period of operation;

the baseline measurements and the additional measurements are used to generate an internal model of the new controllable unit;

the internal model is compared with empirical reference models to produce a comparison result; and a discovered state of the new controllable unit is estimated based on the comparison result, wherein the discovered state is indicative of a performance capability of that controllable unit.

16. The method of claim 15, wherein the defined period of operation includes varying operational conditions over a duration sufficient to realize a change in the discovered state.

17. The method of claim 15, wherein the internal model represents parameters that include internal resistance and open circuit voltage.

* * * * *